United States Patent
Kulkarni

(10) Patent No.: US 8,216,362 B2
(45) Date of Patent: Jul. 10, 2012

(54) CONTROLLING AGGLOMERATED POINT DEFECT AND OXYGEN CLUSTER FORMATION INDUCED BY THE LATERAL SURFACE OF A SILICON SINGLE CRYSTAL DURING CZ GROWTH

(75) Inventor: Milind S. Kulkarni, St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 1181 days.

(21) Appl. No.: 11/750,706

(22) Filed: May 18, 2007

(65) Prior Publication Data

US 2007/0266929 A1  Nov. 22, 2007

Related U.S. Application Data

(60) Provisional application No. 60/801,953, filed on May 19, 2006.

(51) Int. Cl.
*C30B 15/22* (2006.01)

(52) U.S. Cl. ............... 117/15; 117/13; 117/14; 117/19; 117/20; 117/21; 117/30; 117/32; 117/35

(58) Field of Classification Search ............... 117/55, 117/85, 13–15, 19–21, 30, 32, 35
See application file for complete search history.

(56) References Cited

U.S. PATENT DOCUMENTS

| | | |
|---|---|---|
| 3,997,368 A | 12/1976 | Petroff et al. |
| 4,314,595 A | 2/1982 | Yamamoto et al. |
| 4,350,560 A | 9/1982 | Helgeland et al. |
| 4,981,549 A | 1/1991 | Yamashita et al. |
| 5,248,378 A | 9/1993 | Oda et al. |
| 5,264,189 A | 11/1993 | Yamashita et al. |
| 5,474,020 A | 12/1995 | Bell et al. |
| 5,485,803 A | 1/1996 | Habu |
| 5,487,354 A | 1/1996 | von Ammon et al. |
| 5,502,010 A | 3/1996 | Nadahara et al. |
| 5,593,494 A | 1/1997 | Falster |
| 5,667,584 A | 9/1997 | Takano et al. |
| 5,674,756 A | 10/1997 | Satoh et al. |
| 5,704,973 A | 1/1998 | Sakurada et al. |
| 5,728,211 A | 3/1998 | Takano et al. |
| 5,789,309 A | 8/1998 | Hellwig |

(Continued)

FOREIGN PATENT DOCUMENTS

DE  4323964 A1  1/1994

(Continued)

OTHER PUBLICATIONS

Nakamura, et al. entitled "Formation process of grown-in defects in Czochralski grown silicon crystals," J. Cryst. Growth 180, 61 (1997).*

(Continued)

*Primary Examiner* — Michael Kornakov
*Assistant Examiner* — Kenneth A Bratland, Jr.
(74) *Attorney, Agent, or Firm* — Armstrong Teasdale LLP

(57) ABSTRACT

Processes for preparing a single crystal silicon ingot are disclosed. In certain embodiments, the processes involve controlling (1) a growth velocity, v, of the ingot as well as (2) an average axial temperature gradient, G, a corrected average axial temperature gradient, $G_{corrected}$, or an effective average axial temperature gradient, $G_{effective}$, during the growth of at least a segment of the constant diameter portion of the ingot.

20 Claims, 36 Drawing Sheets

U.S. PATENT DOCUMENTS

| | | | |
|---|---|---|---|
| 5,846,322 | A | 12/1998 | Schulmann et al. |
| 5,919,302 | A | 7/1999 | Falster et al. |
| 5,920,764 | A | 7/1999 | Hanson et al. |
| 5,935,320 | A | 8/1999 | Graef et al. |
| 5,942,032 | A | 8/1999 | Kim et al. |
| 5,954,873 | A | 9/1999 | Hourai et al. |
| 5,958,133 | A | 9/1999 | Boulaev |
| 5,968,262 | A | 10/1999 | Saishouji et al. |
| 5,968,264 | A * | 10/1999 | Iida et al. ................ 117/30 |
| 5,994,761 | A | 11/1999 | Falster et al. |
| 6,045,610 | A * | 4/2000 | Park et al. ................ 117/13 |
| 6,053,974 | A | 4/2000 | Luter et al. |
| 6,093,913 | A | 7/2000 | Schrenker et al. |
| 6,153,008 | A | 11/2000 | von Ammon et al. |
| 6,228,164 | B1 | 5/2001 | von Ammon et al. |
| 6,236,104 | B1 | 5/2001 | Falster |
| 6,245,430 | B1 | 6/2001 | Hourai et al. |
| 6,254,672 | B1 | 7/2001 | Falster et al. |
| 6,287,380 | B1 | 9/2001 | Falster et al. |
| 6,379,642 | B1 * | 4/2002 | Falster et al. ............. 423/348 |
| 6,409,826 | B2 | 6/2002 | Falster et al. |
| 6,409,827 | B2 | 6/2002 | Falster et al. |
| 6,416,836 | B1 | 7/2002 | Falster et al. |
| 6,605,150 | B2 * | 8/2003 | Falster et al. ............. 117/15 |
| 6,632,278 | B2 | 10/2003 | Falster et al. |
| 6,638,357 | B2 | 10/2003 | Mule'Stagno et al. |
| 6,743,289 | B2 | 6/2004 | Falster et al. |
| 6,840,997 | B2 | 1/2005 | Falster et al. |
| 6,846,539 | B2 | 1/2005 | Kim et al. |
| 7,084,368 | B2 | 8/2006 | Yamaguchi et al. |
| 2002/0026893 | A1 | 3/2002 | Falster et al. |
| 2002/0174828 | A1 | 11/2002 | Vasat et al. |
| 2003/0051657 | A1 | 3/2003 | Falster et al. |
| 2003/0196587 | A1 | 10/2003 | McCallum et al. |
| 2004/0089224 | A1 | 5/2004 | Falster et al. |
| 2007/0266929 | A1 | 11/2007 | Kulkarni |
| 2007/0269361 | A1 | 11/2007 | Kulkarni |
| 2008/0237619 | A1 | 10/2008 | Epler et al. |

FOREIGN PATENT DOCUMENTS

| | | |
|---|---|---|
| DE | 44 14 947 A1 | 8/1995 |
| DE | 198 06 045 A1 | 8/1998 |
| EP | 0 503 816 B1 | 9/1992 |
| EP | 0 504 837 A2 | 9/1992 |
| EP | 0 536 958 A1 | 4/1993 |
| EP | 0 716 168 A1 | 12/1996 |
| EP | 0 747 513 A2 | 12/1996 |
| EP | 0799913 A1 | 1/1997 |
| EP | 0866150 | 9/1998 |
| EP | 0 890 662 | 1/1999 |
| EP | 0 909 840 | 4/1999 |
| EP | 0 962 556 A1 | 12/1999 |
| EP | 0 962 557 A1 | 12/1999 |
| EP | 0962555 | 12/1999 |
| GB | 2 137 524 A | 10/1984 |
| GB | 2 182 262 A | 5/1987 |
| JP | Hei 2-032535 | 2/1990 |
| JP | Hei 2-180789 | 7/1990 |
| JP | 2-267195 A | 10/1990 |
| JP | 3-93700 | 4/1991 |
| JP | Hei 4-042893 A | 2/1992 |
| JP | Hei 4-108682 | 4/1992 |
| JP | 4-294540 | 10/1992 |
| JP | 7-041383 A | 2/1995 |
| JP | 7-206591 A | 8/1995 |
| JP | 8-012493 A | 1/1996 |
| JP | 8-208374 A | 8/1996 |
| JP | HO 8-268794 | 10/1996 |
| JP | 8-330316 | 12/1996 |
| JP | HO 9-202690 | 8/1997 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| KR | 10-1997-0003671 | 1/1997 |
| WO | WO 97/26393 | 7/1997 |
| WO | WO 98/45507 | 10/1998 |
| WO | WO 98/45508 | 10/1998 |
| WO | WO 98/45509 | 10/1998 |
| WO | WO 98/45510 | 10/1998 |
| WO | 02066714 A | 8/2002 |

OTHER PUBLICATIONS

Kulkarni, et al. entitled "Quantification of defect dynamics in unsteady state and steady state Czochralski growth of monocrystalline silicon," J. Electrochem. Soc. 151, G663 (2004).*

Abe, T., et al., "The Characteristics of Nitrogen in Silicon Crystals", VLSI Science and Technology/1985, (Electrochem. Soc. Pennington, 1985), Proceedings vol. 85-5, (1985), pp. 543-551.

Abe, T., et al., "Behavior of Point Defects in FZ Silicon Crystals", Semiconductor Silicon 1990, *Proceedings of the Sixth International Symposium on Silicon Materials Science and Technology*, vol. 90-7 (1990), pp. 105-116.

Abe, T., et al., "Dynamic Behavior of Intrinsic Point Defects in FZ and CZ Silicon Crystals," Mat. Res. Soc. Symp. Proc., vol. 262, (1992), pp. 3-13.

Abe, T., et al., "Swirl Defects in Float-Zoned Silicon Crystals," Physics., vol. 116B, (1983), pp. 139-147.

Abe, T. et al, "Etch Pits Observed in Dislocation-Free Silicon Crystals", Japanese Journal of Applied Physics, 1966, pp. 458-459, vol. 5.

Abe, T. et al., "The Behavior of Grown-In Defects During the Wafer Bonding Process," Electrochemical Society Proceedings, vol. 95-7 (1995), pp. 296-304.

Abe, T.et al., "Innovated Silicon Crystal Growth and Wafering Technologies," Electrochemical Society Proceedings, vol. 97-3 (1997), pp. 123-133.

Abe et al., "Defect-Free Surfaces of Bulk Wafers by Combination of RTA and Crystal Growth Conditions", 31st Symposium on ULSI Ultra Clean Technology, Dec. 18-19, 1997, 11 pgs, Tokyo, Japan.

von Ammon, W., et al. "The Dependence of bulk defects on the axial temperature gradient of silicon crystals during Czochralski growth" Journal of Crystal Growth, vol. 151 (1995) pp. 273-277.

von Ammon, W., et al. "Bulk properties of very large diameter silicon single crystals" Journal of Crystal Growth, vol. 198/199, (1999), pp. 390-398.

Borionetti, G., et al., "Investigation of Low Density Defects in Czochralski Silicon Crystals: Their Detectability, Formation Kinetics and Influence on Gate Oxide Integrity," Electrochemical Society Proceedings, vol. 96-13, pp. 160-169.

Dash, W.C., "Silicon Crystals Free of Dislocations", Journal of Applied Physics, 1958, pp. 736-737, vol. 29.

Dash, W.C., "Growth of Silicon Crystals Free from Dislocations", Journal of Applied Physics, 1959, pp. 459-474, vol. 30, No. 4, American Institute of Physics.

Dornberger, E., et al., "The Impact of Dwell Time Above 900° C During Crystal Growth on the Gate Oxide Integrity of Silicon Wafers", Electrochemical Society Proceedings, vol. 96, No. 13, pp. 140-151.

Dornberger, E., et al., "The Dependence of Ring Like Distributed Stacking Faults on the Axial Temperature Gradient of Growing Czochralski Silicon Crystals" Electrochemical Society Proceedings, vol. 95-4, (May 1995) pp. 294-305.

Dornberger E et al., "Transient Computer Simulation of a CZ Crystal Growth Process", Journal of Crystal Growth, 1996, pp. 452-457, vol. 166.

Eidenzon, A.M., et al., "Defect-Free Silicon Crystals Grown by The Czochralski Technique"; Inorganic Materials, vol. 33, No. 3, (1997) pp. 219-225.

Eidenzon, A.M., et al., "Influence of Growth Rate on Swirl Defects in Large Dislocation-Free Crystals of Silicon Grown by The Czochralski Method", Sov. Phys. Crystallogr.; vol. 30 , No. 5 (1985) pp. 576-580.

Eidenzon, A.M., et al., "Microdefects in Dislocation-Free Silicon Monocrystals," TSVAM Met., No. 3 (1984) pp. 1-4.

Eidenzon, A.M., et al., "Interrelation Between Distributions of Growth- and Thermally—Induced Microdefects and Impurity Distribution in Dislocation-Free Silicon Grown by the Czochralski Method with a Constant Magnetic Field Acting on the Melt," Sov. Phys. Crystallogr., vol. 35, No. 2 (1990) pp. 250-254, American Institute of Physics.

Eidenzon, A.M., et al., "Specific Microdefects in Dislocation-Free Silicon Doped with Phosphorus," Sov. Phys. Crystallogr., vol. 33, No. 4 (1988) pp. 561-565, American Institute of Physics.

Eidenzon, A.M., et al., "Classification of Grown-In Microdefects in Czochralski-Grown Silicon Crystals," Inorganic Materials, vol. 31(4), 1995, pp. 435-443.

Eidenzon, A.M., et al., "Influence of Growth Microdefects on Formation of Microdefects During High-Temperature Treatment of Silicon," Sov. Phys. Crystallogr., vol. 31, No. 2 (1985) pp. 199-203, American Institute of Physics.

European Search Report for European Patent Application No. EP 02 02 1897, dated Oct. 9, 2003, 3 pages.

Foll, H., et al. "The Formation of Swirl Defects in Silicon by Agglomeration of Self-Interstitials", Journal of Crystal Growth, 1977, pp. 90-1087, vol. 40, North-Holland Publishing Company.

Habu, R. et al., "Distribution of Grown-In Crystal Defects Formed by Point Defect Diffusion," 7th Int'l Symposium on Silicon Materials Science & Technology, PV 94-10, (1994) pp. 635-646.

Hasbe, M. et al., "Formation Process of Stacking Faults with Ringlike Distribution in CA-Si Wafers", Japanese Journal of Applied Physics, 1989, vol. 28, No. 11, 4 pgs.

Hourai, M., et al., "Formation Behavior of Infrared Light Scattering Defects in Silicon During Czochralski Crystal Growth," J. Electrochem. Soc., vol. 142(9), (1995), 3193-3201.

Hourai, M., et al., "Nature and Generation of Grown-In Defects in Czochralski Silicon Crystals," Electrochemical Society Proceedings, vol. 98-1, pp. 453-467.

Hourai, M., et al., "Improvement of Gate Oxide Integrity Characteristics of CZ-Grown Silicon Crystals", Progress in Semiconductor Fabrication presented by: Semiconductor Equipment and Materials International, Semicon/Europa 93, Mar. 30-Apr. 1, 1993, Geneva, Switzerland, 29 pages.

Hourai, M., et al. "Growth Parameters Determining the Type of Grown-In Defects in Czockralski Silicon Crystals", Materials Science Forum, vols. 196-201 (1995) pp. 1713-1718.

Hourai, M., et al. "Oxygen Precipitation Behavior in Silicon During Czochralski Crystal Growth", 7th Int'l Symposium on Silicon Materials Science and Technology, PV 94-10 (1994) pp. 156-167.

Hourai, M., "Nature and Formation Mechanism of Grown-In Defects", published in Japanese by Science Forum, 1998, English translation, pp. 1-16.

Kato, M. et al., "Tranmission Electron Microscope observation of "IR Scattering Defects" ", Japanese Journal of Applied Physics, 1996, pp. 5597-5601, vol. 35, No. 11.

Kissinger, G., et al. "A Method for Studying the Grown-In Defect Density Spectra in Czochralski Silicon Wafers" Journal of Electrochemical Society, vol. 144, No. 4, (1997) pp. 1447-1456.

Kitano, et al., "Identification of Vacancy Clusters in FZ-Si Crystals," Phys. Stat. Sol, vol. 127(a), (1991), 341-347.

de Kock, A.J.R.,"The Elimination of Vacancy-Cluster Formation in Dislocation -Free Silicon Crystals", J. of the Electrochem. Soc.: Solid-State Science and Technology, vol. 118, No. 11, (Nov. 1971), pp. 1851-1856.

de Kock, A.J.R., et al., "Effect of Growth Parameters on Formation and Elimination of Vacancy Clusters in Dislocation-Free Silicon Crystals", Journal of Crystal Growth, vol. 22 (1974), pp. 311-320.

de Kock, A.J.R., "Microdefects in Swirl-Free Silicon Crystals", Semiconductor Silicon, 1973, pp. 83-94.

de Kock, A.J.R., "Point Defect Condensation in Dislocation-Free Silicon Crystals", Semiconductor Silicon, 1977, pp. 508-520.

de Kock, A.J.R, et al., "The Effect of Doping on the Formation of Swirl Defects in Dislocation-Free Czochralski-Grown Silicon Crystals", Journal of Crystal Growth, vol. 49, (1980) pp. 718-734.

de Kock, A.J.R., "Microdefects in Dislocation-Free Silicon Crystals", Philips Research Reports Supplements, No. 1 (1973), pp. 15-23.

De Kock, A.J.R., "Vacancy Clusters in Dislocation-Free Silicon", Applied Physics Letters, 1970, pp. 100-102, vol. 16, No. 3.

De Kock, A.J.R., "Microdefects in Dislocation-Free Silicon and Germanium Crystals", ACTA Electronica, 1973, pp. 303-313, vol. 16.

De Kock, A.J.R. et al., "Formation and Elimination of Growth Striations in Dislocation-Free Silicon Crystals", Journal of Crystal Growth, 1975, pp. 125-137, vol. 28.

Kubota, H., et al., "Perfect Silicon Surface by Hydrogen-Annealing," Semiconductor Silicon/1994, 7th International Symposium on Silicon Materials Science and Technology, pp. 225-236 (1994).

Kulkarni, M.S. et al., "Quantification of Defect Dynamics in Unsteady-State and Steady-State Czochralski Growth of Monocrystalline Silicon", Journal of The Electrochemical Society, 2004, vol. 151 (10), pp. G663-G678.

Lemke, H., et al., "Analytical Approximations for the Distributions of Intrinsic Point Defects in Grown Silicon Crystals", Phys. Stat. Sol. (a) vol. 176 (1999), pp. 843-865.

Majima, et al., "High-Sensitivity Defect Evaluation by a New Preferential Etching Technique for Highly As-Doped Si Crystals," Jpn. J. Appl. Phys., vol. 36, No. 10 (1997) pp. 6195-6199.

Mitani, "Technical Challenges in High Volume Unibond® SOI Wafer Manufacturing," Semicon West SOI Seminar (1998), pp. H1-H12.

Nagasima, et al., "Observation of Grown-In Defects in CZ-Si Crystal," Meeting of the Japan Society of Applied Physics (1993), 6 pgs.

Nakamura, K., et al., "Formation Process of Grown-In Defects in Czochralski Grown Silicon Crystals," Journal of Crystal Growth, vol. 180, (1997) pp. 61-72.

Park, J.G., et al., "Effect of Crystal Defects on Device Characteristics," Proceedings of the 2nd Int'l Advanced Science & Technology of Si, Kona, Hawaii, Nov. 25-29, 1996, pp. 519-540.

Park, J.G., et al., "Wafer Requirements: Memory Devices," SEMI Silicon Wafer Symposium, (1998), pp. E1-E21, 21 pgs.

Park, J.G., et al., "Gate Oxide Integrity in Dram Devices: The Influence of Substrate D-Defects," Electrochemical Society Proceedings vol. 95-5, pp. 457-471.

Park, J.D., et al., "Structure and Morphology of 'D-Defects' in CZ Si," 7th Int'l Symposium on Silicon Materials Science and Technology, PV 94-10 (1994) pp. 370-378.

Park, J.G., et al., "Effects of D-Defects in CZ Silicon Upon Thin Gate Oxide Integrity," The Physics and Chemistry of $SiO_2$ and the $Si$-$SiO_2$ Interface 2 (1993) pp. 289-298.

Petroff, P.M. et al., "Characterization of Swirl Defects in Floating-Zone Silicon Crystals", Journal of Crystal Growth, 1975, pp. 117-124, vol. 30, North-Holland Publishing Company.

Petroff, P.M. et al., "The Formation of Interstitial Swirl Defects in Dislocation-Free Floating-Zone Silicon Crystals", Journal of Crystal Growth, 1976, pp. 4-10, vol. 35, North-Holland Publishing Company.

Puzanov, N.I., et al., "Influence of Transitional Crystallization Regimes on Microdefects in Silicon," USSR Academy of Sciences Newsletter, vol. 22, No. 8 (1986), 7 pgs.

Puzanov, N.I.,et al., "Relaxation in a System of Point Defects in a Growing Dislocation-Free Crystal of Silicon," Sov. Phys. Crystallogr., vol. 31, No. 2, (1986) pp. 219-222.

Puzanov, N.I., et al., "The effect of thermal history during crystal growth on oxygen precipitation in Czochralski-grown silicon," Semicond. Sci. Technol., vol. 7, (1992), pp. 406-413.

Puzanov, N.I., et al., "Formation of the bands of anomalous oxygen precipitation in Czochralski-grown Si crystals," Journal of Crystal Growth vol. 137, (1994), pp. 642-652.

Puzanov, N.I., et al., "The Role of Intrinsic Point Defects in the Formation of Oxygen Precipitation Centers in Dislocation-Free Silicon," Crystallography Reports, vol. 41, No. 1, (1996), pp. 143-151.

Puzanov, N.I., et al., "Cultivation, Morphology and Structural Integrity of Dislocation-Free Silicon Tetracrystals," Inorganic Materials, vol. 32, No. 8 (1996), pp. 903-912.

Puzanov, N.I., et al., "Harmful Microdefects in the Seed-End Portion of Large-Diameter Silicon Ingots", Inorganic Materials, vol. 33, No. 8, (1997) pp. 765-769.

Puzanov, N.I., et al., "Modelling microdefect distribution in dislocation-free Si crystals grown from the melt", Journal of Crystal Growth, 178, (1997), pp. 468-478.

Puzanov, N.I., et al., "Role of Vacancies in the Nucleation of Ring-like-patterned Oxidation-induced Stacking Faults in Melt-grown Silicon Crystals" Inorganic Materials, vol. 34-4, (1998) pp. 307-314.

Puzanov, N.I., et al., "Modeling Point-Defect Distribution in Dislocation-Free Si Crystals Grown from the Melt," Inorganic Materials, Vo. 32(1), (1996), pp. 1-9.

Puzanov, N.I., et al., "Effects of Silicon Monocrystal Growth Conditions on Oxygen Precipitation During High-Temperature Processing," vol. 37, No. 5 (1992) pp. 1-10.

Puzanov, N.I., et al., "Microdefects in Silicon Grown by the Czochralski Method with a Vertical Magnetic Field Acting on the Melt," Sov. Phys. Crystallogr. 35(1), (1990), pp. 102-105.

Puzanov, N.I., et al., "Influence of Growth Conditions on the Formation of Microdefects in Dislocation-Free Silicon," Sov. Phsys. Crystallogr., vol. 34(2), (1989) pp. 273-278.

Roksnoer, P.J., "Microdefects in a Non-Striated Distribution in Floating-Zone Silicon Crystals", Journal of Crystal Growth, vol. 53 (1981), pp. 563-573.

Roksnoer, P.J., "Effect of Low Cooling Rates on Swirls and Striations in Dislocation-Free Silicon Crystals," vol. 35, (1976), pp. 245-248.

Roksnoer, P.J., "The Mechanism of Formation of Microdefects in Silicon", Journal of Crystal Growth, vol. 68 (1984), pp. 596-612.

Ryuta, J., et al., "Crystal-Originated Singularities on Si Wafer Surface after SC1 Cleaning," Japanese Journal of Applied Physics, vol. 29(11) (1990), pp. L1947-L1949.

Seidel, T.E., "Silicon Wafers for the 1990's," Journal of Crystal Growth, vol. 85, (1987), pp. 97-105.

Sadamitsu, S., "Dependence of the Grown-in Defect Distribution on Growth Rates in Czochralski Silicon," Japanese Journal of Applied Physics, vol. 32, No. 9A (1993), pp. 3675-3681.

Shimura, F., Semiconductor Silicon Crystal Technology, 1989, pp. 55-60, Academic Press, Inc.

Shimanuki, Y., et al., "Effects of Thermal History on Microdefect Formation in Czochralski Silicon Crystals," Japanese Journal of Applied Physics, vol. 24, No. 12, (1985), pp. 1594-1599.

Sinno, T., et al., "On the Dynamics of the Oxidation-Induced Stacking-Fault Ring in as-grown Czochralski silicon crystals," Applied Physics Letters, vol. 70, No. 17, (1997) pp. 2250-2252.

Sinno, T., et al., "Point Defect Dynamics and the Oxidation-Induced Stacking-Fault Ring in Czochralski-Grown Silicon Crystals," J. Electrochem. Soc., vol. 145, No. 1, (1998) pp. 302-318.

Sinno, T., et al., "Point Defect Dynamics in Silicon and the Connection Between Microdefect Formation and Operating Conditions in the Bulk Growth of Silicon," 7th Int'l Symposium on Silicon Materials Science and Technology, PV 94-10, (1994) pp. 625-634B.

Stutius, et al., "Growth and Doping of ZnSe and $ZnS_xSe_{1-x}$ by Organometallic Chemical Vapor Deposition," Journal of Crystal Growth, vol. 59 (1982) pp. 1-9.

Takano, K., et al., "Relationship Between Grown-in Defects and Thermal History During CZ Si Crystal Growth," Materials Science Forum vols. 196-201, (1995) pp. 1707-1712.

Tan, T. Y., "Point Defects, Diffusion Processes, and Swirl Defect Formation in Silicon," Appl. Phys. A., vol. 37, (1985) pp. 1-17.

Ueki T. et al., "Octahedral Void Defects Observed in the Bulk of Czochralski Silicon", Applied Physics Letter, Mar. 10, 1997, pp. 1248-1250, vol. 70, No. 10.

Vanhellemont, J., et al., "Defects in As-Grown Silicon and Their Evolution During Heat Treatments," Materials Science Forum, vols. 258-263, (1997) pp. 341-346.

Voronkov,V., "The Mechanism of Swirl Defects Formation in Silicon," Journal of Crystal Growth, vol. 59 (1982) pp. 625-643.

Voronkov, V., et al., "Behavior and Effects of Intrinsic Point Defects in the Growth of Large Silicon Crystals," Electrochemical Society proceedings, vol. 97-22, (Aug. 1997), pp. 3-17.

Voronkov, V.V., et al., "Vacancy-type microdefect formation in Czochralski silicon", Journal of Crystal Growth 194 (1998) 76-88.

Voronkov, V., et al., "Grown-in microdefects, residual vacancies and oxygen precipitation banks in Czochralski silicon" Journal of Crystal Growth, 304 (1999) pp. 462-474.

Voronkov, V.V. et al., "Vacancy and Self-Interstitial Concentration Incorproated into Growing Silicon Crystals", Journal of Applied Physics, Dec. 1, 1999, vol. 86, No. 11, pp. 5975-5982.

Wang, Z. et al., "Simulation of Almost Defect-Free Silicon Crystal Growth", Journal of Crystal Growth, 2001, pp. 442-447, vol. 231, Elsevier.

Wijaranakula, W., "Effect of High-Temperature Annealing on the Dissolution of the D-Defects in N-Type Czochralski Silicon," Appl. Phys. Lett., vol. 64(8), (1994), 1030-1032.

Wijaranakula, W., "Fundamentals of Point Defect Aggregation and Dissolution Phenomena of Crystal Originated Defects in Czochralski Silicon," Materials Science Forum, vols. 196-201 (1995) pp. 1691-1696.

Wijaranakula, W., "Numerical Modeling of the Point Defect Aggregation during the Czochralski Silicon Crystal Growth", Journal of Electrochemical Society, vol. 139, No. 2 (Feb. 1992), pp. 604-616.

Winkler, R., et al. "Improvement of the Gate Oxide Integrity by Modifying Crystal Pulling and Its Impact on Device Failures" Journal of the Electrochemical Society, vol. 141, No. 5 (May 1994) pp. 1398-1401.

Yamagishi, et al., "Recognition of D Defects in Silicon Single Crystals by Preferential Etching and Effect on Gate Oxide Integrity", Semicond. Sci Technol. 7, 1992, A135-A140.

Yamagishi, H., et al., "Evaluation of FPDS and COPS in Silicon Single-Crystals", 7th Int'l Symposium on Silicon Materials Science and Technology, PV 94-10 (1994) pp. 124-135.

Yamauchi, T., et al., "Application of Copper-Decoration Method to Characterize As-Grown Czochralski-Silicon," Jpn. J. Appl. Phys., vol. 31, (1992), pp. L439-L442.

Zimmerman, H., et al. "Gold and Platinum Diffusion: the Key to the Understanding of Intrinsic Point Defect Behavior in Silicon", Applied Physics A Solids and Surfaces, vol. A55, No. 1 (1992) pp. 121-134.

Zimmerman, H., et al. "Vacancy concentration wafer mapping in silicon" Journal of Crystal Growth, vol. 129, (1993) pp. 582-592.

Zimmerman, H., et al. "Observation of Inverse U-shaped Profiles After Platinum Diffusion in Silicon," Applied Physics Letters, vol. 59, No. 10, (1991) pp. 1209-1211.

Office Action dated Oct. 6, 2010 in U.S. Appl. No. 11/750,717, filed May 18, 2007.

International Search Report from analogous application No. PCT/US2007/069280 dated Nov. 16, 2007.

Dornberger, E., et al., Simulation of Grown-In Voids in Czochralski Silicon Crystals, Electrochemical Society Proceedings, vol. 97-22, 1997, pp. 40-49.

Dornberger, E., et al., Simulation of Non-Uniform Grown-In Void Distributions in Czochralski Silicon Crystals, Electrochemical Society Proceedings, vol. 98, No. 1, 1998, pp. 490-503.

Faslter, R., et al., Intrinsic Point-Defects and Reactions in the Growth of Large Silicon Crystals, Electrochemical Society Proceedings, vol. 98-1, 1998, pp. 468-489.

Harada, H., et al., Oxygen Precipitation Enhanced with Vacancies in Silicon, Proceedings of the Fifth International Symposium on Silicon Materials Science and Technology, Proceedings vol. 86-4, 1986, pp. 76-85.

International Search Report, for European Patent Application No. EP 1 118 697 A3, dated Jul. 13, 2001.

* cited by examiner

CONTROLLING AGGLOMERATED POINT DEFECT AND OXYGEN CLUSTER FORMATION INDUCED BY THE LATERAL SURFACE OF A SILICON SINGLE CRYSTAL DURING CZ GROWTH

REFERENCE TO RELATED APPLICATIONS

This application claims priority from U.S. provisional application Ser. No. 60/801,953 filed on May 19, 2006, the entire disclosure of which is incorporated herein by reference.

BACKGROUND OF THE INVENTION

The present invention generally relates to the preparation of semiconductor grade single crystal silicon which is used in the manufacture of electronic components. More particularly, the present invention relates to a Czochralski process for preparing single crystal silicon ingots which are substantially free of agglomerated intrinsic point defects, as well as wafers obtained therefrom.

Single crystal silicon, which is the starting material for most processes for the fabrication of semiconductor electronic components, is commonly prepared by the so-called Czochralski ("CZ") method. In this method, polycrystalline silicon ("polysilicon") is charged to a crucible and melted, a seed crystal is brought into contact with the molten silicon, and a single crystal is grown by slow extraction. After formation of a neck is complete, the diameter of the crystal is enlarged by decreasing the pulling rate and/or the melt temperature until the desired or target diameter is reached, thus forming a seed cone. The cylindrical main body of the crystal, which has an approximately constant diameter, is then grown by controlling the pull rate and the melt temperature while compensating for the decreasing melt level. Near the end of the growth process, but before the crucible is emptied of molten silicon, the crystal diameter must be reduced gradually to form an end-cone. Typically, the end-cone is formed by increasing the crystal pull rate and the heat supplied to the crucible. When the diameter becomes small enough, the crystal is then separated from the melt.

The continuously shrinking size of the modern microelectronic device imposes challenging restrictions on the quality of the silicon substrate, which is essentially determined by the size and the distribution of the grown-in microdefects. Most of the microdefects formed in silicon crystals grown by the Czochralski (CZ) process and the Float Zone (FZ) process are the agglomerates of intrinsic point defects of silicon—vacancies and self-interstitials (or, simply, interstitials). The microdefects were first observed in FZ silicon crystals after the discovery by Dash allowed the elimination of the thermomechanically induced dislocations, which are efficient sinks for the point defects in growing crystals.

A series of studies have established that the interstitial agglomerates exist in two forms—globular interstitial clusters, termed B swirl defect (or B-defects), and the dislocation loops, termed A swirl defect (or A-defects). Later discovered vacancy agglomerates, known as D-defects, have been identified as octahedral voids. Voronkov provided the well-accepted explanation for the microdefect distributions observed in silicon crystals on the basis of the crystal growth conditions. According to Voronkov's model, or theory, the temperature field in the vicinity of the melt/crystal interface drives the recombination of the point defects providing driving forces for their diffusion from the melt/crystal interface—where they exist at their respective equilibrium concentrations—into the crystal bulk. The interplay between the transport of the point defects, both by the diffusion and the convection, and their recombination establishes the point defect concentration beyond a short distance away from the interface, termed the recombination length. Typically, the difference between the vacancy concentration and the interstitial concentration beyond the recombination length, termed the excess point defect concentration, remains essentially fixed away from the lateral surface of the crystal. In a rapidly pulled crystal, the spatial redistribution of the point defects by their diffusion beyond the recombination length is generally not important—with the exception of a region close to the lateral surface of the crystal that acts as a sink or a source of the point defects. Therefore, if the excess point defect concentration beyond the recombination length is positive, vacancies remain in excess, and agglomerate to form D-defects at lower temperatures. If the excess point defect concentration is negative, interstitials remain the dominant point defects, and agglomerate to form A-defects and B-defects. If the excess point defect concentration is below some detection threshold, no detectable microdefects are formed. Thus, typically, the type of grown-in microdefects is determined simply by the excess point defect concentration established beyond the recombination length. The process of establishing the excess point defect concentration is termed the initial incorporation and the dominant point defect species is termed the incorporated dominant point defect. The type of the incorporated point defects is determined by the ratio of the crystal pull-rate (v) to the magnitude of the axial temperature gradient in the vicinity of the interface (G). At a higher v/G, the convection of the point defects dominates their diffusion, and vacancies remain the incorporated dominant point defects, as the vacancy concentration at the interface is higher than the interstitial concentration. At a lower v/G, the diffusion dominates the convection, allowing the incorporation of the fast diffusing interstitials as the dominant point points. At a v/G close to its critical value, both the point defects are incorporated in very low and comparable concentrations, mutually annihilating each other and thus suppressing the potential formation of any microdefects at lower temperatures. The observed spatial microdefect distribution can be typically explained by the variation of v/G, caused by a radial non-uniformity of G and by an axial variation of v. A striking feature of the radial microdefect distribution is the oxide particles formed through the interaction of oxygen with vacancies in the regions of relatively lower incorporated vacancy concentration—at a small range of v/G marginally above the critical v/G. These particles form a narrow spatial band that can be revealed by thermal oxidation as the OSF (oxidation-induced stacking faults) ring. Quite often, the OSF ring marks the boundary between adjacent crystal regions that are vacancy-dominated and interstitial-dominated, known as the V/I boundary.

The microdefect distributions in CZ crystals grown at lower rates in many modern processes, however, are influenced by the diffusion of the point defects in the crystal bulk, including the diffusion induced by the lateral surfaces of the crystals. Therefore, an accurate quantification of the microdefect distributions in CZ crystals preferably incorporates the 2-dimensional point defect diffusion, both axially and radially. Quantifying only the point defect concentration field can qualitatively capture the microdefect distribution in a CZ crystal, as the type of the microdefects formed is directly determined by it. For a more accurate quantification of the microdefect distribution, however, capturing the agglomeration of the point defects is necessary. Traditionally, the microdefect distribution is quantified by decoupling the initial incorporation of the point defects and the subsequent formation of the microdefects. This approach ignores the diffusion of the dominant point defects in the vicinity of the nucleation region, from the regions at higher temperatures (where the microdefect density is negligible) to the regions at lower temperatures (where the microdefects exist in higher densities and consume the point defects). Alternatively, a rigorous numerical simulation based on predicting the size distributions of the microdefect populations at every location in the crystal is numerically expensive.

The transition between vacancy and interstitial dominated material occurs at a critical value of v/G, which currently appears to be about $2.5 \times 10^{-5}$ $cm^2/sK$. If the value of v/G exceeds the critical value, vacancies are the predominant intrinsic point defect, with their concentration increasing with increasing v/G. If the value of v/G is less than the critical value, silicon self-interstitials are the predominant intrinsic point defect, with their concentration increasing with decreasing v/G. Accordingly, process conditions, such as growth rate (which affect v), as well as hot zone configurations (which affect G), can be controlled to determine whether the intrinsic point defects within the single crystal silicon will be predominantly vacancies (where v/G is generally greater than the critical value) or self-interstitials (where v/G is generally less than the critical value).

Agglomerated defect formation generally occurs in two steps. First, defect "nucleation" occurs, which is the result of the intrinsic point defects being supersaturated at a given temperature; above this "nucleation threshold" temperature, intrinsic point defects remain soluble in the silicon lattice. The nucleation temperature for agglomerated intrinsic point defects is greater than about 1000° C.

Once this "nucleation threshold" temperature is reached, intrinsic point defects agglomerate; that is, precipitation of these point defects out of the "solid solution" of the silicon lattice occurs. The intrinsic point defects will continue to diffuse through the silicon lattice as long as the temperature of the portion of the ingot in which they are present remains above a second threshold temperature (i.e., a "diffusivity threshold"). Below this "diffusivity threshold" temperature, intrinsic point defects are no longer mobile within commercially practical periods of time.

While the ingot remains above the "diffusivity threshold" temperature, vacancy or interstitial intrinsic point defects diffuse through the silicon lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Vacancy-type defects are recognized to be the origin of such observable crystal defects as D-defects, Flow Pattern Defects (FPDs), Gate Oxide Integrity (GOI) Defects, Crystal Originated Particle (COP) Defects, crystal originated Light Point Defects (LPDs), as well as certain classes of bulk defects observed by infrared light scattering techniques such as Scanning Infrared Microscopy and Laser Scanning Tomography. Also present in regions of excess vacancies are clusters of oxygen or silicon dioxide. Some of these clusters remain small and relatively strain-free, causing essentially no harm to a majority of devices prepared from such silicon. Some of these clusters are large enough to act as the nuclei for ring oxidation induced stacking faults (OISF). It is speculated that this particular defect is facilitated by previously nucleated oxygen agglomerates catalyzed by the presence of excess vacancies. The oxide clusters are primarily formed in CZ growth below 1000° C. in the presence of moderate vacancy concentration.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

In this regard it is to be noted that, generally speaking, oxygen in interstitial form in the silicon lattice is typically considered to be a point defect of silicon, but not an intrinsic point defect, whereas silicon lattice vacancies and silicon self-interstitials (or, simply, interstitials) are typically considered to be intrinsic point defects. Accordingly, essentially all microdefects may be generally described as agglomerated point defects, while D-defects (or voids), as well as A-defects and B-defects (i.e., interstitial defects) may be more specifically described as agglomerated intrinsic point defects. Oxygen clusters are formed by absorbing vacancies; hence, oxygen clusters can be regarded as agglomerates of both vacancies and oxygen.

It is to be further noted that the density of such vacancy and self-interstitial agglomerated point defects in Czochralski silicon historically has been within the range of about $1 \times 10^3/cm^3$ to about $1 \times 10^7/cm^3$, whereas the density of oxygen clusters varies between around $1 \times 10^8/cm^3$ to $1 \times 10^{10}/cm^3$. Agglomerated intrinsic point defects are therefore of rapidly increasing importance to device manufacturers, because such defects can severely impact the yield potential of the single crystal silicon material in the production of complex and highly integrated circuits.

In view of the foregoing, in many applications it is preferred that a portion or all of the silicon crystal, which is subsequently sliced into silicon wafers, be substantially free of these agglomerated intrinsic point defects. To-date, several approaches for growing substantially defect-free silicon crystals have been reported. Generally speaking, all these approaches involve controlling the ratio v/G in order to determine the initial type and concentration of intrinsic point defects present in the growing CZ single crystal silicon crystal. Additionally, however, such approaches may involve controlling the subsequent thermal history of the crystal to allow for prolonged diffusion time to suppress the concentration of intrinsic point defects therein, and thus substantially limit or avoid the formation of agglomerated intrinsic point defects in a portion or all of the crystal. (See, for example, U.S. Pat. Nos. 6,287,380; 6,254,672; 5,919,302; 6,312,516 and 6,328,795; the entire contents of which are hereby incorporated herein by reference.) Alternatively, however, such approaches may involve a rapidly cooled silicon (RCS) growth process, wherein the subsequent thermal history of the crystal is then controlled to rapidly cool at least a portion of the crystal through a target nucleation temperature, in order to control the formation of agglomerated intrinsic point defects in that portion. One or both of these approaches may also include allowing at least a portion of the grown crystal to remain above the nucleation temperature for a prolonged period of time, to reduce the concentration of intrinsic point defects prior to rapidly cooling this portion of the crystal through the target nucleation temperature, thus substantially limiting or avoiding the formation of agglomerated intrinsic point defects therein. (See, e.g., U.S. Patent Application Publication No. 2003/0196587, the entire disclosure of which is incorporated herein by reference.)

SUMMARY OF THE INVENTION

Briefly, therefore, the present invention is directed to a process for growing a single crystal silicon ingot in which the ingot comprises a central axis, a seed-cone, an end opposite the seed-cone and a constant diameter portion between the seed-cone and the opposite end, said constant diameter portion having a lateral surface, a radius (R) extending from the central axis to the lateral surface, and a nominal diameter of at least about 150 mm, the ingot being grown from a silicon melt and then cooled from the solidification temperature in accordance with the Czochralski method. The process comprises: (a) controlling (i) a growth velocity, v, and (ii) an average axial temperature gradient, G, during the growth of at least a segment of the constant diameter portion of the ingot over the temperature range from solidification to a temperature of about 1200° C., such that the ratio of v/G, at a given axial position within said segment, varies radially by less than about ±30%, relative to the critical value of v/G, over about 0.75 R, as measured from the central axis toward the lateral surface; and, (b) cooling said segment from the solidification temperature to at least about 750° C., wherein during said cooling the cooling rate of said segment is controlled (i) between the solidification temperature to a temperature of at least about 1250° C., such that said segment cools at a rate of at least about 2.5° C./minute, and (ii) between a temperature of less than about 1250° C. and about 1000° C., such that said segment cools at a rate of between about 0.3 and about 0.025° C./minute.

In one particular embodiment of the above-noted method, the process comprises, in relevant part, controlling an effective or corrected average axial temperature gradient (i.e., $G_{effective}$ or $G_{corrected}$).

The present invention is still further directed to a process for growing a single crystal silicon ingot in which the ingot comprises a central axis, a seed-cone, an end opposite the seed-cone and a constant diameter portion between the seed-cone and the opposite end, said constant diameter portion having a lateral surface, a radius (R) extending from the central axis to the lateral surface, and a nominal diameter of at least about 150 mm, the ingot being grown from a silicon melt and then cooled from the solidification temperature in accordance with the Czochralski method. The process comprises: (a) controlling (i) a growth velocity, v, and (ii) a corrected average axial temperature gradient, $G_{corrected}$, during the growth of at least a segment of the constant diameter portion of the ingot over the temperature range from solidification to a temperature of about 1200° C., wherein $G_{corrected}$ is defined by the following equation:

$$1/T_{corrected} = (1/T_m) + (1/T^2_m) z G_{corrected}, \text{ such that}$$
$$\Sigma f(T - T_{corrected}) = 0$$

wherein: T is the temperature at any fixed radial location, r, within the segment; m is the growth conditions at the melt/solid interface; z is the axial distance from the interface at the given radial location; and, the function $f$ denotes an acceptable statistical agreement between T and $T_{corrected}$; such that the ratio of v/$G_{corrected}$, at a given axial position within said segment, varies radially by less than about ±30%, relative to the critical value of v/$G_{corrected}$; and, (b) cooling said segment from the solidification temperature to about 750° C.

The present invention is still further directed to a process for growing a single crystal silicon ingot in accordance with the Czochralski method, wherein the melt/solid interface can be of essentially any shape. In the process, the ingot comprises a central axis, a seed-cone, an end opposite the seed-cone and a constant diameter portion between the seed-cone and the opposite end, said constant diameter portion having a lateral surface, a radius (R) extending from the central axis to the lateral surface, and a nominal diameter of at least about 150 mm, the ingot being grown from a silicon melt and then cooled from the solidification temperature in accordance with the Czochralski method. The process comprises: (a) controlling (i) a growth velocity, v, and (ii) an effective average axial temperature gradient, $G_{effective}$, during the growth of at least a segment of the constant diameter portion of the ingot over the temperature range from solidification to a temperature of about 1200° C., wherein $G_{effective}$ is defined by the following equation:

$$G_{effective} = \left[ \frac{G_{corrected}}{v} \right]_{x, flat} \times v_{x, iface}$$

and $G_{corrected}$ is defined by the following equation:

$$1/T_{corrected} = (1/T_m) + (1/T^2_m) z G_{corrected}, \text{ such that}$$
$$\Sigma f(T - T_{corrected}) = 0,$$

wherein: $G_{effective}$ represents a revision to $G_{corrected}$, revised to account for the deviation in the interface shape from a flat profile; T is the temperature of at any fixed radial location, r, within the segment; m is the growth conditions at the melt/solid interface; z is the axial distance from the interface at the given radial location; the function $f$ denotes an acceptable statistical agreement between T and $T_{corrected}$; the subscript x denotes the critical conditions; flat denotes a flat interface; iface denotes any non-flat interface; such that the ratio of v/$G_{effective}$, at a given axial position within said segment, varies radially by less than about ±30%, relative to the critical value of v/$G_{effective}$; and, (b) cooling said segment from the solidification temperature to about 750° C.

In this regard it is to be noted that the critical value, $[G_{corrected}/v]_{x, flat}$, represents the value for a flat interface, which may be calculated by simulator and which is about $4.0 \ast 10^4$ sK/cm². Accordingly, in effect, the equation above defines $G_{effective}$ for any non-flat interface such that, at the V/I boundary, v/$G_{effective}$ is a constant equal to critical v/$G_{effective}$. Accordingly, it is to be further noted that $G_{effective}$ is a function of the interface shape.

It is to be further noted that, optionally, in any one of the above-noted processes, the crystal segment referenced therein, upon cooling, may comprise an axially symmetric region which has (i) a measurably radial width that may be less than or equal to about 1 R, (ii) a length, as measured along the central axis, of at least about 10% of the length of the constant diameter portion of the ingot. In one embodiment, this region may be substantially free of agglomerated intrinsic point defects, wherein silicon lattice vacancies are the predominant intrinsic point defect, or alternatively wherein silicon self-interstitials are the predominant intrinsic point defect. In another embodiment, this region may contain silicon self-interstitials as the predominant intrinsic point defect, and further may optionally contain B-defects. In yet another embodiment, this region may contain silicon lattice vacancies as the predominant intrinsic point defect, and further may optionally contain agglomerated vacancy defects (voids) and/or oxygen clusters, which are detectable by means known in the art, the voids having an average radius of less than about 30 nm and the oxygen clusters having an average radius of less than about 10 nm. In any or all of these embodiments, the radial width of this axially symmetric region may be essentially equal to the radius of the ingot (i.e., about 1 R). Alternatively, however, the radial width of this axially symmetric region may be less than 1 R. In such instances, this axially symmetric region may extend from the central axis of the ingot radially outward toward the lateral surface, or alternatively it may form an annular ring located between the central axis and the lateral surface, and may be surrounded by a first annular ring, extending from about the lateral surface inward toward the central, axially symmetric region. This first annular ring contains silicon lattice vacancies as the predominant intrinsic point defect, and may further contain agglomerated vacancy defects (voids) having an average radius of less than about 30 nm and/or oxygen clusters having an average radius of less than about 10 nm. In those instances wherein the axially symmetric region itself forms an annular ring, or more specifically a second annular ring (which is located radially inward of the first annular ring), it may surround an axially symmetric core which contains (i) silicon lattice vacancies as the predominant intrinsic point defect, and optionally voids having an average radius of less than about 30 nm and/or oxygen clusters having an average radius of less than about 10 nm, or (ii) silicon self-interstitials as the predominant intrinsic point defect, and optionally B-defects.

It is to be still further noted that the above-described axially symmetric region, which is surrounded by the first annular ring, may contain one or more additional rings or patterns of small micro-defects (which may or may not be detectable—that is, based on various modeling techniques, their existence may be recognized, but existing detection methods may not detect them). In general, small micro-defects may be defined as voids having an average radius of less than about 30 nm, oxygen clusters having an average radius of less than about 10 nm, and/or B-defects, as further detailed elsewhere herein.

It is to be still further noted that, in one or more particular embodiments of the above-noted processes, said segment comprises an annular or peripheral ring, located radially outward of an axially symmetric region and extending radially inward from about the lateral surface of the ingot toward the axially symmetric region, said ring containing voids (or agglomerated vacancy defects) and/or oxygen clusters, which are detectable by means known in the art, said voids having an average radius of less than about 30 nm and said oxygen clusters having an average radius of less than about 10 nm. Additionally, or optionally, said axially symmetric region may have a radial width with extends from about the annular ring to the central axis of the ingot. Alternatively, however, a second annular ring containing B-defects may exist between the first annular ring and surround a core or central region which contains voids (or agglomerated vacancy defects) and/or oxygen clusters, which are detectable by means known in the art, said voids having an average radius of less than about 30 nm and said oxygen clusters having an average radius of less than about 10 nm.

In this regard it is to be still further noted that, in one or more of the above-noted processes, said second annular ring, which may be substantially free of agglomerated intrinsic point defects, may contain silicon self-interstitials as the predominant intrinsic point defect.

In this regard it is to be still further noted that, in one particular embodiment, the cooling rate detailed herein for a given segment of the ingot may be the average cooling rate for that ingot segment over the defined temperature range. In an alternative embodiment, however, the cooling rate detailed herein for a given segment of the ingot may be the actual rate over the entire ingot segment within the defined temperature range; that is, the instantaneous cooling rate over the entire ingot segment, and within the defined temperature range, meets the recited cooling rate requirement.

The present invention is still further directed to a single crystal silicon ingot obtained from the above-noted processes, and/or a single crystal silicon wafer sliced from such an ingot.

The present invention is still further directed to a single crystal silicon wafer having a diameter of at least about 150 mm, a central axis, a front side and a back side with are generally perpendicular to the axis, a circumferential edge, and a radius (R) extending from the central axis to the circumferential edge of the wafer. The wafer comprises an annular or peripheral ring extending radially inward from about the circumferential edge of the wafer toward the central axis, said ring (i) containing silicon lattice vacancies as the predominant intrinsic point defect, (ii) containing agglomerated vacancy defects (voids) and/or oxygen clusters which are detectable by means known in the art, said voids having an average radius of less than about 30 nm and said oxygen clusters having an average radius of less than about 10 nm, and (iii) having an average radial width of at least about 0.05 R (e.g., at least about 0.1 R, about 0.15 R, about 0.2 R, about 0.25 R or more).

Optionally, the above-noted annular ring may surround one or more axially symmetric regions, or rings, that may contain silicon lattice vacancies or silicon self-interstitials as the predominant intrinsic point defect. More specifically, this annular ring may surround an axially symmetric region that extends radially outward from the central axis and toward the annular ring, the region having a measurable radial width of less than about 0.95 R (e.g., less than about 0.9 R, about 0.85 R, about 0.8 R, about 0.75 R, or less). This axially symmetric region may: (i) contain silicon lattice vacancies as the predominant intrinsic point defect, and may further optionally contain agglomerated vacancy defects (voids) and/or oxygen clusters, said voids having an average radius of less than about 30 nm and said oxygen clusters having an average radius of less than about 10 nm; or, (ii) contain silicon self-interstitials as the predominant intrinsic point defect, and may further contain B-defects. Additionally, in those instances wherein this axially symmetric region has a radius such that it does not extend from the central axis to the annular ring, it may itself form a second annular ring, located radially inward of the first annular ring and surround a central or core region of the wafer which (i) extends radially outward from the central axis, (ii) contains silicon self-interstitials as the predominant intrinsic point defect, and (iii) optionally contains agglomerated vacancy defects (which may or may not have an average radius of less than about 30 nm, as noted elsewhere herein).

Additionally, it is to be noted that, in some instances, the annular ring which extends radially inward from about the circumferential edge of the wafer, may essentially extend to about the central axis of the wafer, the wafer thus essentially contain a single region containing silicon lattice vacancies as the predominant intrinsic point defect, and further containing agglomerated vacancy defects (voids) and/or oxygen clusters, said voids having an average radius of less than about 30 nm and said oxygen clusters having an average radius of less than about 10 nm.

Other advantages and features of this invention will be in part apparent and in part pointed out hereinafter.

BRIEF DESCRIPTION OF THE DRAWINGS

With respect to the Figures, corresponding reference characters indicate corresponding parts throughout the several views of the drawings.

DETAILED DESCRIPTION OF THE EMBODIMENTS

Figure 1A:
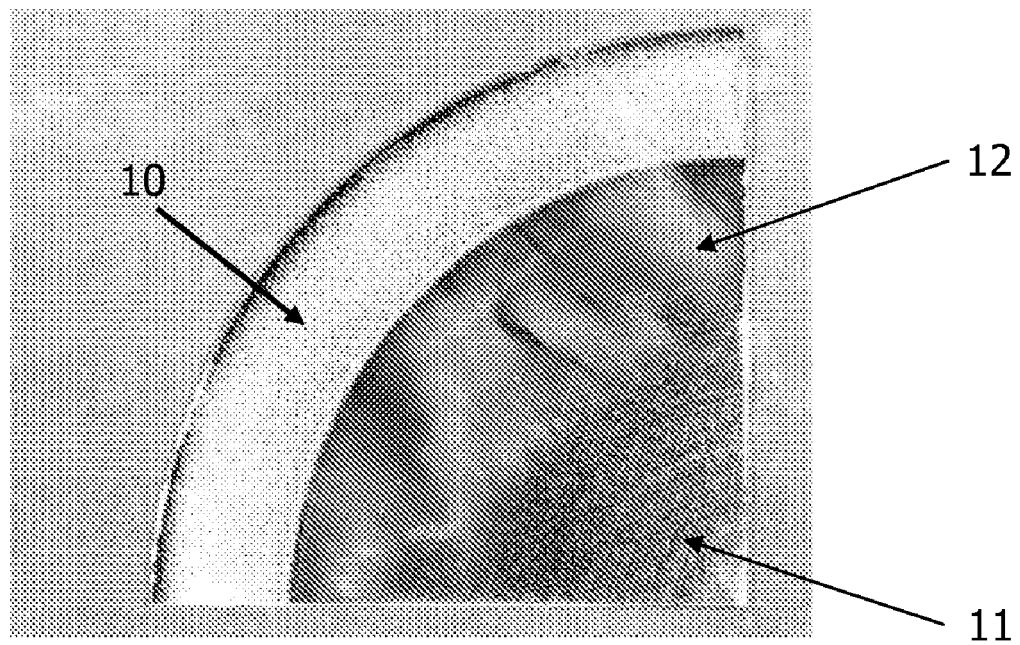
FIGS. 1A and 1B are photocopies of photographs of quarter portions of wafers showing the presence of the edge ring in two crystals from which they were obtained, grown substantially close to critical v/G conditions.

In accordance with the present invention, it has been discovered that, when attempting to grow a single crystal silicon ingot according to the Czochralski method under growth conditions such that at least a segment thereof is substantially free of agglomerated intrinsic point defects, an annular or peripheral ring (i.e., an "edge ring") of some measurable width, which extends radially inward from about the lateral surface of the ingot, may be formed which contains agglomerated vacancy defects (i.e., "D-defects") and/or oxygen clusters. More specifically, it has been discovered that, in a process for preparing a CZ single crystal silicon ingot, wherein the growth velocity, v, and the axial temperature gradient, G (or, as further detailed herein, more accurately the "corrected" or "effective" axial temperature gradient, "$G_{corrected}$" or "$G_{effective}$", respectively) are controlled such that, at a given axial position, the value of v/$G_{effective}$ is substantially near the critical value of v/$G_{effective}$ over a substantial portion of the radius of the ingot (e.g., over less about 0.75 R, about 0.8 R, about 0.85 R, about 0.9 R or even about 0.95 R, as measured from the central axis toward the lateral surface), in order to form an axially symmetric region of some measurable radial width (as further detailed elsewhere herein) that is substantially free of agglomerated intrinsic point defects, an annular ring of small but detectable oxygen clusters and/or D-defects may form around this axially symmetric region (i.e., a ring located radially outward of the axially symmetric region, and extending radially inward from about the lateral surface of the ingot to about the axially symmetric region).

It has been further discovered, however, that the intensity of such an edge ring may be reduced (i.e., the size of these small D-defects and/or oxygen clusters therein, and/or the concentration thereof, may be reduced), and preferably may be eliminated, by (i) manipulating the cooling rates of the particular segment of interest, during ingot growth, and/or (ii) radially manipulating the type and/or amount of intrinsic point defects incorporated axially into the ingot segment of interest during ingot growth. In particular, it has been discovered that rapidly cooling the segment of interest from solidification to a temperature at least about 1250° C., and then more slowly cooling that segment from a temperature of less than about 1250° C. to about 1000° C., as well as optionally controlling the radial variation of $G_{corrected}$ and/or $G_{effective}$ (as further defined elsewhere herein), may enable the preparation of a single crystal silicon ingot grown under the aforementioned conditions in order to reduce, and preferably eliminate, the presence of this edge ring of D-defects and/or oxygen clusters in the segment of interest.

In this regard it is to be noted that references herein to $v/G_{corrected}$ may also be applied to $v/G_{effective}$, and vice versa, given that $G_{corrected}$ and $G_{effective}$ are related by the relationships and equations detailed herein. Accordingly, unless stated otherwise, discussions provided herein which reference $G_{effective}$ apply with equal weight and relevance to $G_{corrected}$.

It is to be further noted that oxygen clusters may be detected by means known in the art, and/or as detailed elsewhere herein, including by means of copper decoration and/or etching after heat-treatment.

It is to be still further noted that, as used herein, "substantially close to the critical value of $v/G_{effective}$," as well as variations thereof, refers to an actual $V/G_{effective}$ value which is within about +/−30% of the critical value of $v/G_{effective}$, or within about +/−25%, about +/−20%, about +/−15%, about +/−10%, or even about +/−5%. As noted above, currently available information suggests that this critical value is about $2.5 \times 10^{-5}$ cm$^2$/sK. Accordingly, stated another way, as used herein, "substantially close to the critical $v/G_{effective}$ value," as well as variations thereof, refers to an actual value of $v/G_{effective}$ between about $1.75 \times 10^{-5}$ cm$^2$/sK and about $3.25 \times 10^{-5}$ cm$^2$/sK, between about $1.88 \times 10^{-5}$ cm$^2$/sK and about $3.13 \times 10^{-5}$ cm$^2$/sK, between about $2.0 \times 10^{-5}$ cm$^2$/sK and about $3.0 \times 10^{-5}$ cm$^2$/sK, between about $2.13 \times 10^{-5}$ cm$^2$/sK and about $2.88 \times 10^{-5}$ cm$^2$/sK, between about $2.25 \times 10^{-5}$ cm$^2$/sK and about $2.75 \times 10^{-5}$ cm$^2$/sK, or between about $2.38 \times 10^{-5}$ cm$^2$/sK and about $2.63 \times 10^{-5}$ cm$^2$/sK.

A. Single Crystal Silicon Ingot and Wafer

1. The Ingot

Accordingly, in one embodiment, the present invention is directed to a process for preparing a single crystal silicon ingot, as well as a wafer obtained therefrom, in which the ingot comprises a central axis, a seed-cone, an end opposite the seed-cone and a constant diameter portion between the seed-cone and the opposite end, said constant diameter portion having a lateral surface, a radius (R) extending from the central axis to the lateral surface, and a nominal diameter of at least about 150 mm, the ingot being grown from a silicon melt and then cooled from the solidification temperature in accordance with the Czochralski method. The process comprises controlling the growth velocity, v, and the average axial temperature gradient, G, during the growth of at least a segment of the constant diameter portion of the ingot over the temperature range from solidification to a temperature of about 1200° C., such that the ratio of $v/G_{effective}$, at a given axial position within said segment, remains substantially near the critical value of $v/G_{effective}$ over a substantial portion of the radius thereof; that is, the growth velocity and axial temperature gradient are controlled such that the ratio of $v/G_{effective}$ varies radially by less than about ±30%, relative to the critical value of $v/G_{effective}$, over at least about 75% of the radius (as measured from the central axis and toward the lateral surface), or at least about 80%, about 85%, about 90%, about 95% or even about 100% of the radius.

As further set forth herein below, in one embodiment of the present invention, the present process further comprises controlling the cooling rate of the segment through one or more temperature ranges, in order to offset the impact of the lateral diffusion of intrinsic point defects from or towards the lateral surface of the ingot. Additionally, or alternatively, the axial temperature gradient (e.g., $G_{corrected}$ or $G_{effective}$, as further defined herein below), may be controlled, in order to alter the type and/or concentration of intrinsic point defects being incorporated into the ingot axially from the melt/solid interface, in order to offset the intrinsic point defects (i.e., vacancies) being incorporated laterally from the lateral surface of the ingot.

Regardless the manner by which suppression or elimination of the edge ring is achieved, the process of the present invention may optionally yield an ingot having a segment that comprises an axially symmetric region which has (i) a measurably radial width that may be less than or equal to about 1 R, (ii) a length, as measured along the central axis, as further defined elsewhere herein. In one embodiment, this region may be substantially free of agglomerated intrinsic point defects, wherein silicon lattice vacancies are the predominant incorporated intrinsic point defect, or alternatively wherein silicon self-interstitials are the predominant incorporated intrinsic point defect. In another embodiment, this region may contain silicon self-interstitials as the predominant incorporated intrinsic point defect, and further may optionally contain B-defects. In yet another embodiment, this region may contain silicon lattice vacancies as the predominant incorporated intrinsic point defect, and further may optionally contain agglomerated vacancy defects (voids) and/or oxygen clusters, which are detectable by means known in the art, the voids having an average radius of less than about 30 nm and the oxygen clusters having an average radius of less than about 10 nm.

In any or all of the above embodiments, the radial width of this axially symmetric region may be essentially equal to the radius of the ingot (i.e., about 1 R). Alternatively, however, the radial width of this axially symmetric region may be less than 1 R, as further detailed elsewhere herein. In such instances, this axially symmetric region may extend from the central axis of the ingot radially outward toward the lateral surface, or alternatively it may form an annular ring located between the central axis and the lateral surface, and may be surrounded by a first annular ring, extending from about the lateral surface inward toward central, axially symmetric region. This first annular ring contains silicon lattice vacancies as the predominant intrinsic point defect, and may further contain agglomerated vacancy defects (voids) having an average radius of less than about 30 nm and/or oxygen clusters having an average radius of less than about 10 nm. In those instances wherein the axially symmetric region itself forms an annular ring, or more specifically a second annular ring (which is located radially inward of the first annular ring), it may surround an axially symmetric core which contains (i) silicon lattice vacancies as the predominant intrinsic point defect, and optionally voids having an average radius of less than about 30 nm and/or oxygen clusters having an average radius of less than about 10 nm, or (ii) silicon self-interstitials as the predominant intrinsic point defect, and optionally B-defects.

It is to be noted that the above-described axially symmetric region, which is surrounded by the first annular ring, may contain one or more additional rings or patterns of small micro-defects (which may or may not be detectable—that is, based on various modeling techniques, their existence may be recognized, but existing detection methods may not detect them). In general, small micro-defects may be defined as voids having an average radius of less than about 30 nm, oxygen clusters having an average radius of less than about 10 nm, and/or B-defects, as further detailed elsewhere herein.

It is to be further noted that the constant diameter portion of the ingot may optionally have a nominal diameter of about 200 mm, about 300 mm, or greater than about 300 mm.

It is to be still further noted that the axially symmetric region, and/or annular or peripheral ring or rings, may have (i) an axial length, as measured along the central axis, of at least about 20% of the length of the constant diameter portion of the ingot, and may optionally have a length of about 30%, about 40%, about 50%, about 60%, about 70%, about 80%, about 90%, or even about 100% of the length of the constant diameter portion of the ingot (the length, for example, ranging from about 10% to about 100%, or about 20% to about 90%, or about 30% to about 80% of the axial length of the ingot). Additionally, the axially symmetric region, or more generally the portion of the ingot segment other than the outer, annular ring (i.e., the "edge ring" and detailed herein), may have a radial width of about 0.1 R, about 0.2 R, about 0.3 R, about 0.4 R, about 0.5 R, about 0.6 R, about 0.7 R, about 0.8 R, about 0.9 R, or even about 0.95 R (the radial width ranging, for example, from about 0.1 R to about 0.95 R, or about 0.2 R to about 0.8 R, or about 0.3 R to about 0.75 R). In this regard it is to be noted that essentially any of the various combinations of radial width and axial length may be used herein to describe an embodiment of the present invention, without departing from the scope of the present invention.

In one preferred embodiment, the growth conditions and the cooling rate are controlled in order to prevent the formation of agglomerated intrinsic point defects throughout substantially all of the axially symmetric region, thus rendering the regions substantially free of agglomerated intrinsic point defects, and furthermore to maximize radial width and/or axial length of this region. That is, in one preferred embodiment, the radial width and/or axial length of the axially symmetric region is essentially the same as the constant diameter portion of the ingot. Alternatively, however, the segment which comprises the axially symmetric region may additionally comprise an annular ring around the axially symmetric region, the ring having an axial length that is about equal to that of the axially symmetric region, and which has a radial width, as measured from about the lateral surface radially toward the central axis and to about the axially symmetric region, of less about 0.7 R, about 0.6 R, about 0.5 R, about 0.4 R, about 0.3 R, or even about 0.2 R (e.g., about 0.15 R, about 0.1 R, about 0.05 R or less), the width ranging, for example, from about 0.7 R to about 0.05 R, or from about 0.5 R to about 0.1 R, or from about 0.4 R to about 0.15 R.

Silicon lattice vacancies are the predominant incorporated intrinsic point defect in the annular ring; that is, the annular ring is vacancy-rich. Furthermore, the annular ring may optionally comprise, in one or more embodiments thereof: (a) detectable agglomerated vacancy defects, the average size (in terms of radial length) being less than about 30 nm, about 25 nm, or even about 20 nm, and greater than about 5 nm, the average radial size being for example within the range of less than about 30 nm and greater than about 5 nm, or less than about 25 nm and greater than about 10 nm, or less than about 20 nm and greater than about 15 nm; and/or (b) detectable oxygen clusters, the average size (in terms of radial length) being less than about 10 nm, about 8 nm, or even about 6 nm, and greater than about 1 nm, the average radial size being for example within the range of less than about 10 nm and greater than about 1 nm, or less than about 8 nm and greater than about 2 nm, or less than about 6 nm and greater than about 4 nm.

In this regard it is to be noted that, in one or more embodiments noted herein, the concentration of such agglomerated vacancy defects, and/or oxygen clusters, in the annular ring may be greater than about $10^4$ defects/cm$^3$. Preferably, however, the concentration of such agglomerated vacancy defects in the annular ring is less than about $10^4$ defects/cm$^3$.

2. The Wafer

The present invention is additionally directed to a single crystal silicon wafer obtained from an ingot, as detailed herein above. More particularly, the present invention is directed to a single crystal silicon wafer having a diameter of at least about 150 mm, a central axis, a front side and a back side which are generally perpendicular to the axis, a circumferential edge, and a radius (R) extending from the central axis to the circumferential edge of the wafer. The wafer comprises an annular or peripheral ring extending radially inward from about the circumferential edge of the wafer toward the central axis, said ring (i) containing silicon lattice vacancies as the predominant intrinsic point defect, (ii) containing agglomerated vacancy defects (voids) and/or oxygen clusters which are detectable by means known in the art, said voids having an average radius of less than about 30 nm and said oxygen clusters having an average radius of less than about 10 nm, and (iii) having an average radial width of at least about 0.05 R (e.g., at least about 0.1 R, about 0.15 R, about 0.2 R, about 0.25 R or more).

Optionally, the above-noted annular ring may surround one or more axially symmetric regions, or rings, that may contain silicon lattice vacancies or silicon self-interstitials as the predominant intrinsic point defect. More specifically, this annular ring may surround an axially symmetric region that extends radially outward from the central axis and toward the annular ring, the region having a measurable radial width of less than about 0.95 R (e.g., less than about 0.9 R, about 0.85 R, about 0.8 R, about 0.75 R, or less). This axially symmetric region may: (i) contain silicon lattice vacancies as the predominant intrinsic point defect, and may further optionally contain agglomerated vacancy defects (voids) and/or oxygen clusters, said voids having an average radius of less than about 30 nm and said oxygen clusters having an average radius of less than about 10 nm; or, (ii) contain silicon self-interstitials as the predominant intrinsic point defect, and may further contain A-defects and/or B-defects. Additionally, in those instances wherein this axially symmetric region has a radius such that it does not extend from the central axis to the annular ring, it may itself form a second annular ring, located radially inward of the first annular ring and surround a central or core region of the wafer which (i) extends radially outward from the central axis, (ii) contains silicon self-interstitials as the predominant intrinsic point defect, and (iii) optionally contains agglomerated vacancy defects (which may or may not have an average radius of less than about 30 nm, as noted elsewhere herein).

It is to be noted that the above-described axially symmetric region, which is surrounded by the first annular ring, may contain one or more additional rings or patterns of small micro-defects (which may or may not be detectable—that is, based on various modeling techniques, their existence may be recognized, but existing detection methods may not detect them). In general, small micro-defects may be defined as voids having an average radius of less than about 30 nm, oxygen clusters having an average radius of less than about 10 nm, and/or B-defects, as further detailed elsewhere herein.

Additionally, it is to be noted that, in some instances, the annular ring which extends radially inward from about the circumferential edge of the wafer, may essentially extend to about the central axis of the wafer, the wafer thus essentially contain a single region containing silicon lattice vacancies as the predominant intrinsic point defect, and further containing agglomerated vacancy defects (voids) and/or oxygen clusters, said voids having an average radius of less than about 30 nm and said oxygen clusters having an average radius of less than about 10 nm.

B. Edge Ring Phenomena

As noted above, in an attempt to prevent the formation of agglomerated intrinsic point defects, many CZ growth processes are designed to control the growth velocity, v, and the effective axial temperature gradient, G, such that, at a given axial position within the constant diameter portion of the grown ingot, and preferably over a substantial portion of the axial length of the constant diameter portion of the ingot, the ratio v/G remains substantially near the critical value of v/G over all or a substantial portion of the radius of the ingot. Stated another way, in an attempt to prevent the formation of agglomerated intrinsic point defects in the constant diameter portion of a CZ single crystal silicon ingot, the CZ process parameters (e.g., growth velocity, thermal profiles, etc.) are controlled such that the actual value of v/G over all or a substantial portion of the radius, at any given axial position within the ingot, and preferably over a substantial portion of the axial length of the ingot, remains substantially near the critical value of v/G. However, and referring now to FIGS. 1A and 1B herein, it has been discovered that a ring (10) near the lateral surface, or radial edge, of the constant diameter portion of the ingot (i.e., an "edge ring") may form under such growth conditions, which contains agglomerated vacancy defects (D-defects) and/or oxygen clusters. This edge ring has been observed to form in spite of the control of v/G substantially near the critical value of v/G. In fact, quite unexpectedly, this edge ring has been observed to form even when G increases along the radius of the constant diameter portion of the ingot, particularly near the lateral surface of the ingot. That is, this edge ring, wherein vacancies are the predominant incorporated intrinsic point defect, has been observed even when G increases radially outward toward the lateral surface, thus creating a vacancy-rich region wherein interstitials would otherwise be expected to be the dominant intrinsic point defect.

Referring again to FIGS. 1A and 1B, typical microdefect distributions on the planes of the crystal-axes (i.e., the plane perpendicular to the axis) in two CZ crystals grown under the above-noted growth conditions are shown. It can be observed from these figures that there is a central region (11) containing small agglomerated vacancy defects (i.e., D-defects) and/or small oxygen clusters, a middle region (12) having an absence of such defects, and an outer region, or edge ring (10), with D-defects and/or oxygen clusters. The agglomerated defect distributions in the central regions are effectively explained by Voronkov's theory, which is further detailed elsewhere herein, as evident from the radial uniformity of G in the central regions (see, e.g., FIG. 2A). Accordingly, maintaining the radial uniformity of G in growing CZ ingots improves the quality of these ingots in the central region. As noted above, however, FIGS. 1A and 1B also show regions containing oxygen clusters and/or D-defects near the lateral edges of the crystals, which is generally not explained by the radial uniformity of G; that is, in spite of an increase in G along the radius of the crystal, vacancy-rich conditions are established near the crystal edge.

In accordance with the present invention, it has been discovered that G calculated at essentially any radial location of the crystal at the melt/solid interface, in combination with the growth velocity, v, may generally be an effective indicator of the type and concentration of intrinsic point defects initially incorporated, as well as the final, predominant intrinsic point defect type only when the actual axial temperature profile at the particular radial location of interest can be approximated by the linear variation of 1/T, as required by Voronkov's theory, and as illustrated by equation (1), below:

$$\frac{1}{T} = \frac{1}{T_m} + \frac{1}{T_m^2} zG \qquad (1)$$

wherein: T is the temperature at any fixed radial location r; m is the growth conditions at the melt/solid interface; z is the axial distance from the melt/solid interface, and G is the magnitude of axial temperature gradient.

Figure 1B:
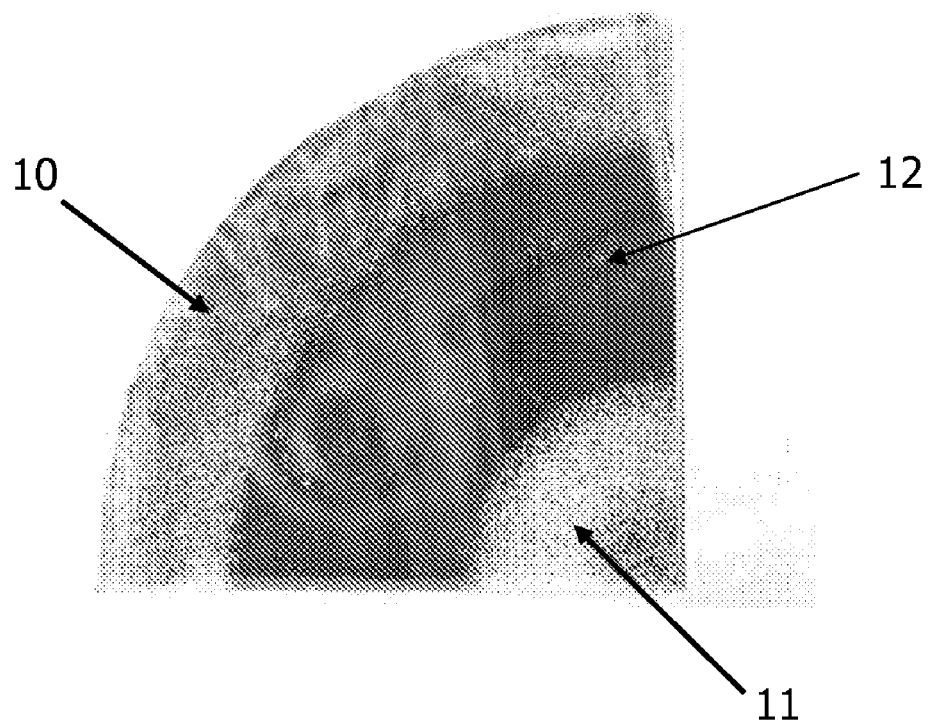
Figure 2A:
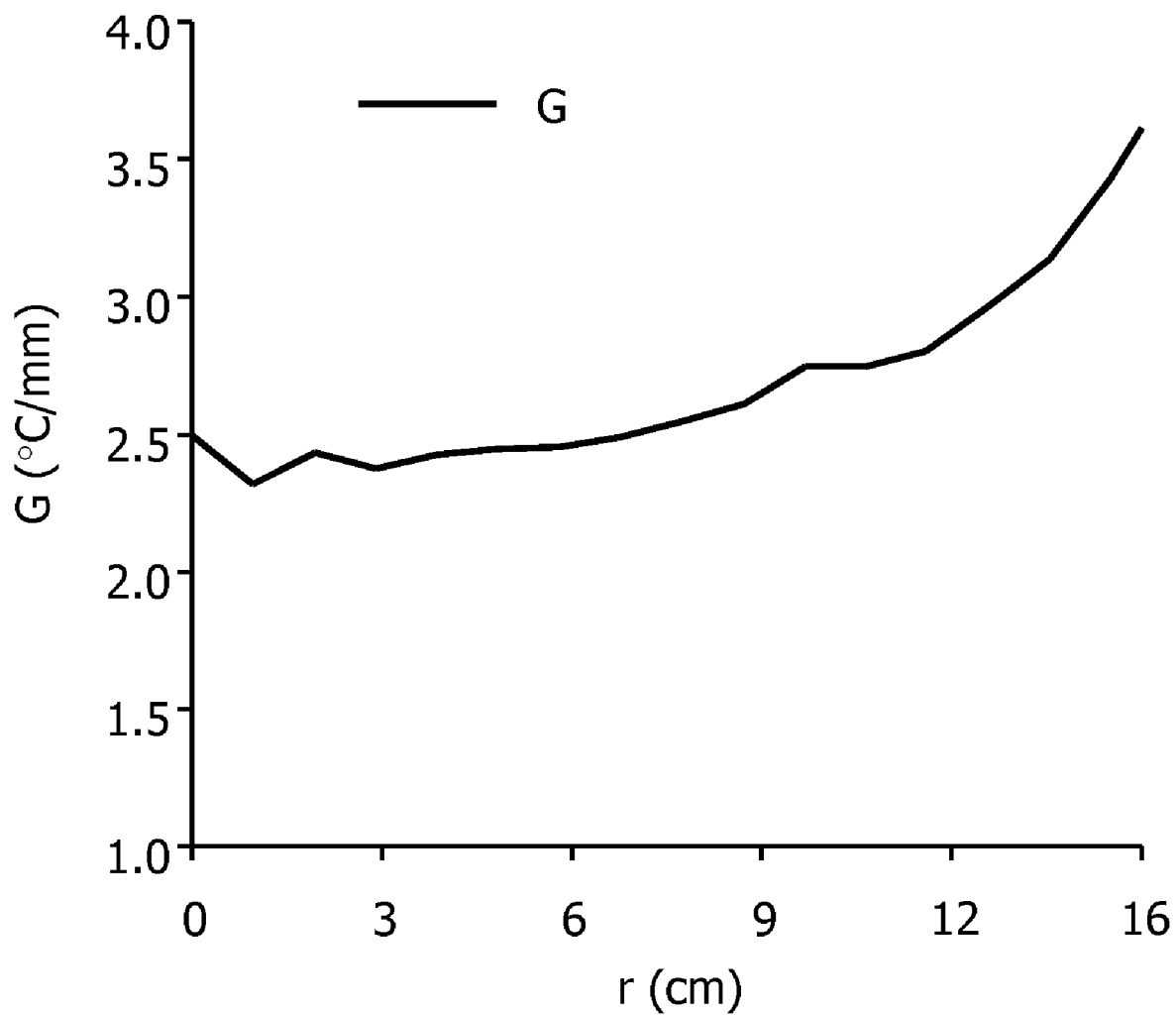
FIG. 2A is a graph showing the radial variation of G for a chosen length of the crystals shown in FIG. 1A.
Figure 2B:
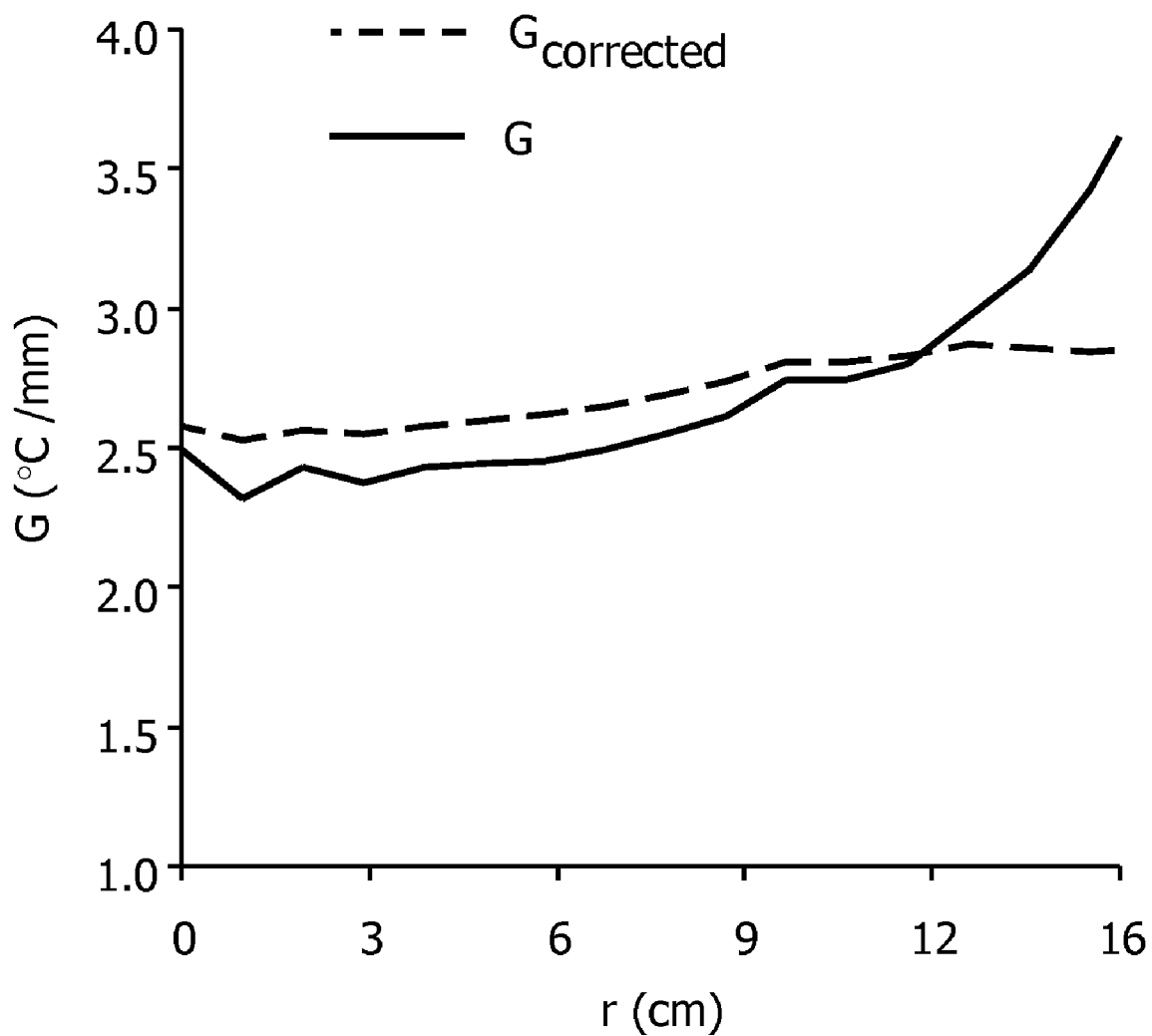
FIG. 2B is a graph comparing G and $G_{corrected}$ for a length of the crystals shown in FIG. 1B.

It has additionally been discovered that, since the actual axial temperature profile cannot be approximated accurately by equation (1) using the actual G, a corrected G (i.e., $G_{corrected}$) has been devised, in accordance with the present invention, that provides a better or more acceptable fit of the actual axial temperature profile than equation (1). Thus, $G_{corrected}$ is a more accurate indicator of the presence or absence of defects, as well as the type thereof. As detailed in equation (2), below, $G_{corrected}$ may be expressed as follows:

$$\frac{1}{T_{corrected}} = \frac{1}{T_m} + \frac{1}{T_m^2} zG_{corrected} \text{ such that} \qquad (2)$$
$$\sum f(T - T_{corrected}) = 0$$

wherein: T, m, and z are as defined above, with the subscript "corrected" indicating the corrected value for the noted variables; and, the function $f$ simply describes an acceptable statistical agreement between T and $T_{corrected}$ under any viable analytical method commonly known to one of ordinary skill in the art (e.g., the least squares method). Referring now to FIG. 2b, the radial variations of $G_{corrected}$ and G in the crystal segments shown in FIGS. 1A and 1B are illustrated. It is to be noted that $G_{corrected}$ clearly varies from the actual G. The radial variation of $G_{corrected}$ also indicates that the type and/or presence, as well as the location, of agglomerated intrinsic point defects in the crystal segments shown in FIGS. 1A and 1B can generally be explained by Voronkov's Theory only in the central regions of the crystals; that is, the presence of the edge ring cannot be explained by Voronkov's Theory.

In view of the radial uniformity of $G_{corrected}$, one would typically expect the type and/or concentration of intrinsic point defects axially incorporated from the melt/solid interface into the growing ingot to be radially uniform in, for example, the crystals shown in FIGS. 1A and 1B. However, in accordance with the present invention, it has been discovered that near the edge of a crystal growing under conditions such that $v/G_{corrected}$ is near the critical value of $v/G_{corrected}$, the lateral surface-induced diffusion of intrinsic point defects (i.e., silicon lattice vacancies and/or silicon self-interstitials) strongly affects the quality of the single crystal silicon being formed (e.g., the presence or absence of defects therein, as well as the type of defects formed).

Figure 3:
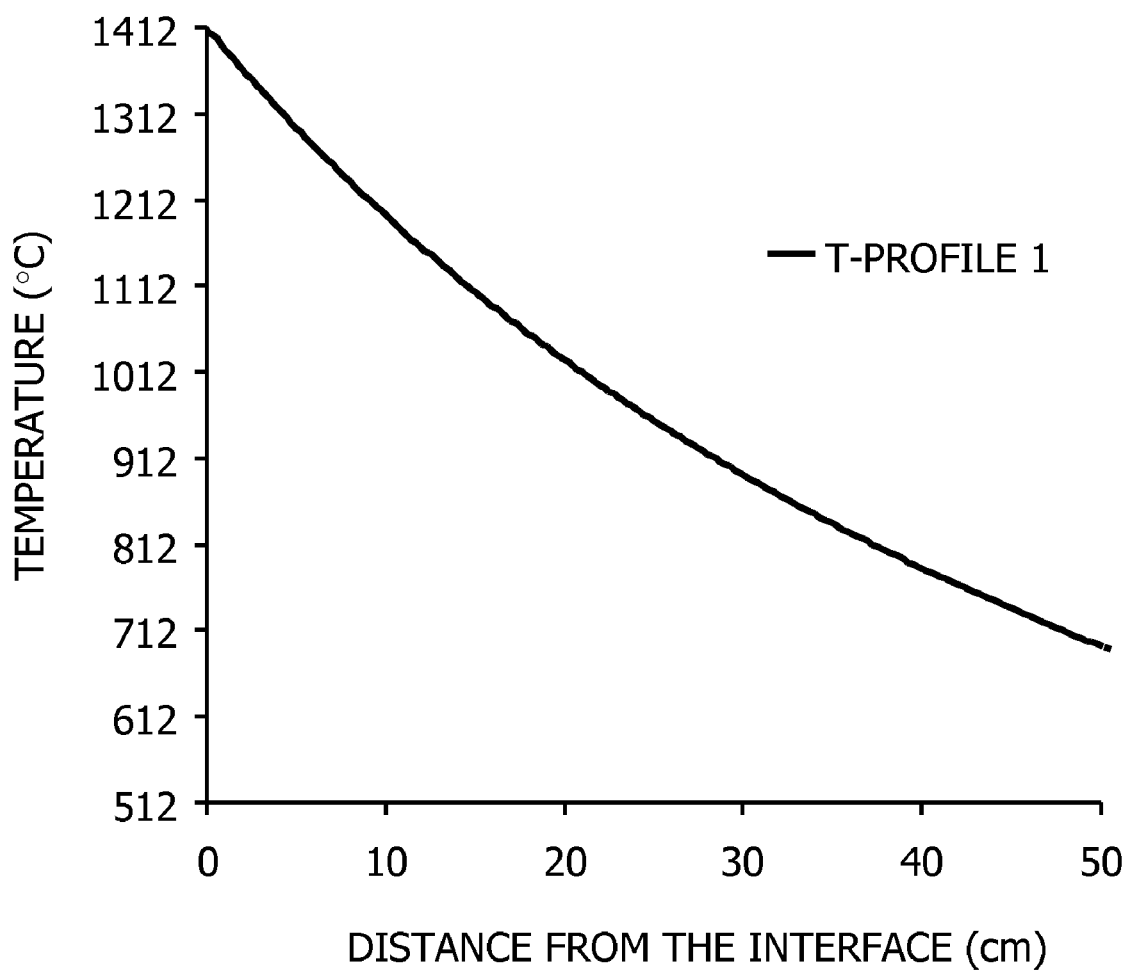
FIG. 3 is a graph showing the axial temperature profile termed the T-profile 1.
Figure 4:
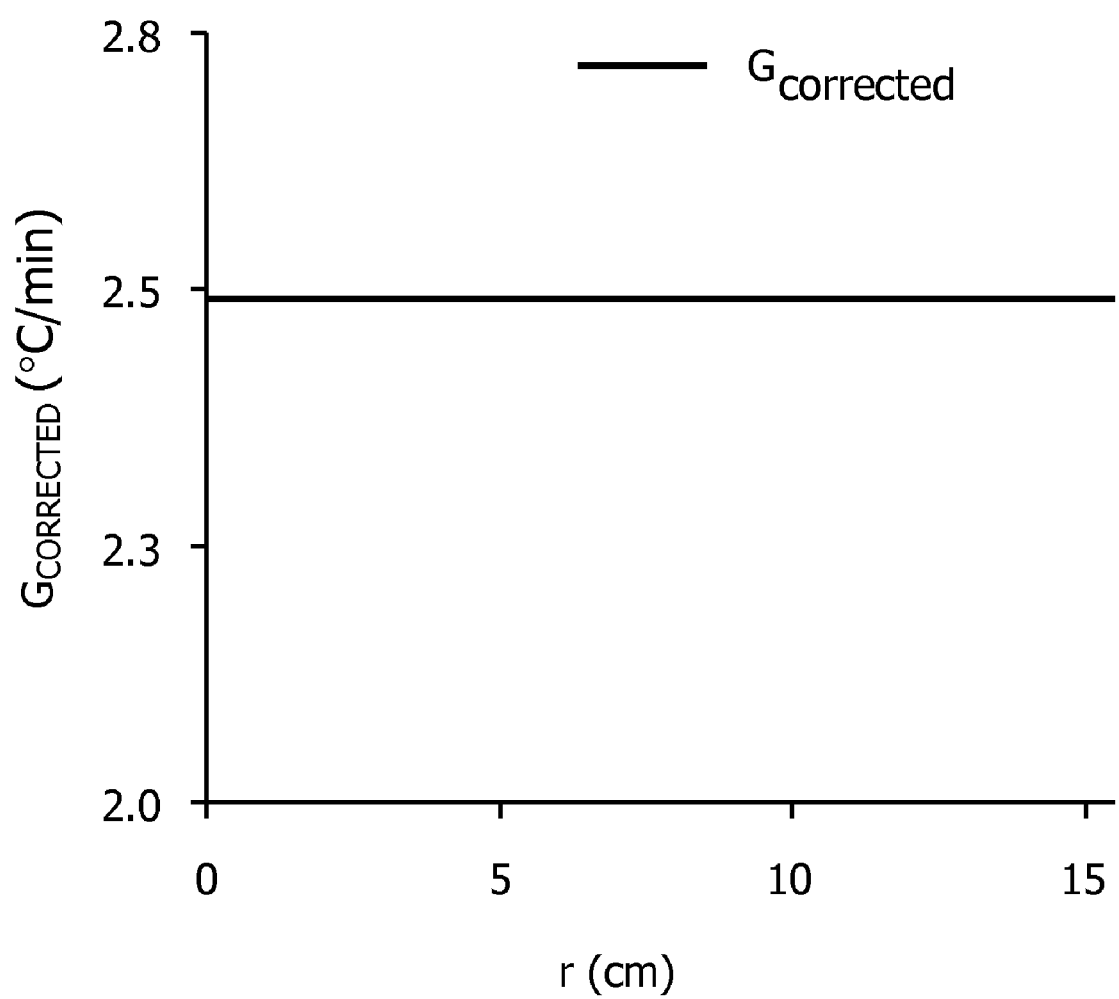
FIG. 4 is a graph showing the uniform $G_{corrected}$ profile (as a function of radius, r) in a crystal described by the axial temperature profile shown in FIG. 3 at all radial locations.
Figure 5:
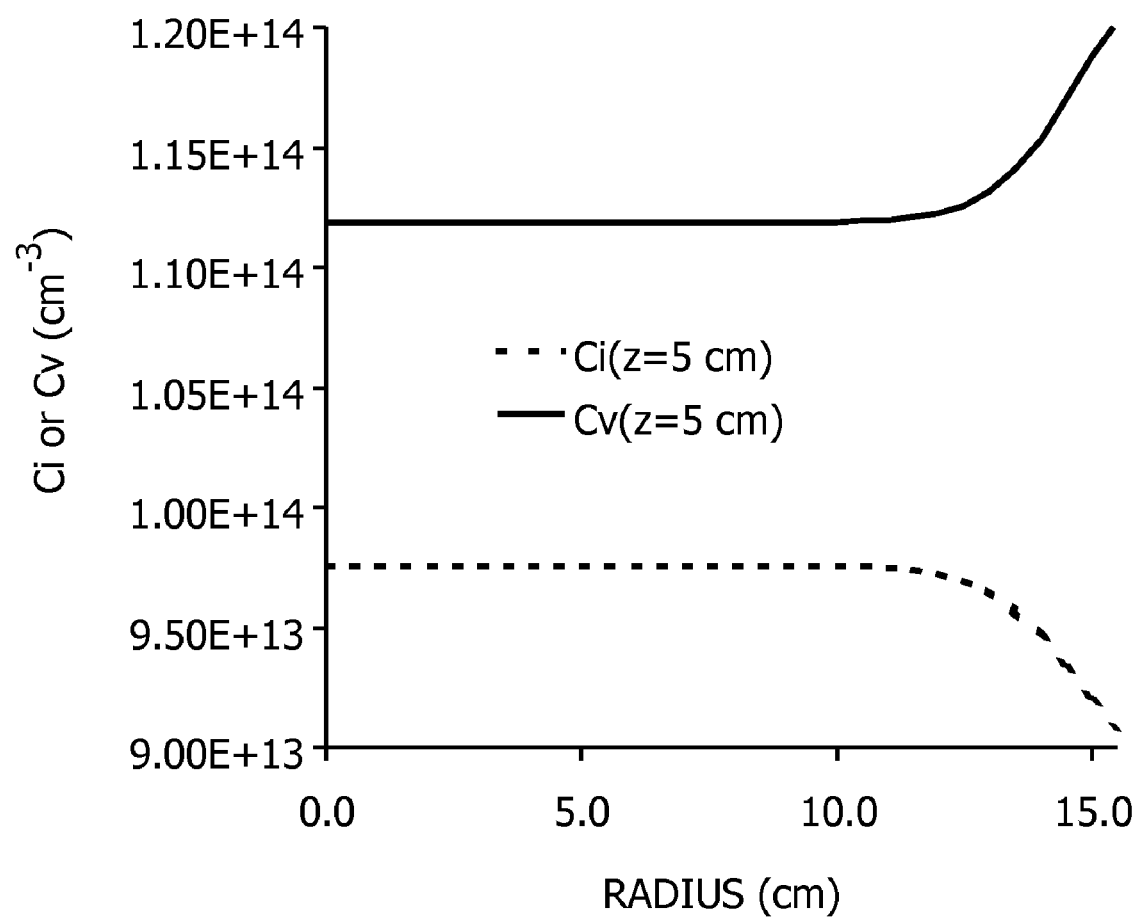
FIG. 5 is a graph showing the radial profiles of the vacancy and the interstitial concentrations 5 cm away from the interface in a crystal growing through the uniform radial temperature field described by the axial temperature profile shown in FIG. 3.

The effects of the lateral surface may be studied, for example, by simulating the defect dynamics in a CZ crystal that is grown (i) substantially close to, but slightly above, the critical $v/G_{corrected}$ conditions, (ii) through a radially uniform temperature field (i.e., a temperature filed that satisfies equation (1) above at all radial positions), and (iii) has a substantially flat interface. The axial temperature profile and the radial variation of G actual, which is equal to $G_{corrected}$ in this crystal, are shown in FIGS. 3 and 4, respectively. The vacancy and interstitial concentrations about 5 cm away from the interface in the growing crystal are shown in FIG. 5. As is evident from FIG. 5, the concentrations of both the point defects are essentially radially uniform everywhere except substantially near the surface of the crystal (e.g., within about 0.25 R, about 0.2 R, about 0.15 R, about 0.1 R, or even about 0.05 R). Near the surface, however, surface induced diffusion creates vacancy-rich conditions.

At close to the critical value of $v/G_{corrected}$, in the absence of the noted surface effects, the crystal is supersaturated with silicon self-interstitials and undersaturated with silicon lattice vacancies (see, e.g., FIG. 5). This profile may be generated by the lower vacancy formation energy compared to interstitials and the higher interstitial migration energy as compared to vacancies; alternatively, this profile may be generated due to other reasons, noted elsewhere herein. The vacancy concentration is therefore slightly higher than the interstitial concentration at about 5 cm away from the interface, and yet the crystal is supersaturated with interstitials. At lower temperatures (i.e., as the ingot cools), however, a continuous drop in the equilibrium concentrations of both types of intrinsic point defects and the annihilation of silicon self-interstitials by silicon lattice vacancies (or vice versa) leads to a moderate vacancy supersaturation and interstitial undersaturation, which in turn allows for the formation of either oxygen clusters defects and/or D-defects in the central region of the crystal.

Figure 6:
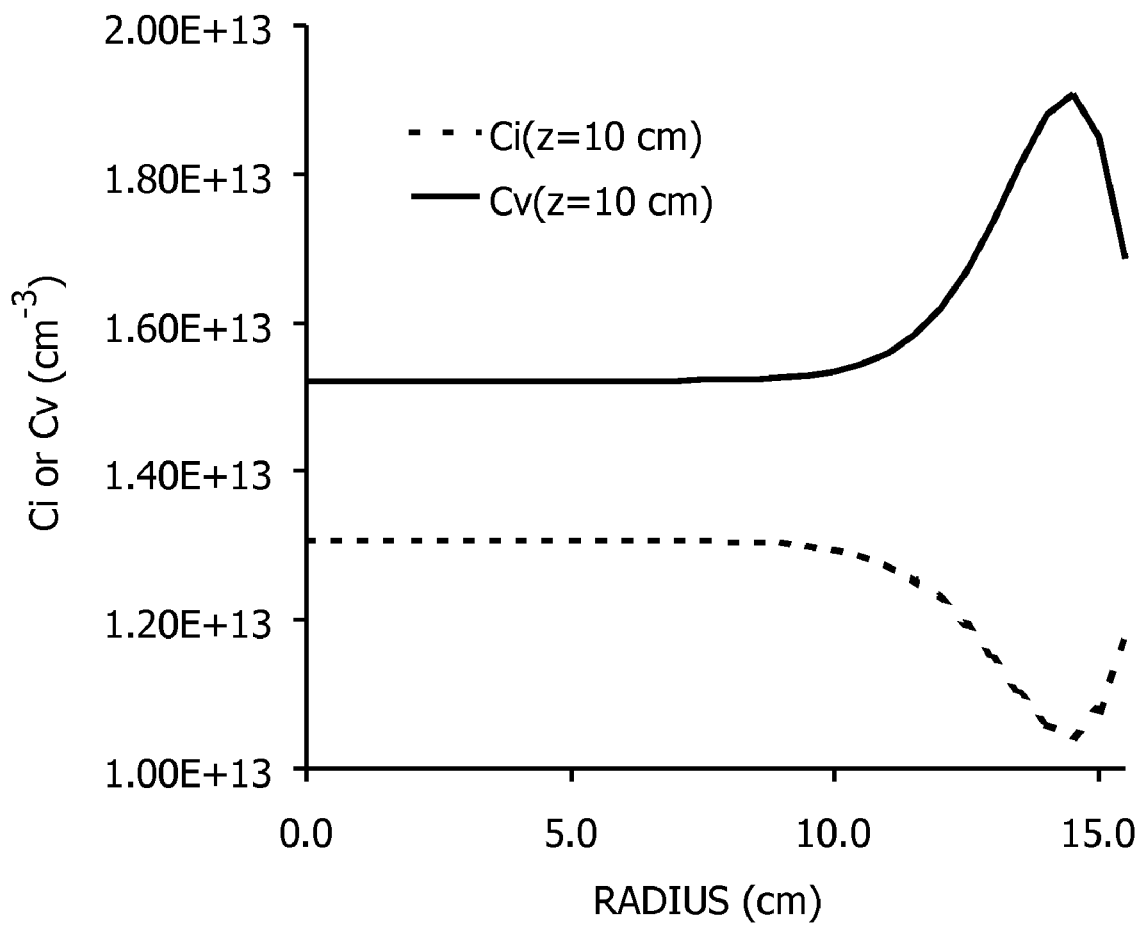
FIG. 6 is a graph showing the radial profiles of the vacancy and the interstitial concentrations 10 cm away from the interface in a crystal growing through the uniform radial temperature field described by the axial temperature profile shown in FIG. 3.

Notably, in contrast to the center of the above-noted crystals, the vacancy concentration increases near the surface beyond the axially incorporated vacancy concentration at the center of the crystal as a result of surface induced diffusion. Without being held to a particular theory, it is believed that the primary driving force for the established point defect concentration profiles near the surface is the interplay between the out-diffusion of fast diffusing interstitials, inward diffusion of vacancies, and the Frenkel reaction (wherein vacancies and interstitials are formed and consumed as part of an ongoing reaction in equilibrium). As this section of the crystal further cools, the diffusion length decreases; that is, the width of the region from the crystal surface decreases where the surface diffusion effects are strong. Further, the equilibrium concentrations of vacancies and interstitials—their concentrations at the ingot's surface—decrease rapidly with decreasing temperatures. Also, fast recombination continues to annihilate interstitials. These effects establish vacancy supersaturation and interstitial undersaturation near the crystal surface. Thus, the vacancy concentration monotonically increases from the crystal surface (from surface to center), reaches a peak, and then decreases again. The vacancy peak indicates a region where the diffusion effects, both toward the crystal surface as well as toward the crystal interior, are at a minimum. In the example shown, and referring now to FIG. 6, it is to be noted that at about 10 cm away from the melt/solid interface, the interplay between the surface induced diffusion and the Frenkel reaction in the environment of decreasing temperature and decreasing equilibrium point defect concentrations establishes a vacancy peak and the vacancy supersaturated region near the crystal surface. However, the interior of the crystal is still slightly undersaturated with vacancies. As the temperature further drops, however, the crystal becomes supersaturated with vacancies everywhere by continued recombination. Thus, depending on the oxygen concentration and the cooling rate (as further detailed elsewhere herein), agglomerated vacancy defects and/or oxygen clusters may be formed near the crystal edge. These defects form the edge ring.

Figure 7:
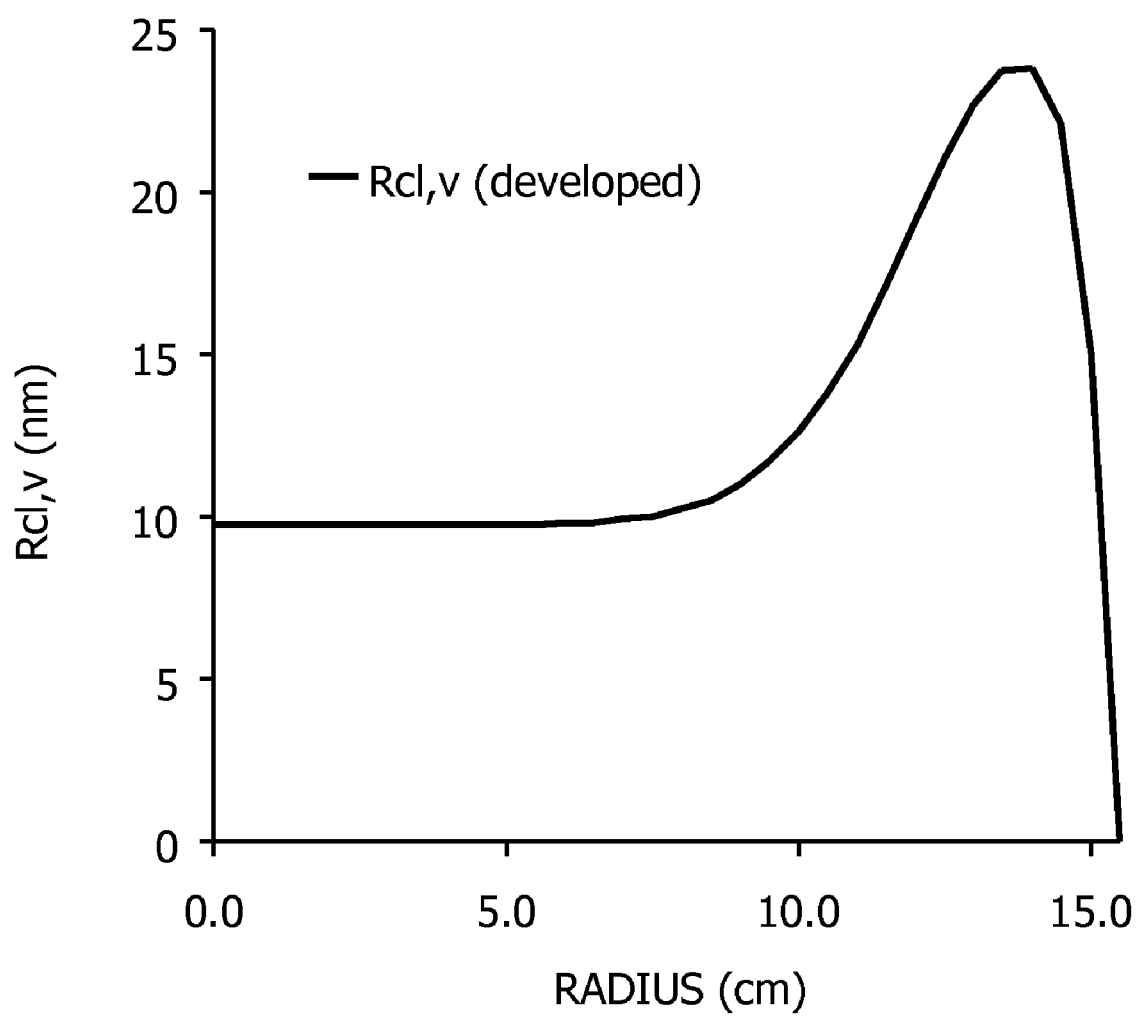
FIG. 7 is a graph showing the radial profile of the mature vacancy-cluster density in a crystal growing through the uniform radial temperature field described by the axial temperature profile shown in FIG. 3.

D-defects are formed by the agglomeration of vacancies, while oxygen clusters are primarily formed by consuming vacancies in a CZ crystal. As the oxygen clusters have higher specific volume than silicon, the formation and growth of oxygen clusters generates stress in the silicon lattice. Stress relief takes place primarily by absorbing vacancies. In this regard it is to be noted that both oxygen clusters and D-defects can be simply represented by spherical clusters termed "v-clusters," which are assumed to form by the homogeneous agglomeration of vacancies due to the close association between vacancies and oxygen. However, it is to be further noted that while the v-cluster profile captures the D-defect profile quite well when oxygen cluster formation is negligible, the v-cluster profile is an approximate map or representation of the oxygen defect or precipitate profile when D-defect formation is negligible. The predicted v-cluster profile is a cumulative representation of D-defects and oxygen clusters when they are coextensive. In general, it can be assumed that the v-cluster profile represents the sum of the oxygen cluster and D-defect profiles in a semi-quantitative way. The well-developed representative v-cluster distribution in the simulated crystal is shown in FIG. 7 (wherein Rcl,v is the radius of v-clusters). The edge ring shown in FIG. 7 contains large microdefects that can be potentially hazardous to electronic devices prepared therefrom.

Figure 8:
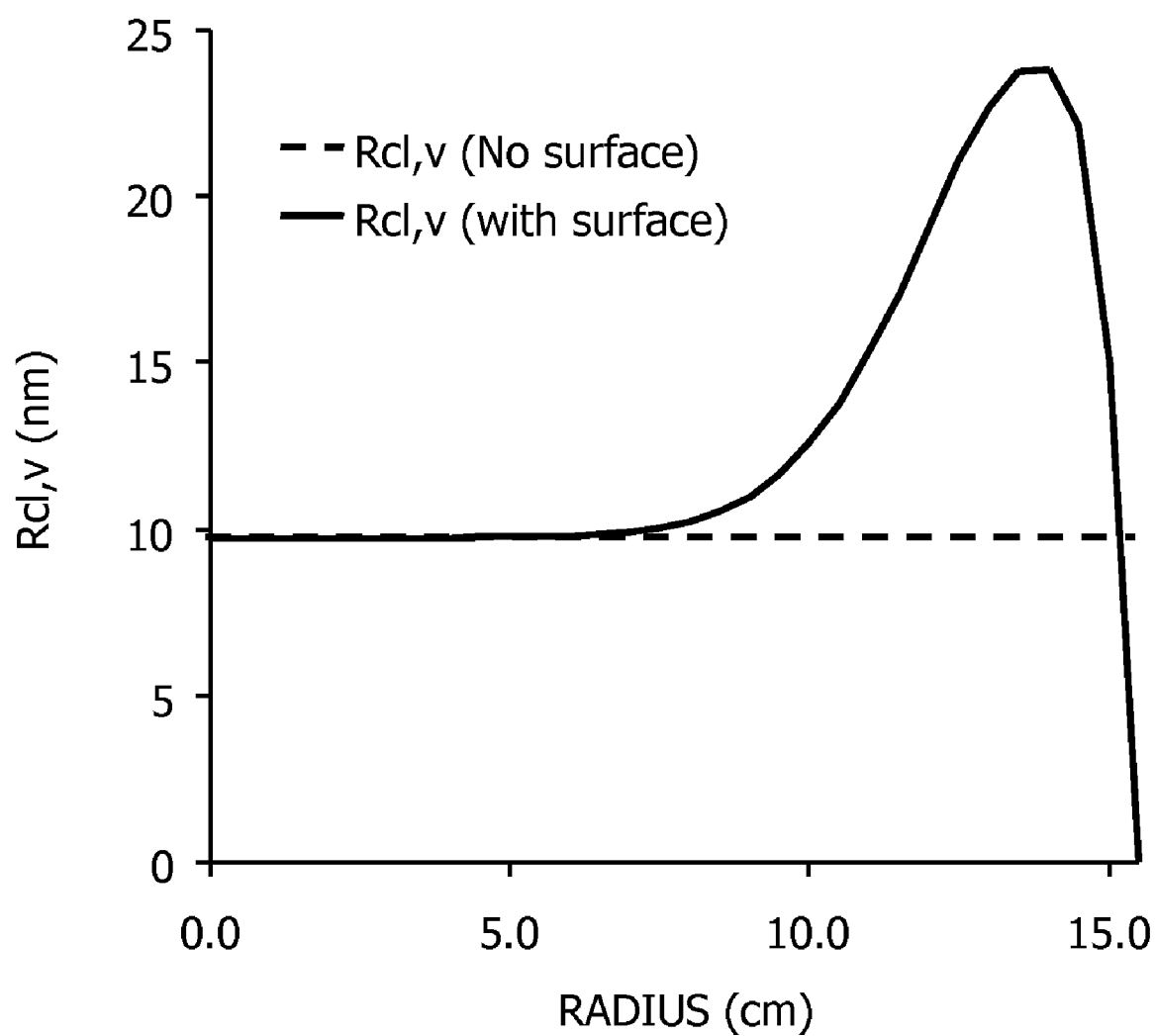
FIG. 8 is a graph showing the radial profile of the mature vacancy-cluster density in a crystal with and without an active surface growing through the uniform radial temperature field described by the axial temperature profile shown in FIG. 3.

It is to be further noted that, since the interplay between the lateral surface induced diffusion and the Frenkel reaction establishes the point defect concentration fields leading to the edge ring formation, this interplay may be termed "lateral incorporation." If the surface is inactive or inert, and thus does not act either as a source or a sink of the point defects, the microdefect distribution does not show any radial variation, as illustrated by FIG. 8.

It is to be still further noted that the edge ring effect is typically visible when a crystal is grown close to the critical $v/G_{corrected}$ conditions when the axial incorporation of intrinsic point defects establishes comparable vacancy and interstitial concentrations a short distance away from the interface, thus allowing the effects from lateral incorporation to be observed. In contrast, when the crystal growth conditions deviate far from the critical $v/G_{corrected}$ conditions, the dominant point defect type is primarily determined by the axial incorporation, even close to the crystal edge. This is because the effects of axial incorporation are much stronger than the effects of lateral incorporation.

C. Limiting/Controlling the Edge Ring in Single Crystal Silicon

In view of the foregoing, it is generally believed that the now common approach followed for the production of crystals free of agglomerated intrinsic point defects, which involves crystal growth substantially near the critical value of v/G and through a radially uniform temperature field, may not be effective in addressing the presence and/or intensity of the edge ring. In accordance with the present invention, therefore, it has been discovered that various approaches may be taken in order to limit and/or control the presence and/or intensity of the edge ring. Generally speaking, and as set forth in greater detail herein below, control of the edge ring may involve (i) the manipulation of the temperature field through which the crystal growth occurs, such that the lateral incorporation effects are compensated by the imposed radial variation of $G_{corrected}$ or $G_{effective}$, and/or (ii) manipulation or control of the crystal cooling rates during, and/or after the incorporation of point defects, or (iii) some combination of these two approaches. Stated another way, as further detailed herein below, the presence and/or intensity of the edge ring in a crystal grown under conditions such that v/G is substantially near the critical value thereof may be prevented or limited by controlling the cooling rate of the crystal, and/or by manipulating the axial temperature gradient (i.e., $G_{corrected}$ or $G_{effective}$) in order to affect the axial incorporation of intrinsic point defects from the melt/solid interface (thus offsetting the effects of lateral incorporation of intrinsic point defects from the lateral surface of the ingot).

1. Controlled Cooling

As previously noted, in one or more embodiments of the present invention, the cooling rate of the above-noted ingot segment may be controlled in order to limit or prevent the formation of the above-noted edge ring. More specifically, the cooling rates of a growing crystal segment through various temperature ranges may be controlled or manipulated in order to eliminate the edge ring, or alternatively minimize the intensity thereof. It should be recognized that when the cooling rate control detailed herein comprises multiple cooling rates, there will typically be some type of transition period while the cooling rate is adjusted. In particular, control of the cooling rate between about 1250° C. and the nucleation temperature for oxygen clusters or for voids at low vacancy concentrations (i.e., the temperature at which clusters begin to form), which is about 1000° C., allows extended diffusion time for the silicon lattice vacancy and silicon self-interstitial intrinsic point defects between the time at which the point defects were axially incorporated into the growing ingot (i.e., the "effective axial incorporation") and the time at which nucleation begins. The axial incorporation is termed "effective" because the concentrations of both the point defect species still remain comparable to each other at about 1250° C. under close to v/G critical conditions, and continue to decrease by recombination. It is to be noted that the vacancy supersaturation exists near the lateral surface of the crystal in this temperature range. Reduced cooling rates in this range allow in-diffusion of interstitials from the lateral surface that recombine with vacancies, and out-diffusion of vacancies to the surface, thus reducing the vacancy concentration near the surface.

Figure 9:
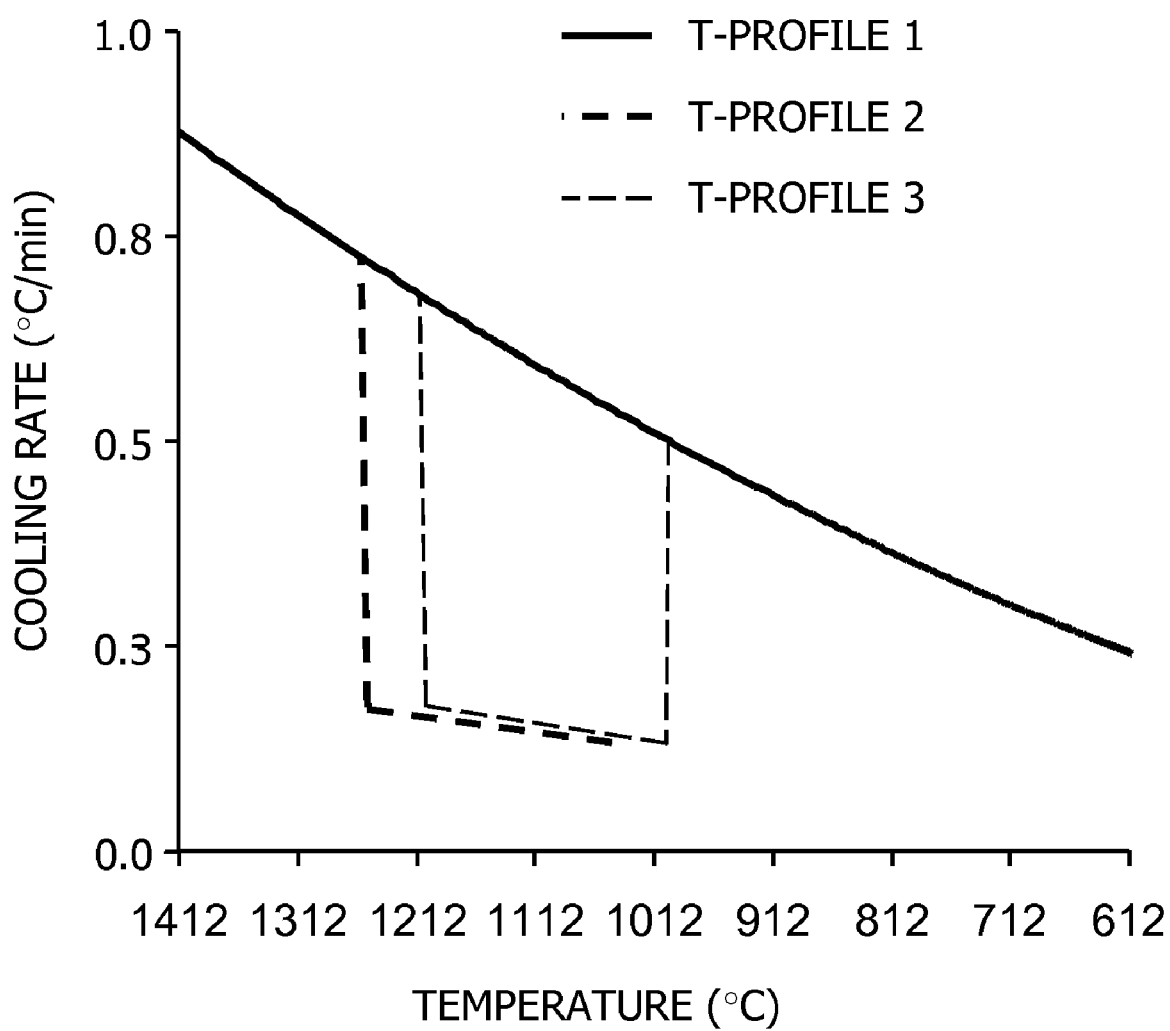
FIG. 9 is a graph showing the cooling characteristics of various temperature profiles (i.e., T-profile 1, 2 and 3).
Figure 10:
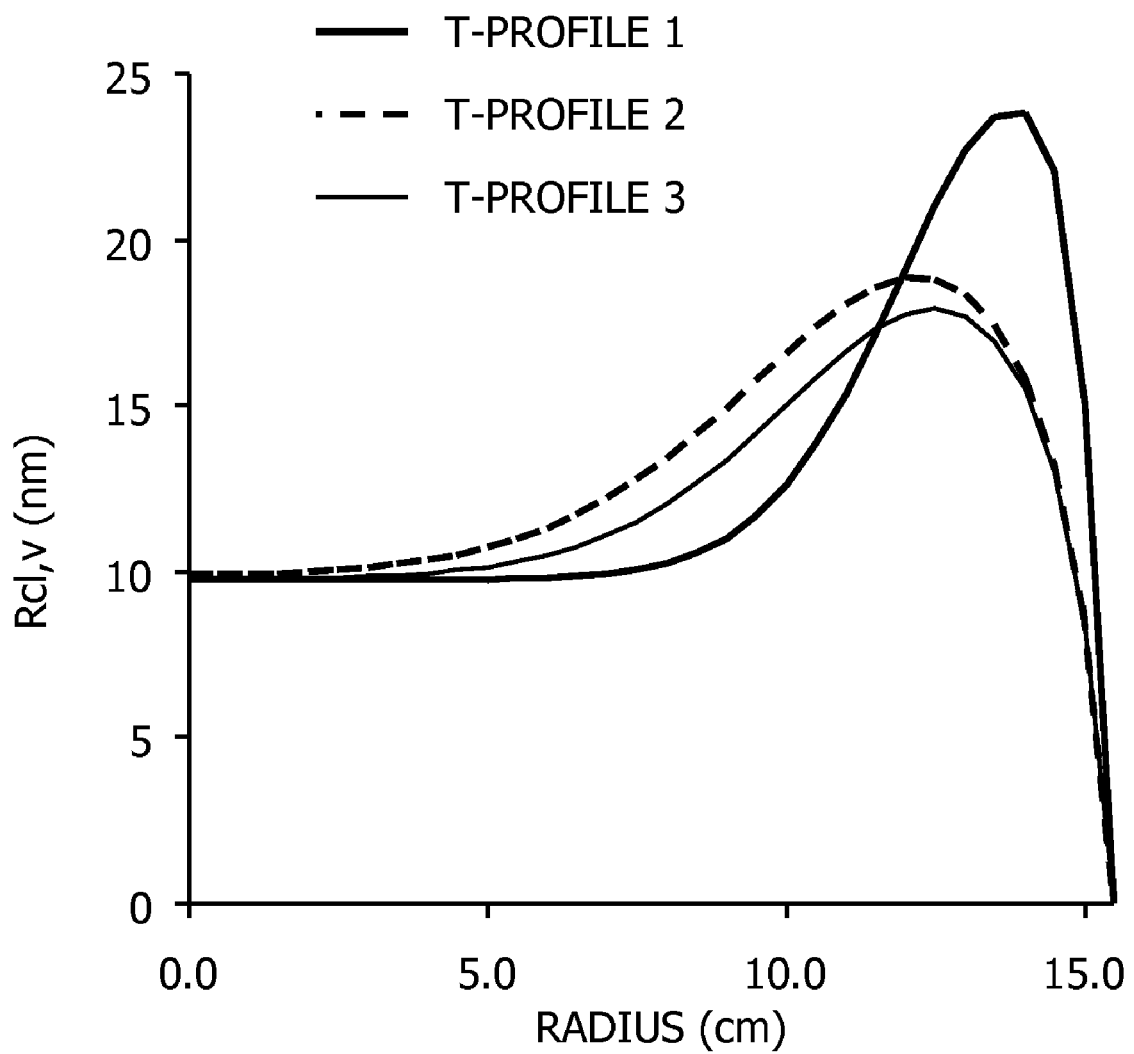
FIG. 10 is a graph showing the radial profiles of mature v-clusters in crystals grown through the uniform radial temperature fields represented by the axial profiles shown in FIG. 9 (i.e., T-profile 1, 2 and 3).

Referring now to FIG. 9, the graph therein shows a reference axial temperature profile (i.e., T-profile 1) and two other temperature illustrative profiles, one having a decreased cooling rate between about 1250° C. and about 1000° C. (i.e., T-profile 2) and the other having a decreased cooling rate between about 1200° C. and about 1000° C. (i.e., T-profile 3), as compared to T-profile 1. The effect of any temperature profile can be studied by simulating the crystal growth through the same temperature profile without any radial variation. The effect of the interface shape can be eliminated by assuming a flat interface. Referring now to FIG. 10, the graph therein shows the radial variations in the predicted v-cluster sizes in the three crystals grown separately through the three temperature profiles illustrated in FIG. 9. It is evident from these results that allowing the extended diffusion time between about 1250° C. and about 1000° C. reduces the intensity of the edge ring.

Figure 11:
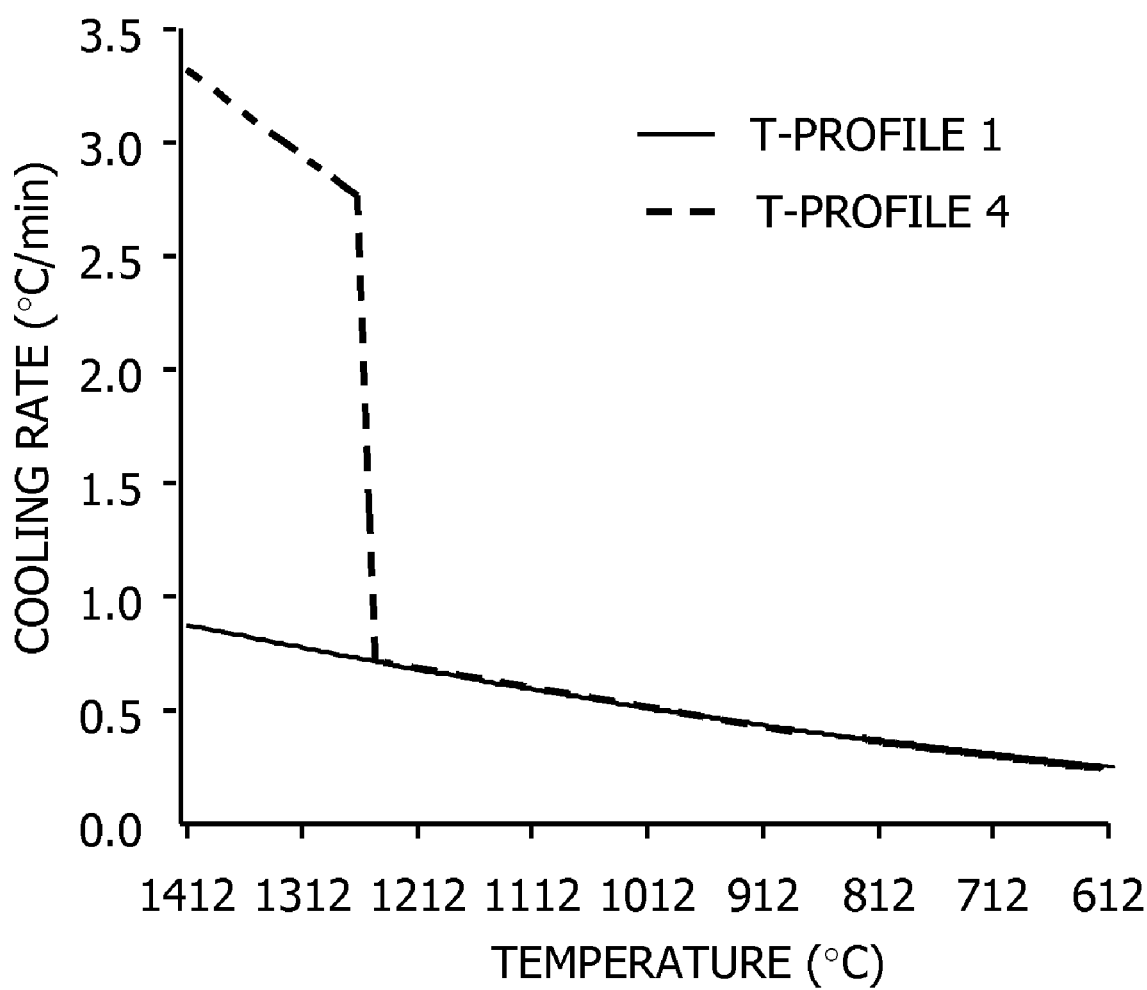
FIG. 11 is a graph showing the cooling characteristics of various temperature profiles (i.e., T-profile 1 and 4).
Figure 12:
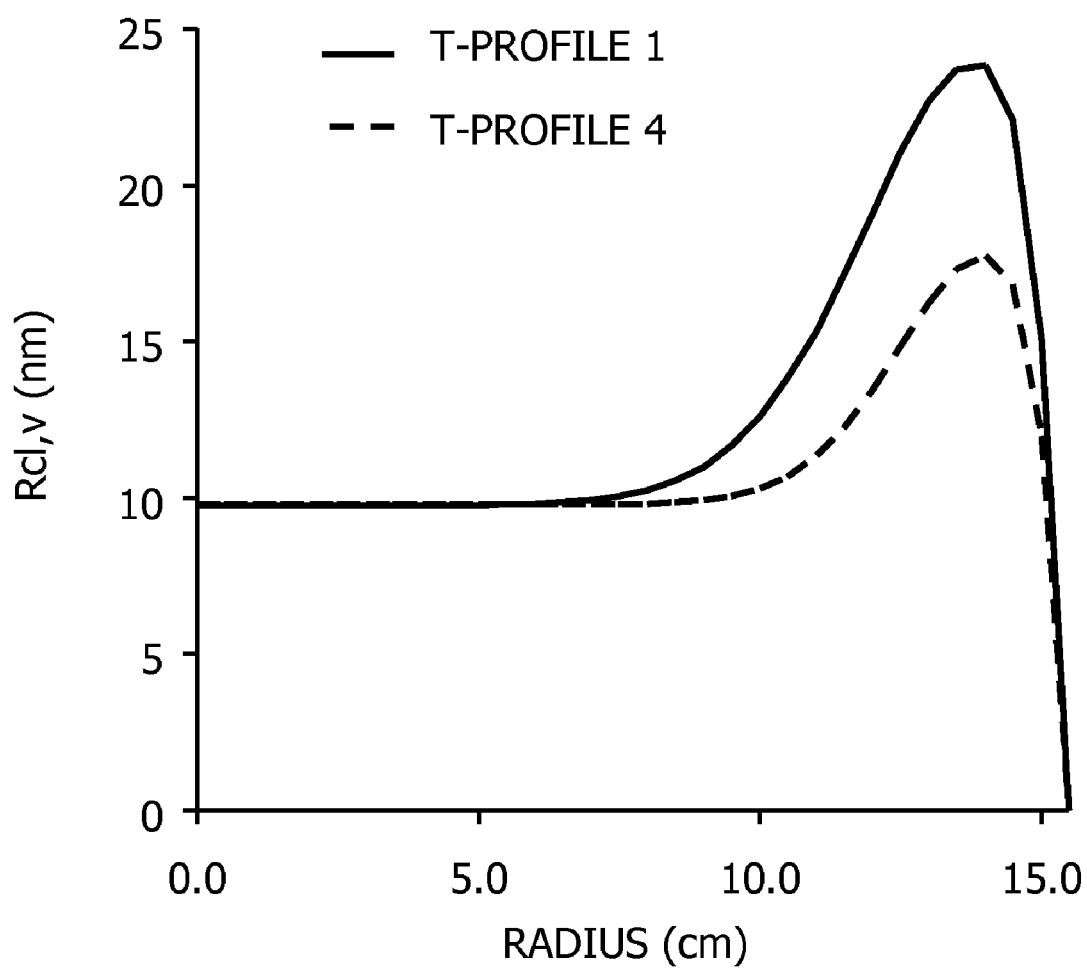
FIG. 12 is a graph showing the radial profiles of mature v-clusters in crystals grown through the uniform radial temperature fields represented by the axial profiles shown in FIG. 11.

It is to be noted that, theoretically, very low cooling rates from the temperature of solidification to the nucleation temperature would maintain the equilibrium, or close to equilibrium, conditions at all temperatures, thus avoiding the formation of agglomerated defects. In the range of practical operation, however, crystal growth under such low cooling rates is typically not economically or technically feasible. Therefore, in addition to slow cooling between about 1250° C. and about 1000° C., increasing the crystal cooling rate from the temperature of solidification (e.g., about 1412° C.) to about 1250° C. in order to rapidly cool the ingot segment of interest may be advantageous for a number of reasons. For example, rapid cooling through this temperature range may reduce the effect of the surface induced diffusion at higher temperatures, which is the precursor for the establishment of the vacancy supersaturation at lower temperatures in the edge-ring region. A desirable temperature profile (i.e., T-profile 4) intended to provide higher cooling rates between about 1412° C. and about 1250° C. is shown in FIG. 11. The reduced intensity of the edge ring in a crystal grown through this temperature profile is shown in FIG. 12.

Figure 13:
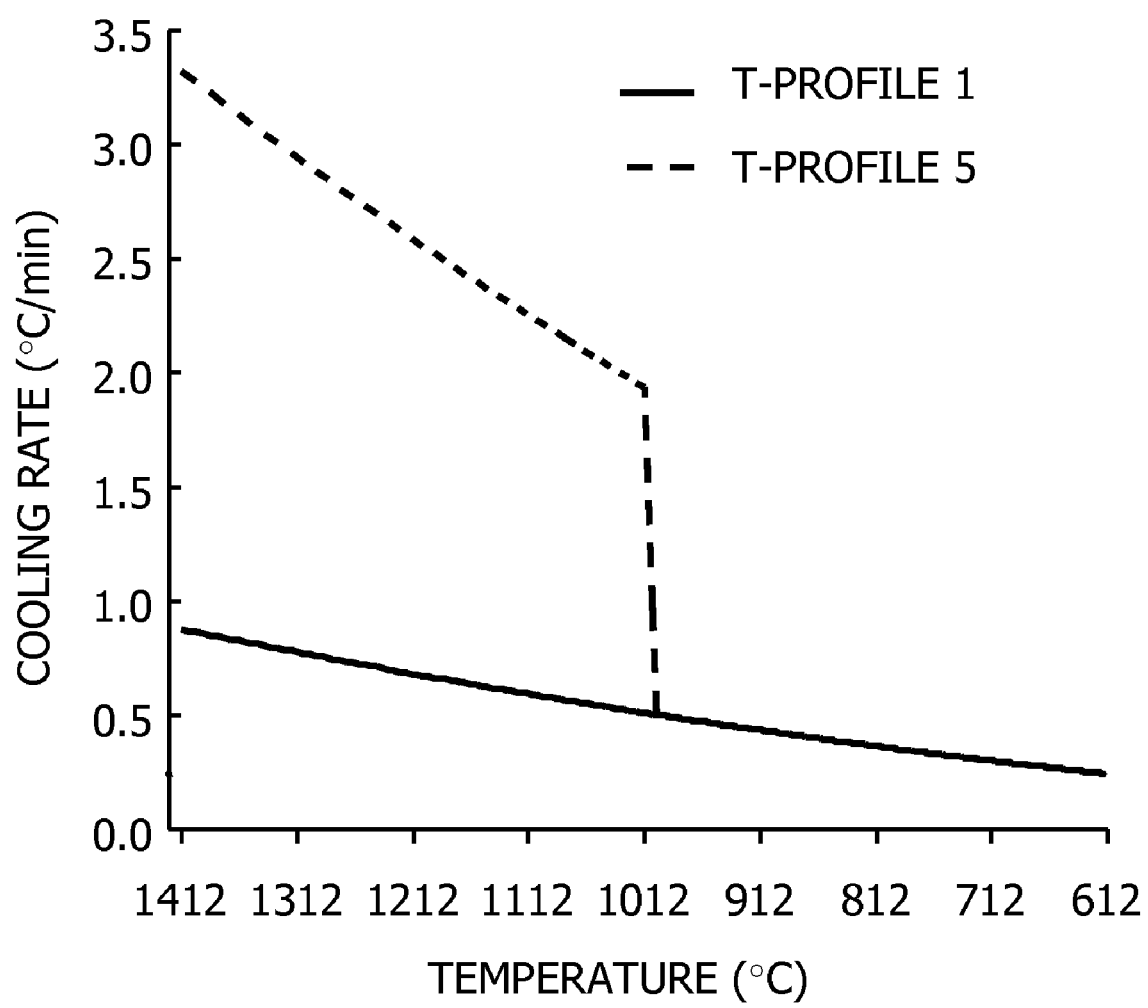
FIG. 13 is a graph showing the cooling characteristics of various temperature profiles (i.e., T-profile 1 and 5).
Figure 14:
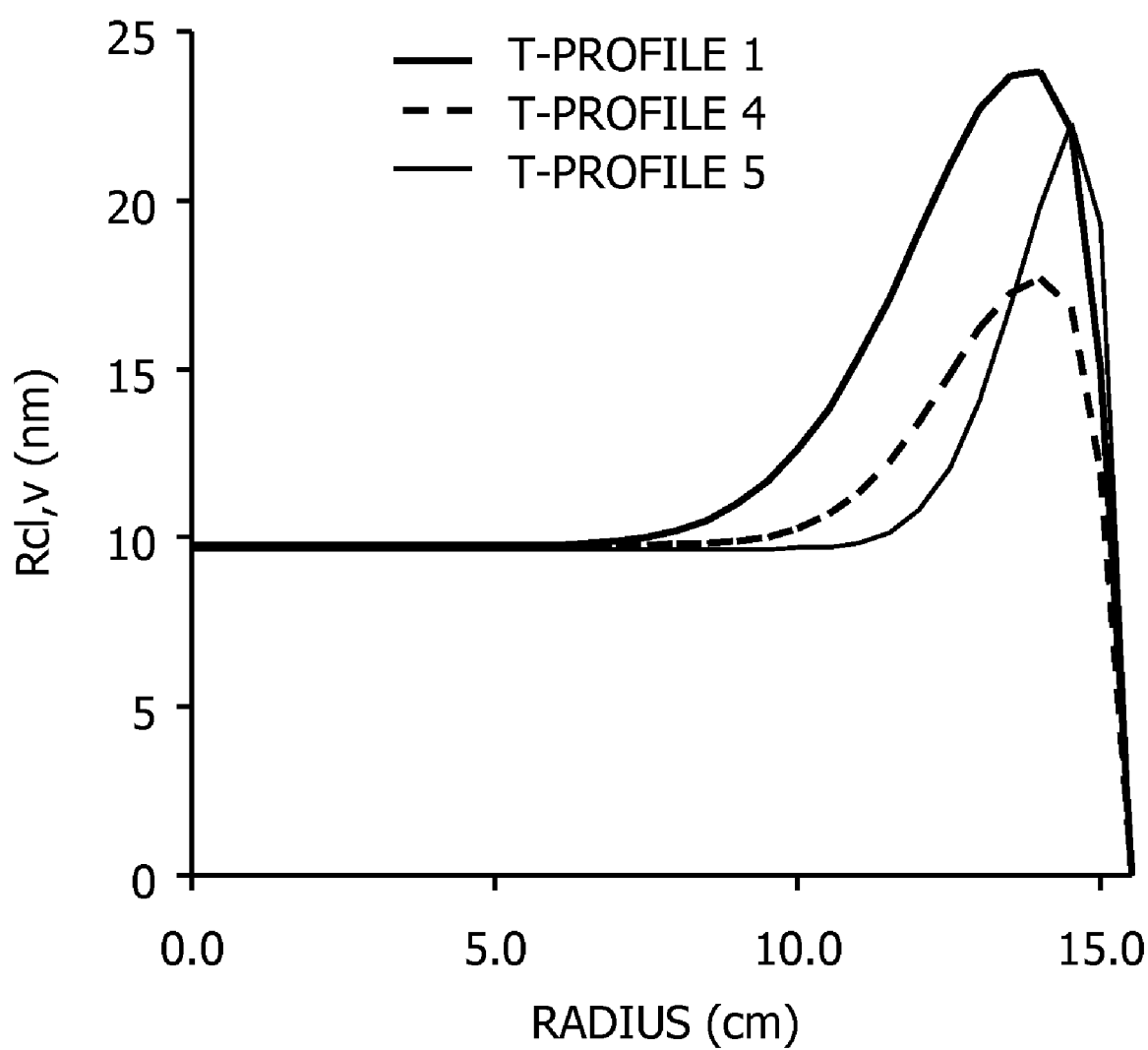
FIG. 14 is a graph showing the radial profiles of mature v-clusters in crystals grown through the uniform radial temperature fields represented by the axial profiles shown in FIGS. 13 and 11.
Figure 15:
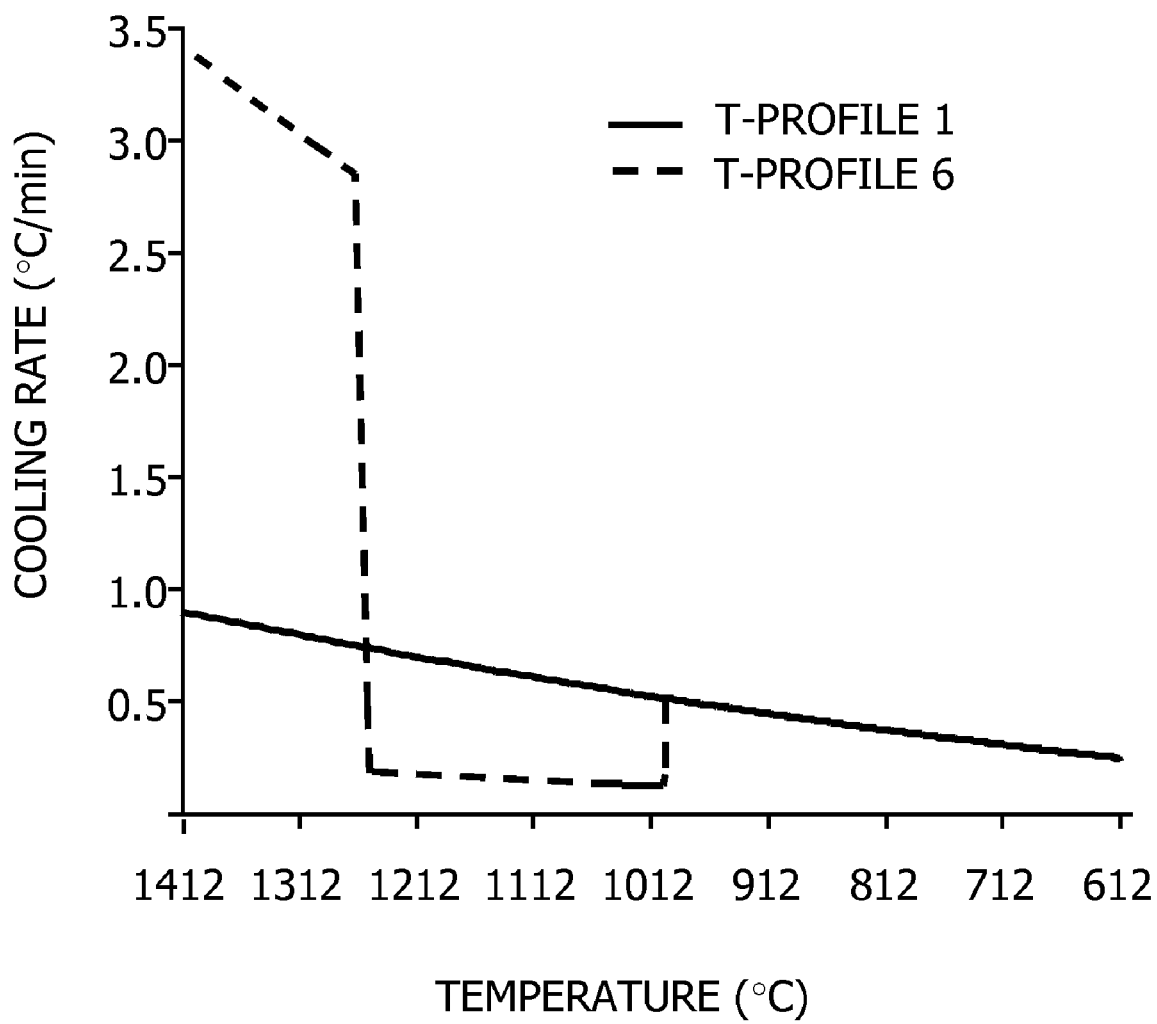
FIG. 15 is a graph showing the cooling characteristics of various temperature profiles (i.e., T-profile 1 and 6).
Figure 16:
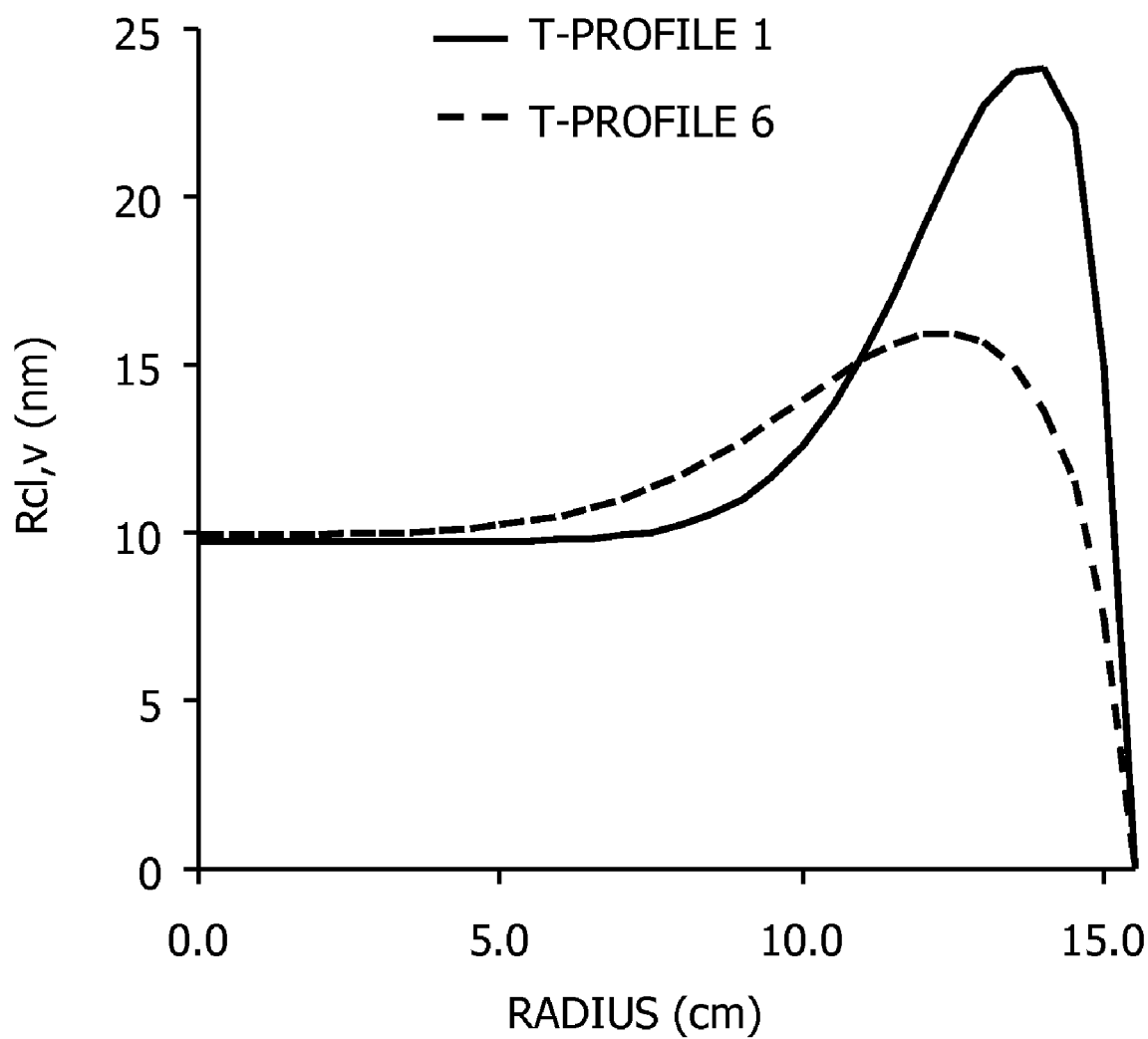
FIG. 16 is a graph showing the radial profiles of mature v-clusters in crystals grown through the uniform radial temperature fields represented by the axial profiles shown in FIG. 15.

It is to be noted that, in the range of practical operations, maintaining higher cooling rates between about 1412° C. and the nucleation temperature of agglomerated vacancy defects (e.g., about 1000° C.) is typically not highly beneficial. Accordingly, higher cooling rates between about 1412° C. and about 1250° C. are desirable, but increasing the cooling rates between about 1250° C. and 1000° C. actually reduces the diffusion time, as noted elsewhere herein. However, it is to be further noted that, depending on the cooling rate profile, the beneficial effect of higher cooling rates between about 1412° C. and about 1250° C. can still dominate the adverse effect of the higher cooling rates between about 1250° C. and about 1000° C., as illustrated in FIGS. 13 and 14. A combination of higher cooling rates between about 1412° C. and about 1250° C., and lower cooling rates between about 1250° C. and about 1000° C., however, is comparatively more attractive as shown in FIGS. 15 and 16.

Figure 17:
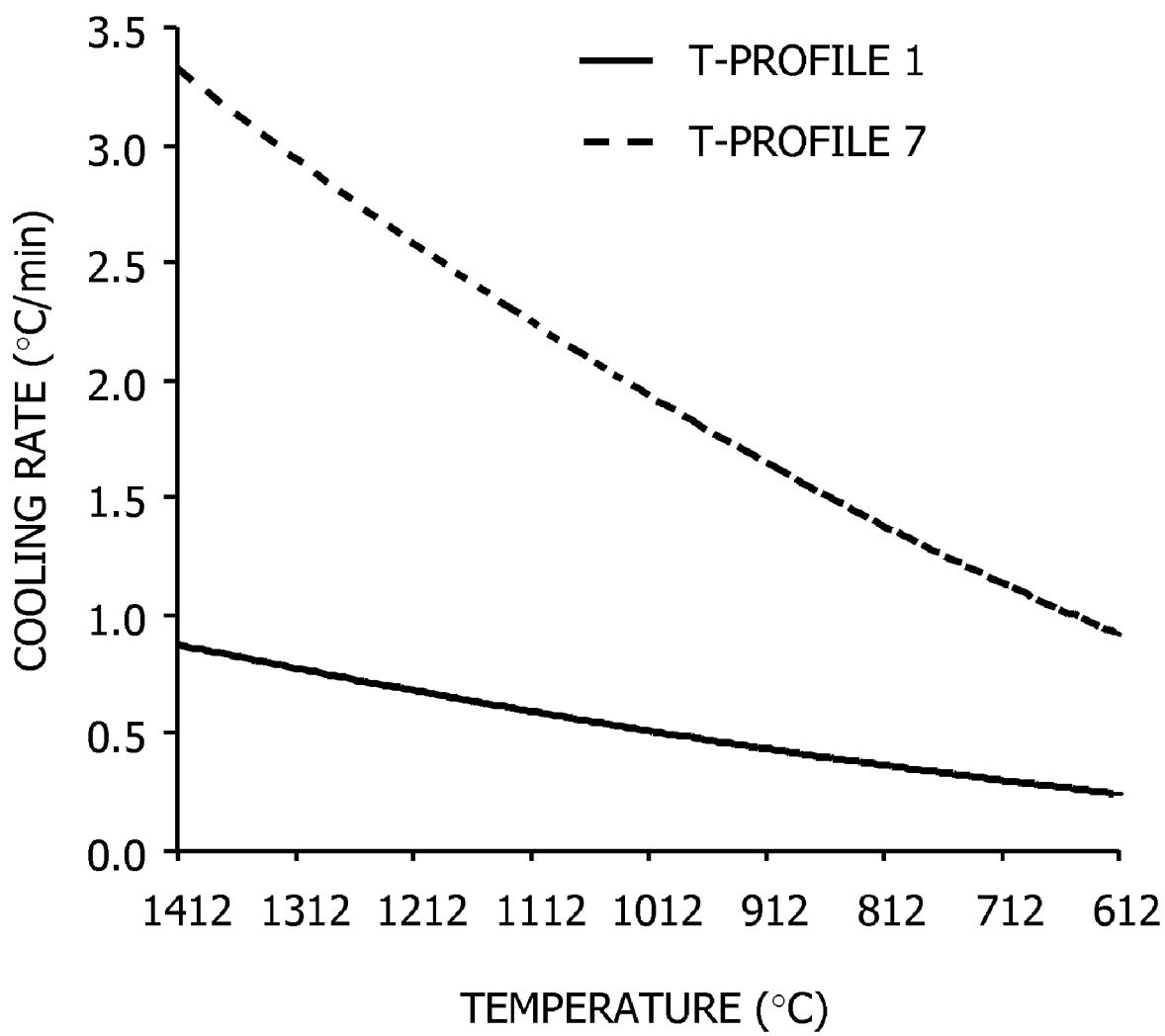
FIG. 17 is a graph showing the cooling characteristics of various temperature profiles (i.e., T-profile 1 and 7).
Figure 18:
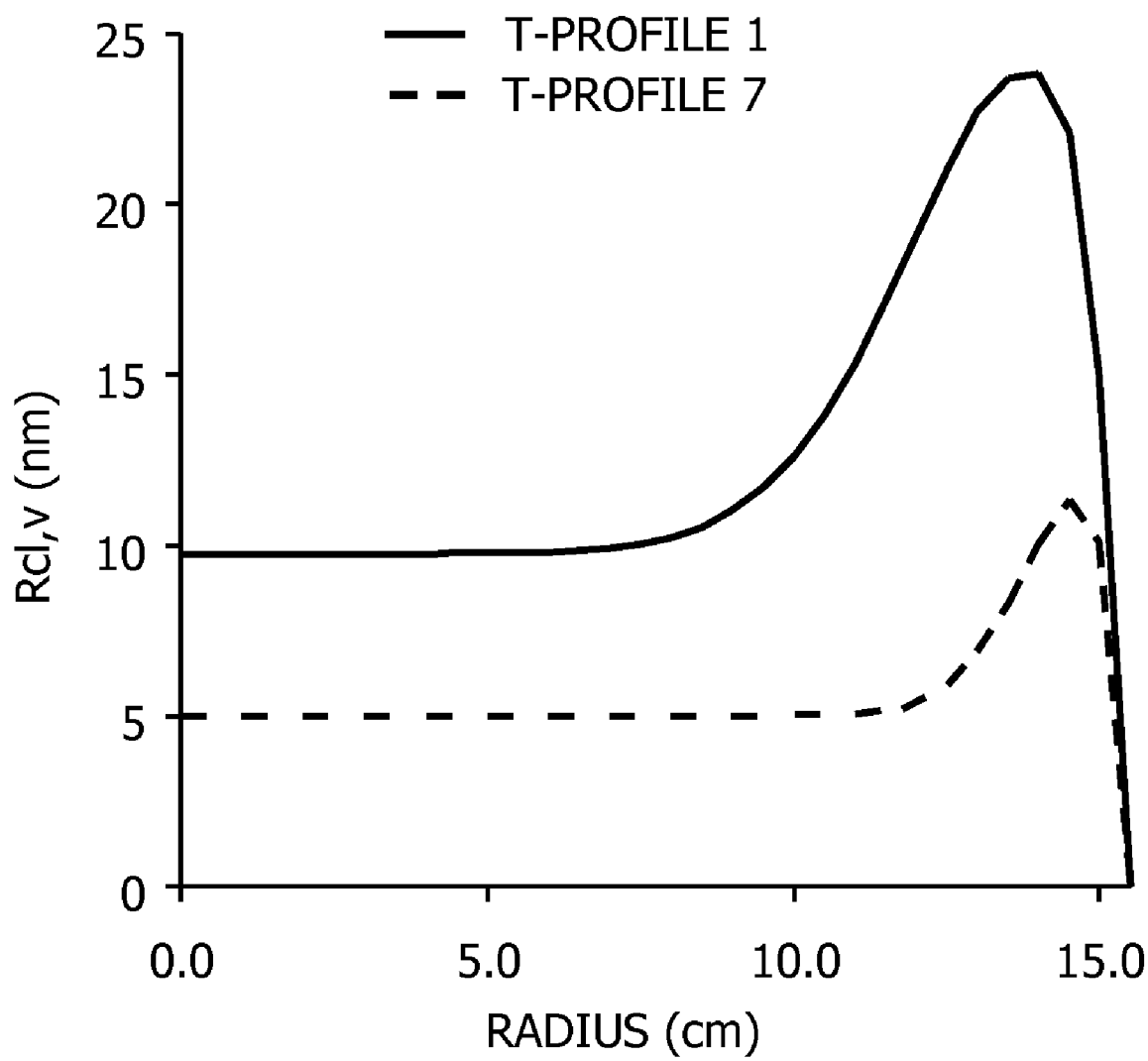
FIG. 18 is a graph showing the radial profiles of mature v-clusters in crystals grown through the uniform radial temperature fields represented by the axial profiles shown in FIG. 17.

It is to be still further noted that it may, at times, be more convenient to maintain either very high or very low cooling rates over a wide range of temperatures, rather than dramatically varying the cooling rates. Under such conditions, maintaining the higher cooling rates through the nucleation temperature of agglomerated defects is attractive, as it allows the formation of smaller agglomerated defects. This happens because during the nucleation of vacancies at higher cooling rates, the vacancy supersaturation does not drop very quickly, allowing the formation of a large number of microdefects. In the case of D-defects, this reduces their size, as the supply of vacancies for D-defect growth is finite. In the case of oxygen-related defects or precipitates, similar effects are present because oxygen clusters are formed by consumption of vacancies. Faster cooling also simply reduces the defect growth, by reducing the total diffusion time at higher temperatures. These effects are shown in FIGS. 17 and 18.

Figure 19:
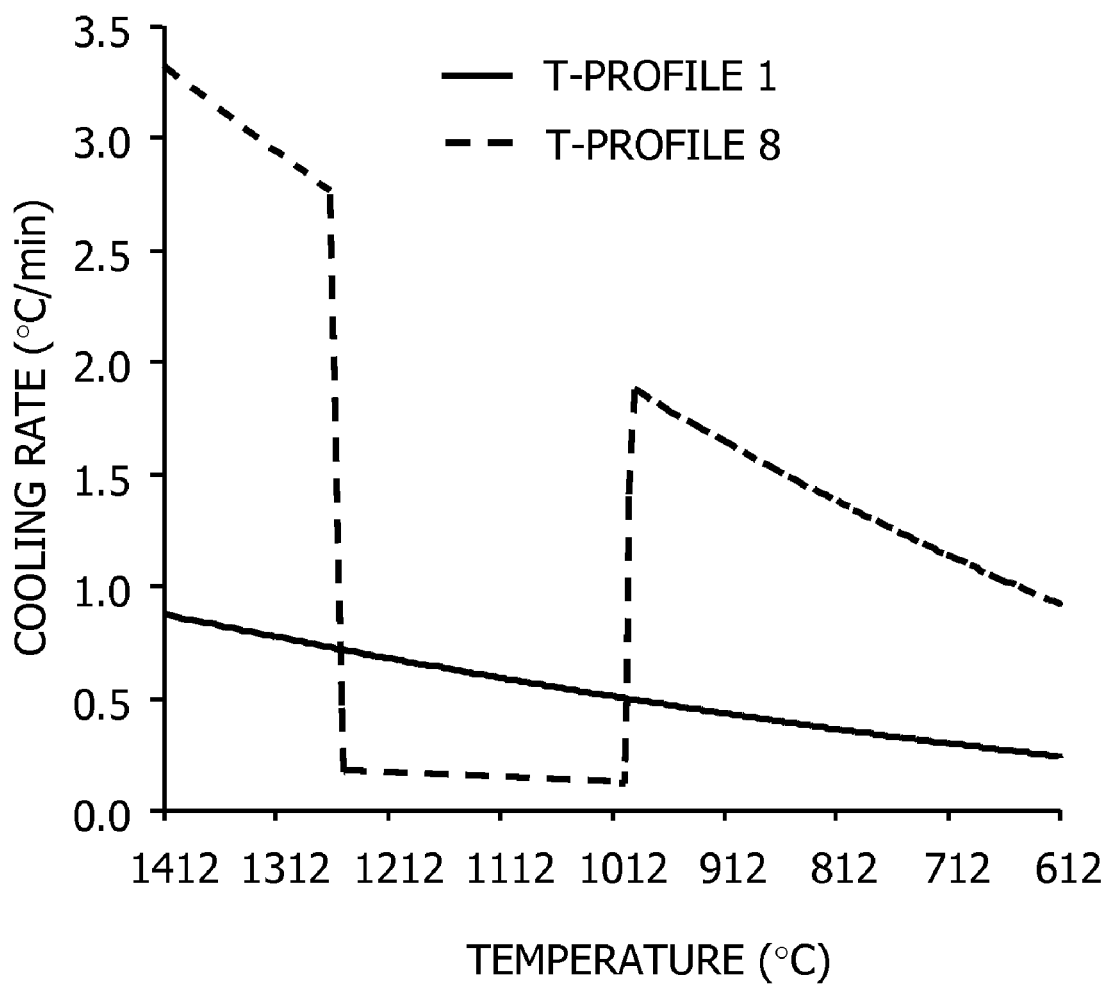
FIG. 19 is a graph showing the cooling characteristics of various temperature profiles (i.e., T-profile 1 and 8).
Figure 20:
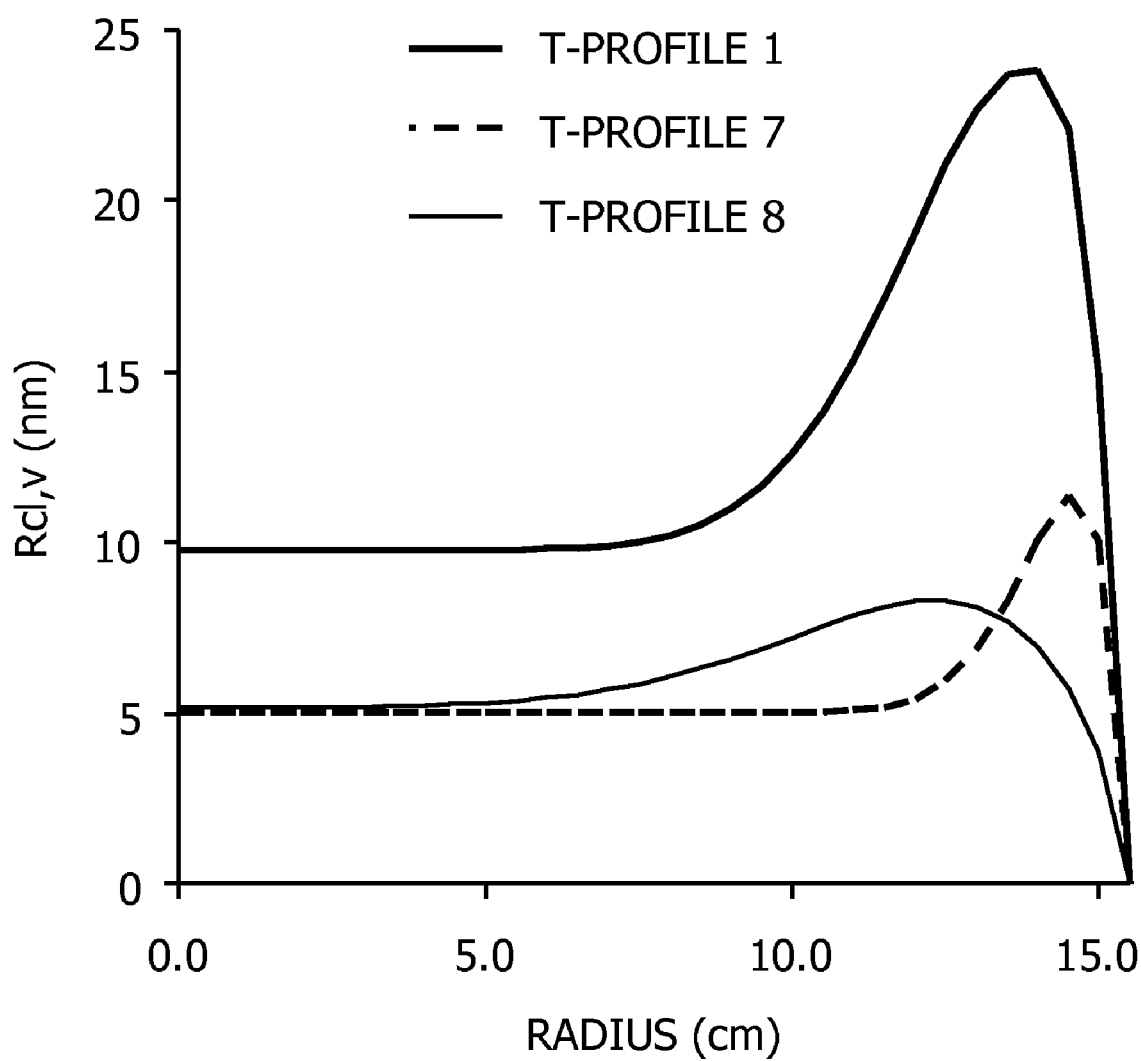
FIG. 20 is a graph showing the radial profiles of mature v-clusters in crystals grown through the uniform radial temperature fields represented by the axial profiles shown in FIGS. 19 and 17.
Figure 21:
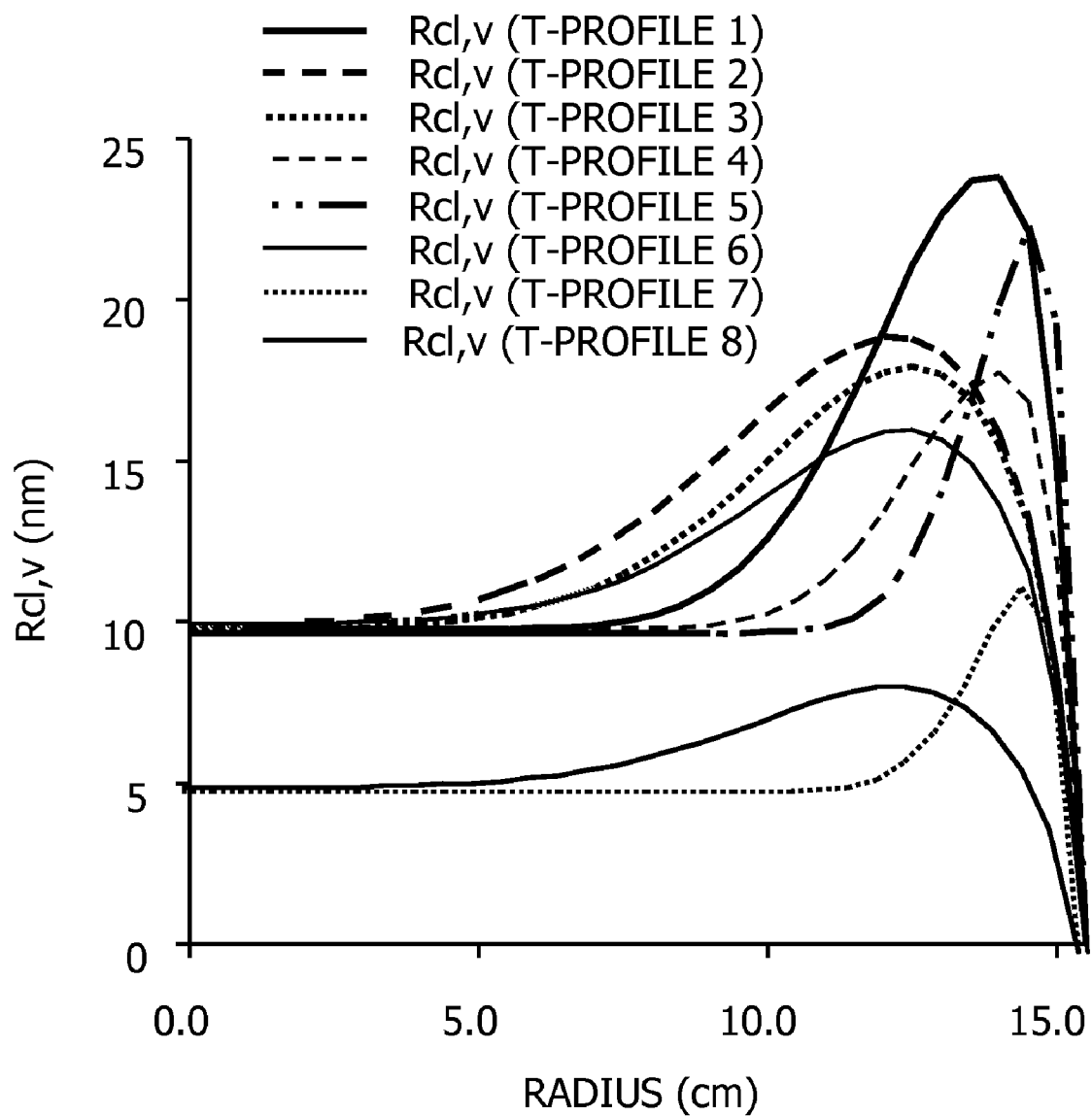
FIG. 21 is a graph showing the radial profiles of mature v-clusters in crystals grown through the uniform radial temperature fields represented by the axial profiles shown in FIGS. 19, 17, 15, 13, 11, and 9.

It is evident from the discussion provided herein above that, in the range of practical operations, a better control over the edge ring intensity may be achieved by higher crystal cooling rates between about 1412° C. and about 1250° C. and lower cooling rates between about 1250° C. and about 1000° C., both as detailed elsewhere herein. Optionally, higher cooling rates below about 1000° C. may also be advantageously employed. The results of this approach are shown in FIGS. 19 and 20. Various combinations of cooling rate control that lead to reduced size of agglomerated defects in the edge ring are further listed or illustrated in FIG. 21.

Accordingly, in one or more embodiments of the present invention, the cooling rate of the above-noted ingot segment may be controlled between the solidification temperature to a temperature of about 750° C. in order to limit or prevent the formation of the above-noted edge ring, wherein during said cooling the cooling rate of said segment is particularly controlled between about 1250° C. and about 1000° C., in order to extend the time silicon lattice vacancies and silicon self-interstitials may diffuse through the segment and recombine or otherwise be annihilated. Typically, the segment of interest is cooled through this temperature range, or more particularly through the temperature range of about 1225° C. and about 1025° C., or about 1200° C. and about 1050° C., at a rate which is less than about 0.3° C./minute, about 0.25° C./minute, or about 0.2° C./minute, and is greater than about 0.025° C./minute, about 0.05° C./minute, or about 0.1° C./minute, the cooling rate for example being within the range of about 0.025 and about 0.3° C./minute, or about 0.05 and about 0.25° C./minute, or about 0.1 and about 0.2° C./minute.

Additionally, the ingot segment may optionally be rapidly cooled between the solidification temperature (e.g., about 1412° C.) and about 1250° C. to reduce the lateral diffusion effects causing the edge ring. Accordingly, in one embodiment, the noted ingot segment of interest is cooled through this temperature range, or more particularly between about 1400° C. and about 1275° C., or about 1375° C. and about 1300° C., at a rate of at least about 2.5° C./minute, about 2.75° C./minute, about 3° C./minute, about 3.25° C./minute, or even about 3.5° C./minute, the range being for example in the range of about 2.5 to about 3.5° C./minute, or about 2.75 to about 3.25° C./minute.

Additionally, the ingot segment may optionally be rapidly cooled through the temperature range in which the nucleation of agglomerated vacancy defects, at lower vacancy concentrations, occurs (e.g., about 1000° C. or below). Rapid cooling decreases the size of the agglomerated defect, while increasing their density. Accordingly, in one embodiment, the noted ingot segment of interest is cooled below about 1000° C., and more particularly between about 1000° C. and about 750° C., or about 975° C. and about 800° C., at a rate of at least about 0.25° C./minute, 0.5° C./minute, 0.75° C./minute, about 1° C./minute, about 1.25° C./minute, about 1.5° C./minute, or even about 1.75° C./minute or more, the range being for example in the range of about 0.75 to about 1.75° C./minute, or about 1 to about 1.5° C./minute or more.

In this regard it is to be noted that, in one particular embodiment, the cooling rate detailed herein for a given segment of the ingot may be the average cooling rate for that ingot segment over the defined temperature range. In an alternative embodiment, however, the cooling rate detailed herein for a given segment of the ingot may be the actual rate over the entire ingot segment within the defined temperature range; that is, the instantaneous cooling rate over the entire ingot segment, and within the defined temperature range, meets the recited cooling rate requirement.

2. Control of $G_{corrected}$ or $G_{effective}$

As previously noted, the radial uniformity of $G_{corrected}$ essentially ensures the radial uniformity of the axial incorporation of intrinsic point defects in the absence of the surface induced diffusion of intrinsic point defects. However, when operating substantially near the critical value of v/G the interplay between the surface induced diffusion and the Frenkel reaction near the lateral surface creates vacancy-rich conditions at lower temperatures, leading to the formation of the edge ring. In addition to, or as an alternative to, controlled cooling (as detailed elsewhere herein), increasing $G_{corrected}$ near the lateral surface of the ingot may be used to suppress or eliminate formation of the edge ring by compensating for the effect of the lateral incorporation of intrinsic point defects by controlling or altering the axial incorporation of intrinsic point defects. Generally speaking, this approach involves creating a temperature field such that the radial profile of $G_{corrected}$ is non-uniform.

Figure 22:
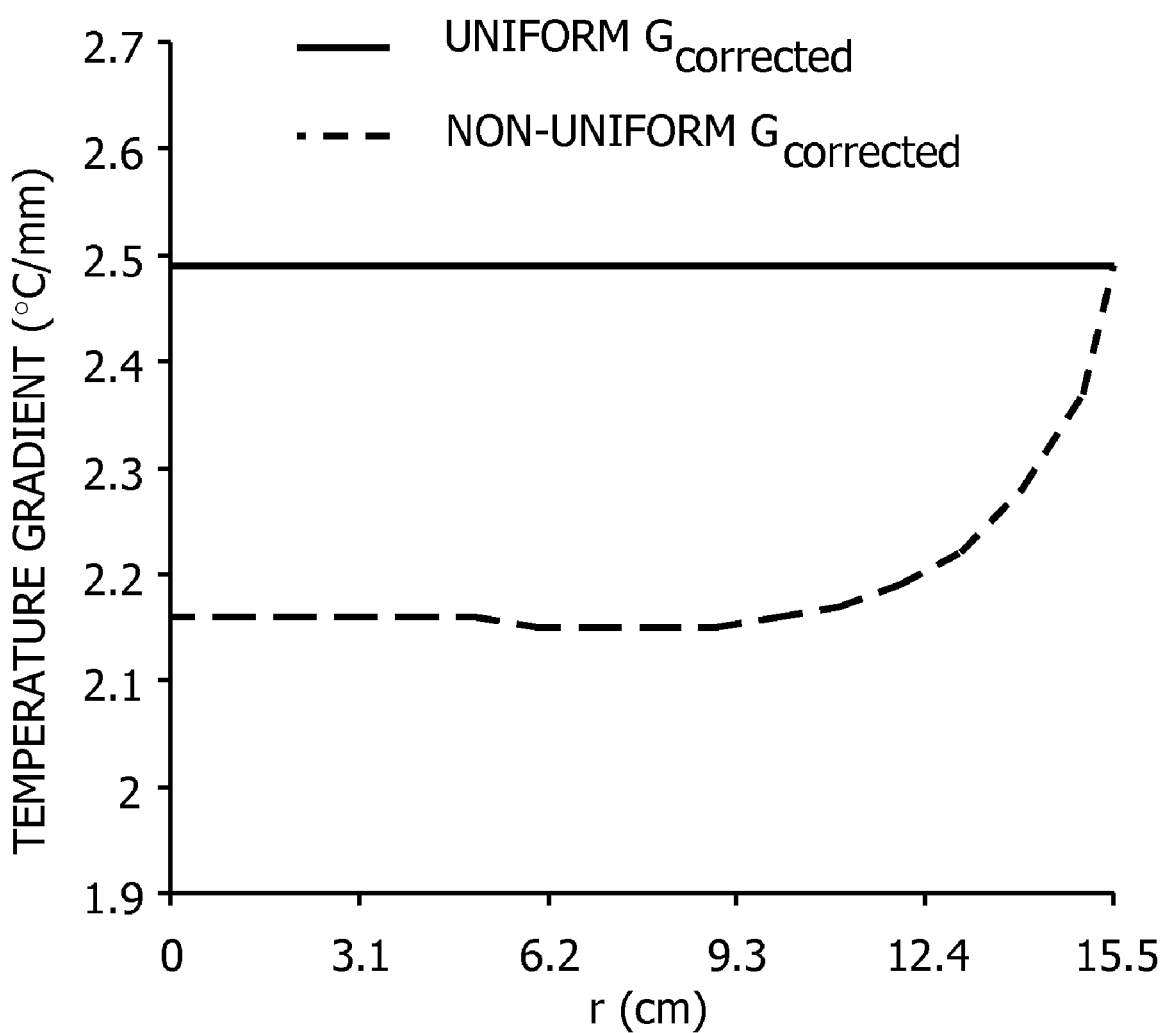
FIG. 22 is a graph showing uniform and manipulated (i.e., non-uniform) profiles of $G_{corrected}$ used for simulating manipulation of the axial incorporation during crystal growth.
Figure 23:
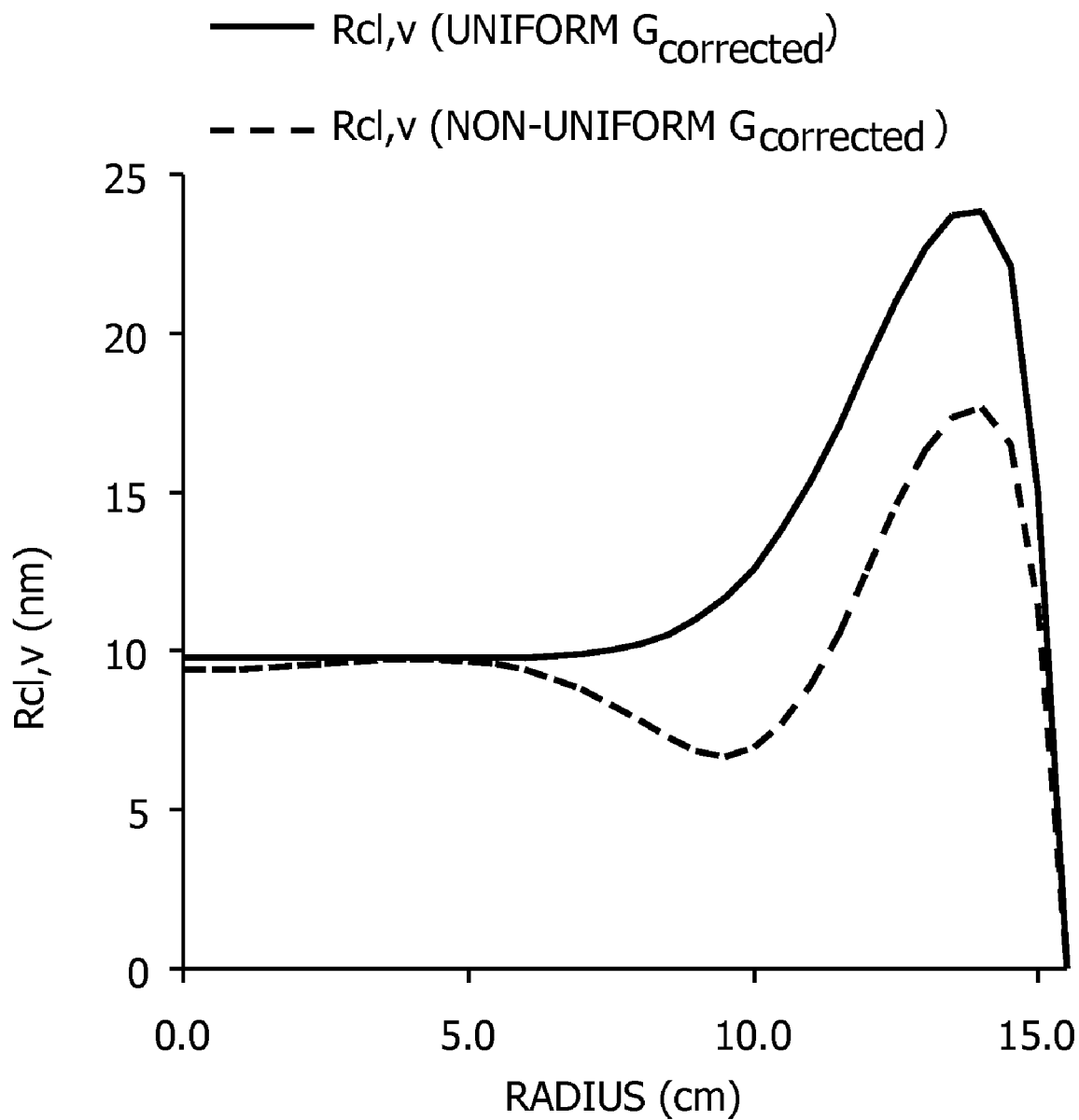
FIG. 23 is a graph showing the effect of manipulating the radial profile of $G_{corrected}$ on the edge ring intensity.

Referring now to FIG. 22, the growth of two different crystals was simulated, one under a uniform $G_{corrected}$ condition and the other under a manipulated, non-uniform $G_{corrected}$ condition. The pull rates were adjusted such that mature v-cluster sizes in both the crystals were comparable near their centers. As illustrated in FIG. 23, for the crystal grown with the radially increasing $G_{corrected}$, the edge ring intensity is reduced because the relatively higher $G_{corrected}$ near the edge reduces the effect of the lateral incorporation (the relatively higher $G_{corrected}$ near the edge resulting in an increase in the axial incorporation of interstitial point defects, thus acting to offset or compensate for the lateral incorporation of vacancy point defects).

Figure 24:
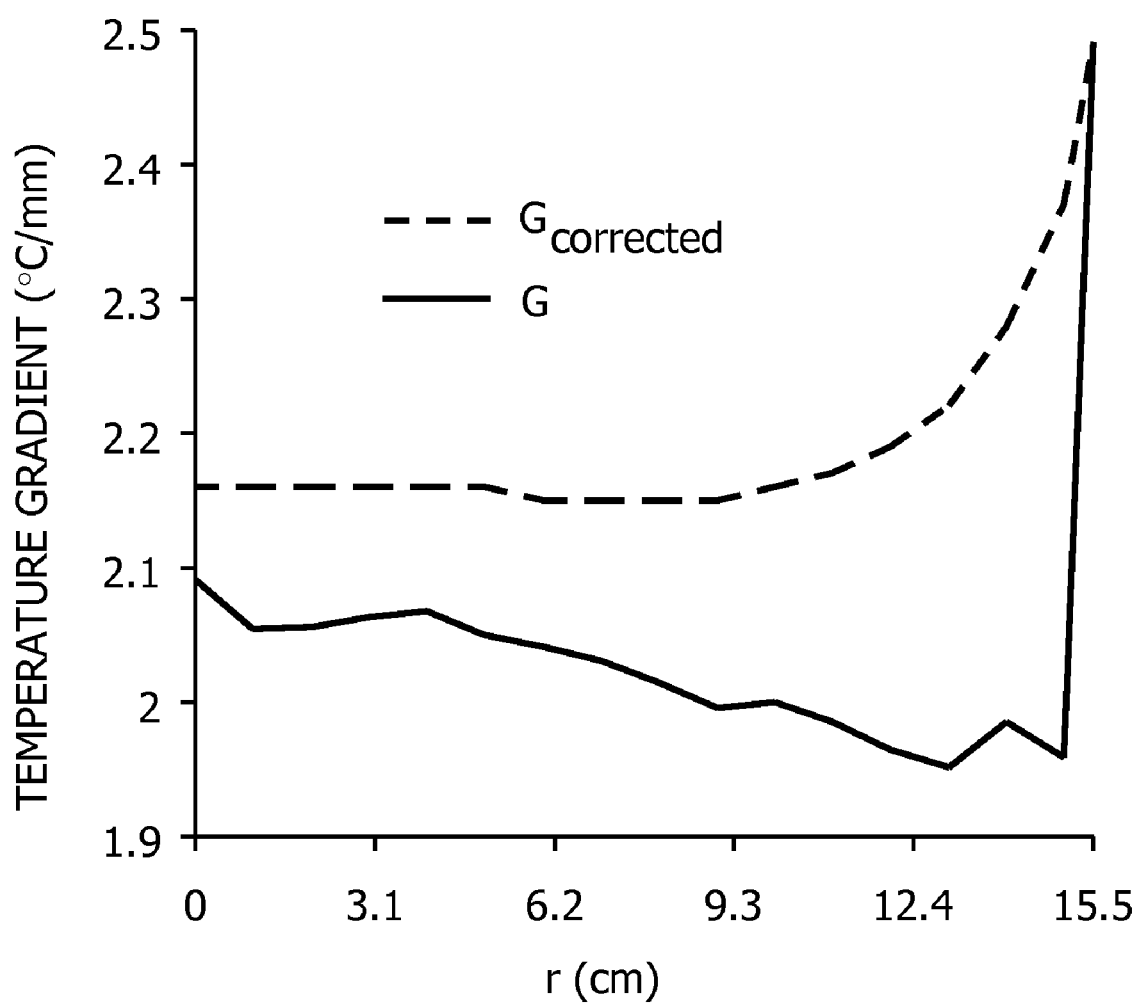
FIG. 24 is a graph showing the radial profiles of $G_{corrected}$ and $G_0$ in the crystal with the defect distribution shown in FIG. 23.

As previously noted, it is to be noted that the actual G calculated at the interface does not indicate the quality of the incorporation as accurately as $G_{corrected}$, as shown in FIG. 24. Therefore, $G_{corrected}$ is manipulated to reduce the lateral incorporation effects detailed herein. The manipulation of G is discussed in greater detail herein below.

a. Manipulation of G and/or the Melt/Solid Interface

The manipulation of $G_{corrected}$ involves the manipulation of the temperature field in the vicinity of the melt/solid interface. This can be achieved in various ways known in the art, some of which are further detailed herein below. In general, as the temperature field in the crystal can be assumed to be at quasi-steady state during growth, the temperature field in the vicinity of the melt/solid interface is fixed for a given surface temperature field under most conditions. From a practical standpoint, the ingot temperature field can be viewed as a function of the lateral surface temperature field and the interface shape. Accordingly, a hot-zone can be designed such that the desired temperature field and the radial profile of $G_{corrected}$ are achieved in the ingot being growing in it. Moreover, some tuning techniques may be used to cause or allow a change in the interface shape, without significantly affecting the temperature field on the lateral surface of the crystal. Thus, in addition to the hot-zone design, the interface shape can be manipulated to achieve the desired $G_{corrected}$ profile, as further detailed herein below.

In general, control of the average axial temperature gradient, G, may be achieved primarily through the design of the "hot zone" of the crystal puller (i.e., the graphite or other materials that makes up the heater, insulation, heat and/or radiation shields, among other things). Although the design particulars may vary depending upon the make and model of the crystal puller, in general, G may be controlled using any of the means currently known in the art for controlling heat transfer at the melt/solid interface, including the use of such apparatus as reflectors, insulation rings, radiation shields, purge tubes, light pipes, and heaters. However, G can be controlled further by adjusting the position of the apparatus relative to the melt (typically expressed as a distance, $H_r$) and/or crystal (prior to and/or during crystal growth). For example, G may be controlled (e.g., radial variations therein may be minimized) by positioning such an apparatus within about one crystal diameter above the melt/solid interface. That is, the distance, $H_r$, may be controlled such that it is less than about 1 crystal diameter over a desired length of the constant diameter portion of the ingot (e.g., at least about 10%, about 25%, about 50%, about 75%, about 85%, about 95% or more of the axial length of the constant diameter portion of the ingot), and in some instances may be less than about 75%, 50%, 40%, 30%, 20%, or even about 10% of the diameter of the ingot, depending upon the given axial position (the distance generally being greater nearer the seed-end and decreasing toward the tail-end).

In general, controlling the distance, $H_r$, between the heat transfer control device and the melt surface may be accomplished either by adjusting the position of the apparatus in the hot zone (relative to the surface of the melt, for example) or by adjusting the position of the melt surface in the hot zone (relative to the device used for controlling heat transfer, for example). More specifically, control of the distance, $H_r$, between the heat transfer control device and the melt surface can be achieved by means known in the art, including for example the use of: (i) a vision system and a method for measuring the melt level/position inside the crystal pulling apparatus during ingot growth relative to, for example, a reflector positioned above the melt (see, e.g., R. Fuerhoff et al. in U.S. Pat. No. 6,171,391, which is incorporated herein by reference); (ii) a lift or drive mechanism for raising/lowering the heat transfer control device (see, e.g., U.S. Pat. No. 5,853,480, which is incorporated herein by reference); and/or (iii) a lift or drive mechanism for raising/lowering the crucible which contains the melt in those instances wherein, for example, the reflector is in a fixed position above the melt surface.

In addition to adjusting or controlling the distance between the melt surface and a device positioned above the melt for controlling heat transfer, G may alternatively or additionally be controlled by means of adjusting the power supplied to side and/or bottom heaters within the crystal puller (i.e., a heater positioned within the hot zone of the crystal puller below the crucible, around the crucible, and/or above the crucible). More specifically, G may alternatively or additionally, be controlled by adjusting the power supplied to a heater positioned below, around, or above the crucible in the hot zone of the crystal puller, by means common in the art.

In this regard it is to be noted that, generally speaking, as the growth process proceeds, the silicon melt is depleted. As a result, the crucible is typically raised in order to maintain the surface of the melt level at a substantially constant position. However, this may result in a decrease in G, because the higher crucible position acts to block radiation view paths of the crystal to colder hot zone parts and surfaces within the crystal puller, and increase the effective conduction path of heat in the crystal. In order to compensate for this decrease in G and maintain G (and thus v/G) within a desired range of values, power supplied to a bottom heater, for example, can be increased while heat radiated from a side heater is decreased (G effectively being increased by decreasing the radiation from the side heater).

It is to be further noted that the precise values for the power supplied to the bottom heater, as well as the side heater and/or upper heater, during growth of the single crystal silicon ingot will vary depending upon, among other things, the design of the hot zone and the size of the polysilicon charge. However, these values may be determined using means known in the art.

It is to be still further noted that controlling or manipulating G may be additionally or alternatively be achieved by means of controlling crucible rotation. More specifically, as set forth in U.S. Patent Application Publication No. 2004/011833 (published Jun. 24, 2004 and entitled "Process for Preparing Single Crystal Silicon Using Crucible Rotation To Control Temperature Gradient," the entire contents of which is incorporated herein by reference), crucible rotation may be used to control the average axial temperature gradient in the crystal, G, as a function of radius (i.e., G(r)), particularly at or near the central axis. Additionally, crucible rotation modulation may be utilized to obtain an axially uniform oxygen content therein.

It is to be still further noted that controlling or manipulating G, and/or the melt/solid interface shape, may be achieved by means of the method disclosed in U.S. Patent Application Publication No. 2004-0112277 (entitled "Crystal Puller and Method for Growing a Monocrystalline Ingot"), the entire contents of which is incorporated herein by reference. In particular, this application discloses a method of growing a single crystal silicon ingot which comprises: (i) forming a melt of semiconductor source material in a crucible, the melt having a surface; (ii) positioning a heat source to face the exposed upper surface portion of the melt, the heat source having an area for radiating heat to the melt sized at least 30% of the area of the exposed upper surface portion of the melt; (iii) pulling semiconductor source material from the surface of the melt such that the source material solidifies into a single crystal silicon ingot; and, (iv) selectively controlling heat transfer at the surface of the melt using the heat source.

It is to be still further noted that controlling or manipulating G, and/or the melt/solid interface shape, may be achieved by means of the method disclosed in U.S. patent application Ser. No. 11/027,360 (filed Dec. 30, 2004 and entitled "Electromagnetic Pumping of Liquid Silicon in a Crystal Growing Process"), the entire contents of which is incorporated herein by reference. In particular, this application discloses a method of controlling crystal growth in a crystal growing apparatus, said crystal growing apparatus having a heated crucible containing a semiconductor melt from which a single crystal silicon ingot is grown according to a Czochralski process. The ingot is grown on a seed crystal pulled from the melt, wherein method comprises: (i) applying a magnetic field to the melt, said magnetic field affecting convection in the melt; (ii) sensing a growth parameter of the ingot being pulled from the melt; (iii) comparing the sensed growth parameter to a target growth parameter to determine a power adjustment parameter; and (iv) varying the magnetic field while the ingot is being pulled from the melt as a function of the determined power adjustment parameter to produce a pumping force in the melt to change a velocity of convective flow in the melt. This application additionally discloses a method of controlling crystal growth in a crystal growing apparatus, the apparatus having a heated crucible containing a semiconductor melt from which a monocrystalline ingot is grown according to a Czochralski process, the apparatus also having first and second coils energized to generate a magnetic field applied to the melt, the ingot being grown on a seed crystal pulled from the melt. The method comprises: (i) storing a current profile, said current profile defining currents for energizing the first and second coils as a function of a length of the ingot; (ii) energizing the first and second coils with first and second currents, respectively, defined by the current profile to produce a magnetic field applied to the melt; and (iii) varying the first and second currents according to the stored current profile, said varying the first and second currents causing the magnetic field applied to the melt to produce a pumping force in the melt, said pumping force changing a velocity of convective flow in the melt.

It is to be still further noted that in any or all of the methods set forth herein, control of G may be used in one or more embodiments of the present invention during a batch Czochralski process (wherein melt volume is depleted during the process) to render G substantially constant (e.g., G varies radially at a given axial position in the segment of interest, from about the central axis toward the lateral surface, by less than about 5%, about 4%, about 3%, about 2% or even 1%) over a substantial portion of the radius and/or axial length of the constant diameter portion of the ingot (e.g., 25%, 50%, 75%, 85%, 95% or more of the radial width and/or axial length of the constant diameter portion of the ingot), which in turn optionally enables the growth velocity (generally controlled by means of the pull rate) to be substantially constant, as well (for a given target or range of v/G values). Additionally or alternatively, G may, in these or other embodiments, vary radially (either intentionally or otherwise, as further detailed elsewhere herein) at a given axial position in the segment of interest, G for example increasing radially from about 0.75 R, 0.8 R, 0.85 R, 0.9 R, 0.95 R or more (wherein R is the radius of the segment of interest) to about the lateral surface by at least about 5%, about 7.5%, about 10%, about 12.5%, about 15% or even 20%.

b. $G_{effective}$ and Melt/Solid Interface Shape

With respect to the melt/solid interface shape, it is to be noted that, under essentially any condition, if the curvature of the interface is significant, the critical value of $v/G_{corrected}$ may shift from its one-dimensional value. Given that the radial control of $V/G_{corrected}$ is of importance in achieving the desired radial uniformity in the defect distribution, this shift is preferably incorporated into determining the actual operating pull-rate and the radial profile of a corrected G. One way of incorporating this effect is by defining another correction to $G_{corrected}$; this "corrected $G_{corrected}$" is termed herein $G_{effective}$.

Figure 25:
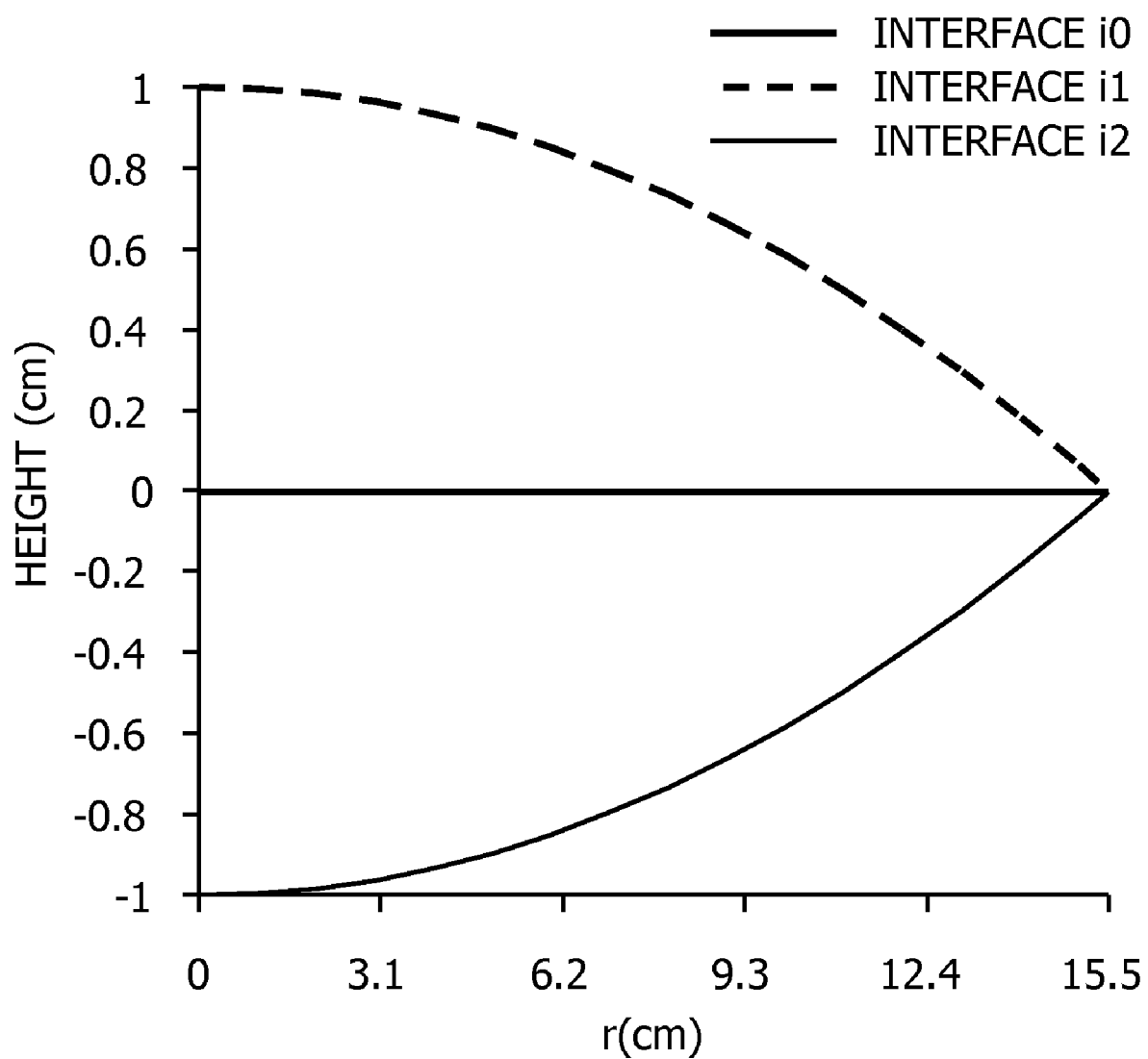
FIG. 25 is a graph showing the interfaces i0 (flat), i1 (concave), and i2 (convex) used in the study of the v/$G_{corrected}$ shift depending on the interface curvature.
Figure 26:
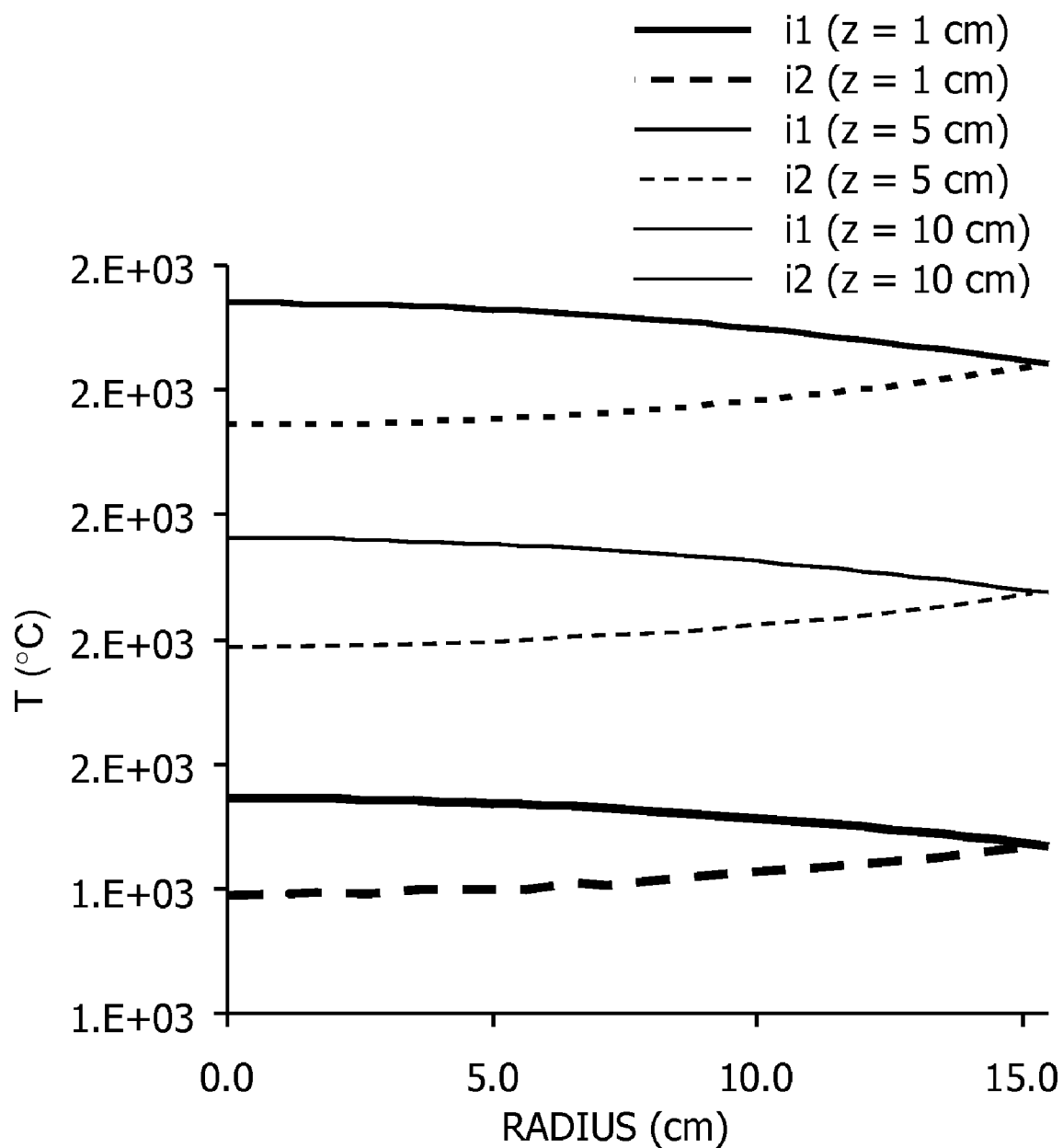
FIG. 26 is a graph showing the temperature field in a crystal growing with a concave (i1) interface and the temperature field in a crystal growing with a convex (i1) interface.
Figure 27:
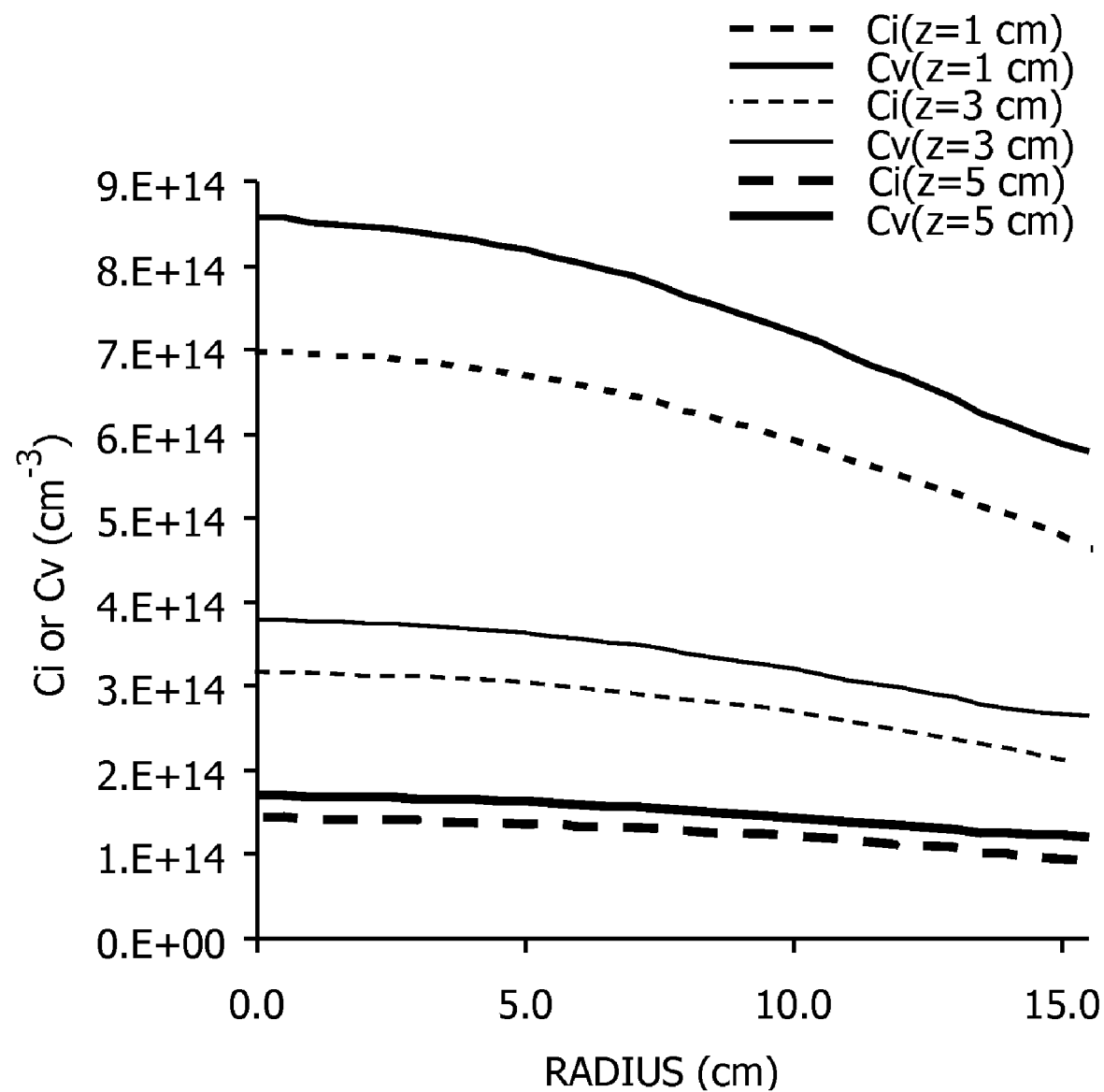
FIG. 27 is a graph showing the point defect concentration field (concentration of vacancies, v, and interstitials, i) near the interface in a crystal with a concave (i1) interface.
Figure 28:
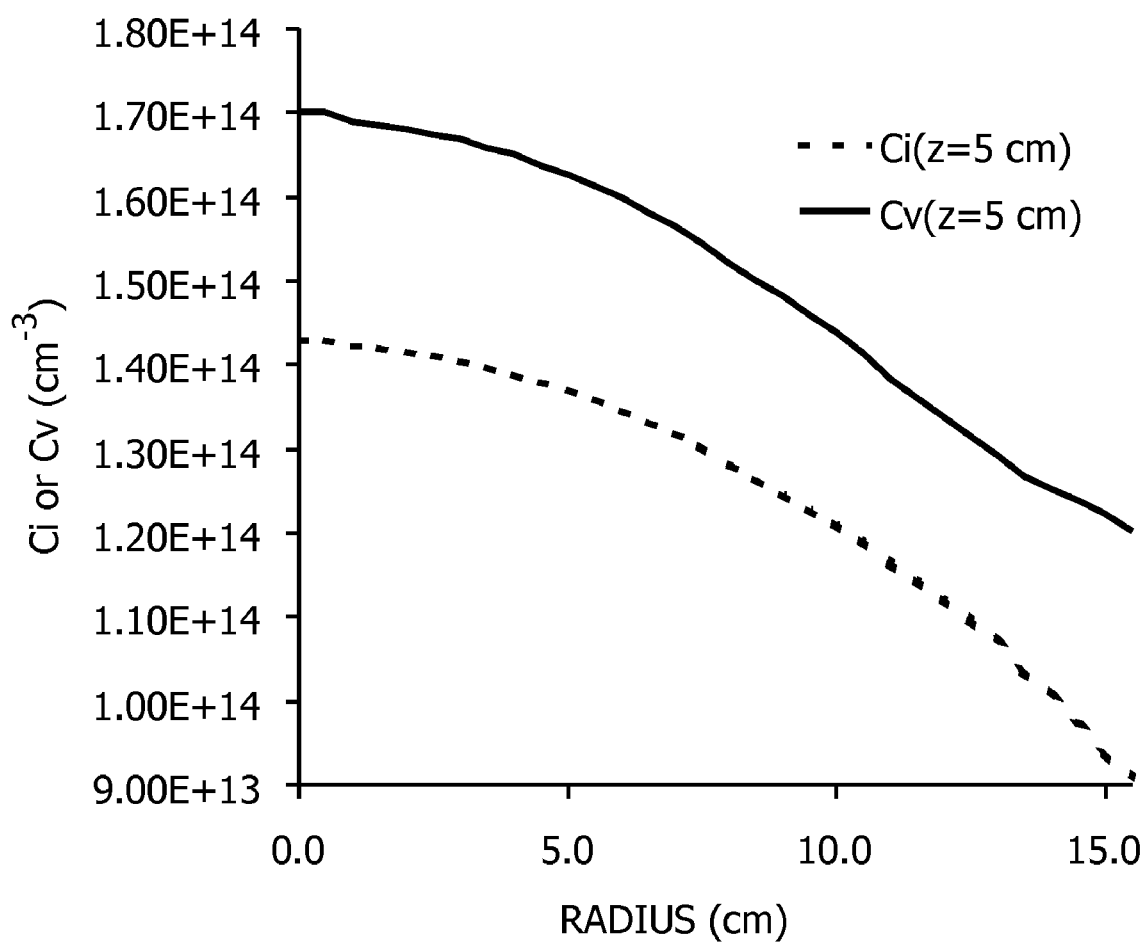
FIG. 28 is a graph showing the radial point defect concentration profiles 5 cm away from a concave (i1) interface.
Figure 29:
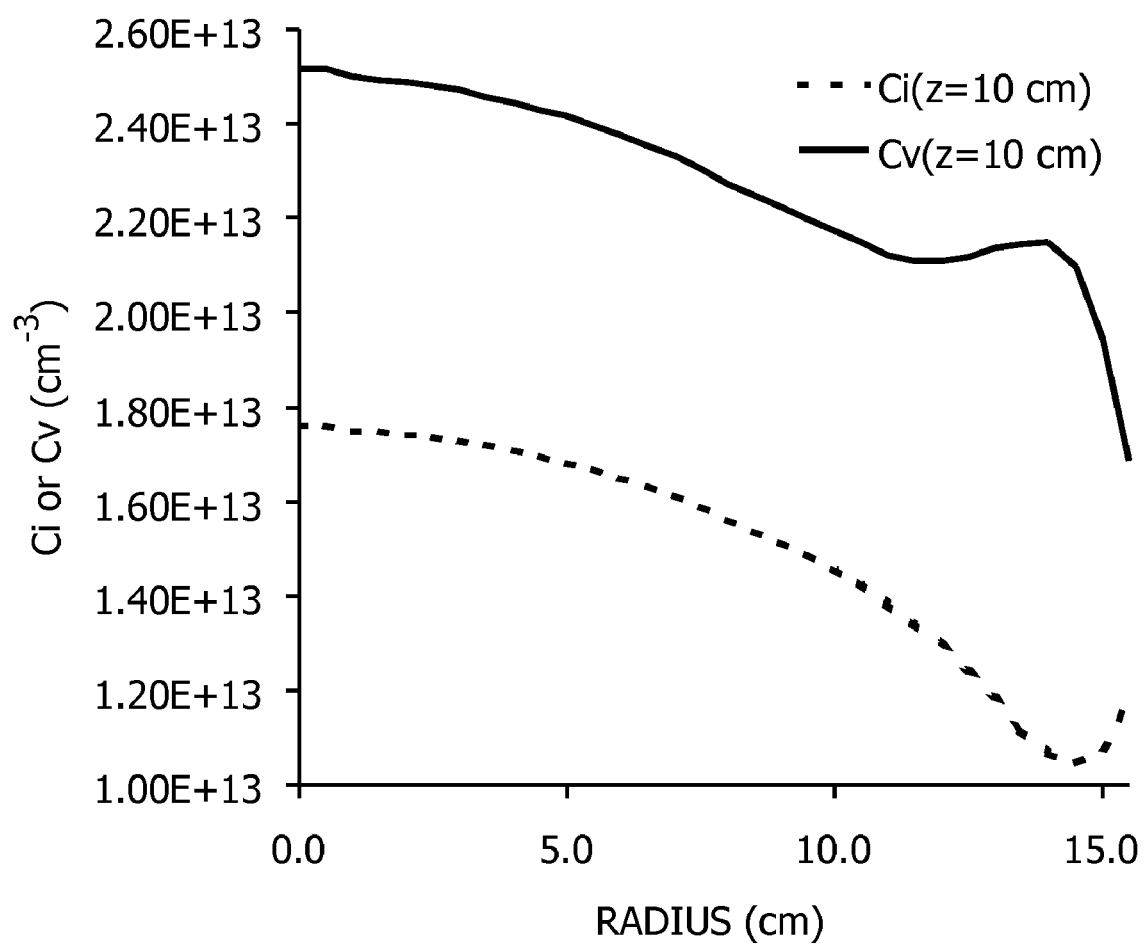
FIG. 29 is a graph showing the radial point defect concentration profiles (concentration of vacancies, v, and interstitials, i) 10 cm away from a concave (i1) interface.
Figure 30:
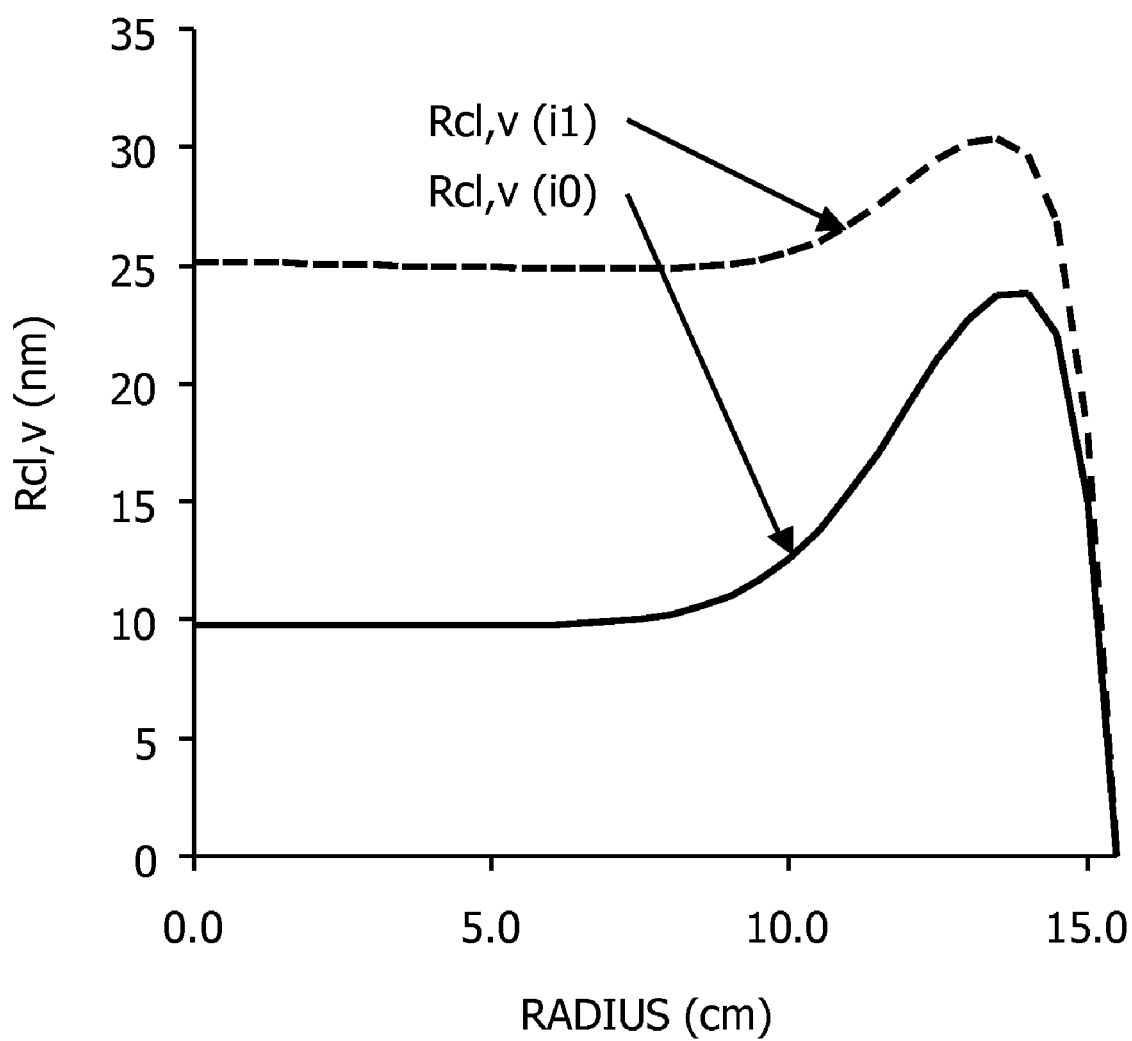
FIG. 30 is a graph showing the radial mature vacancy cluster density profiles in a crystal with a flat interface (i0) and in a crystal with a concave (i1) interface.
Figure 31:
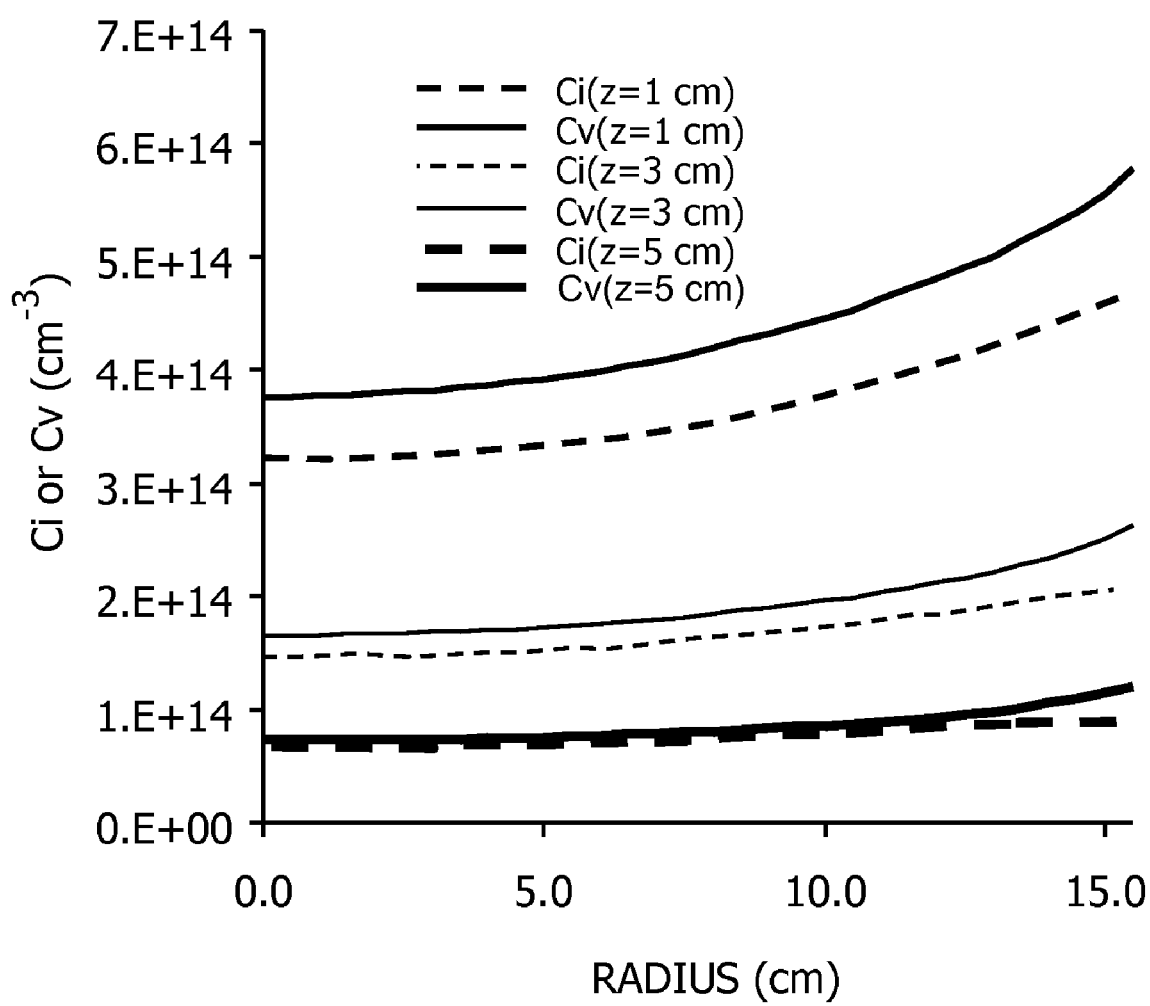
FIG. 31 is a graph showing the point defect concentration field near the interface in a crystal with a convex (i2) interface.
Figure 32:
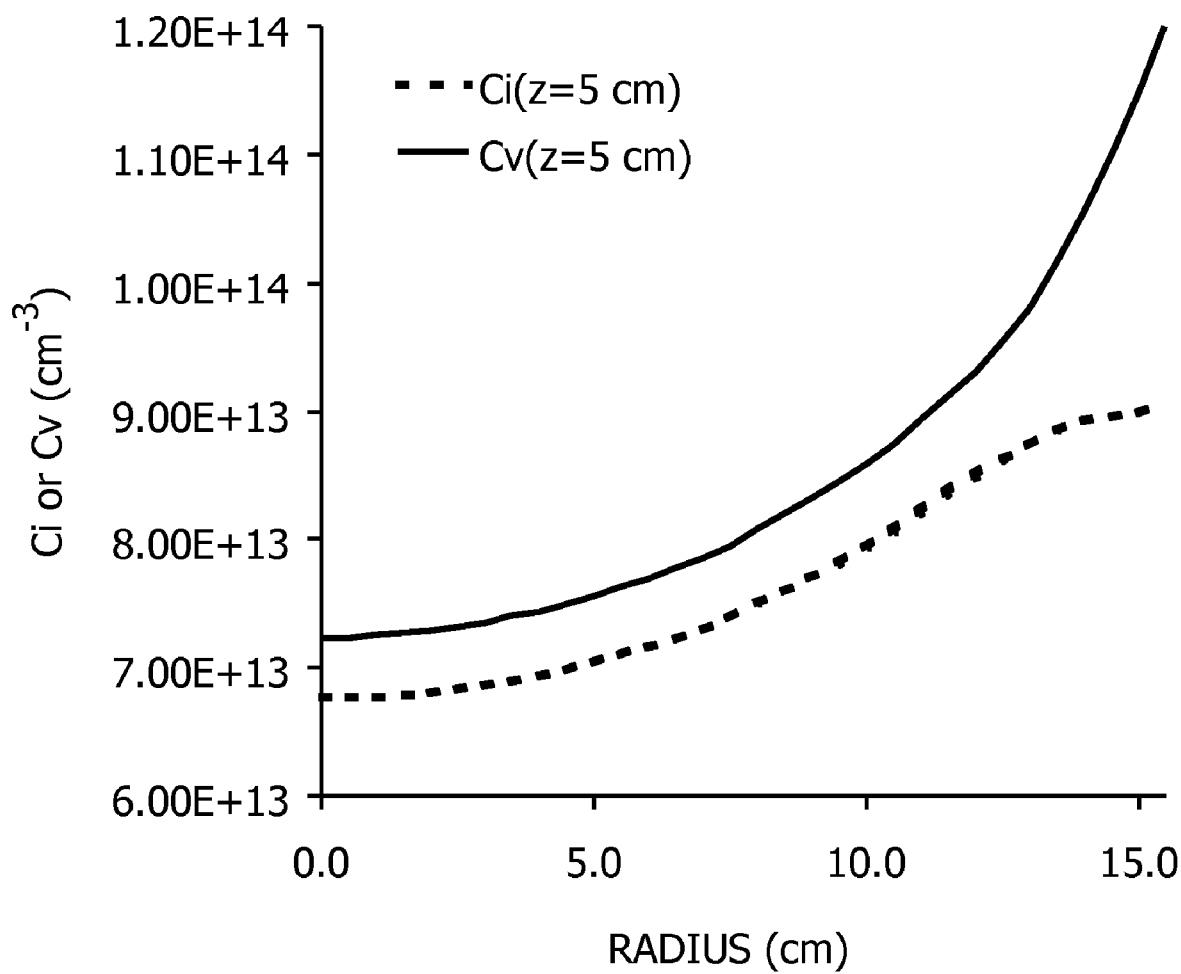
FIG. 32 is a graph showing the radial point defect concentration profiles 5 cm away from a convex (i2) interface.
Figure 33:
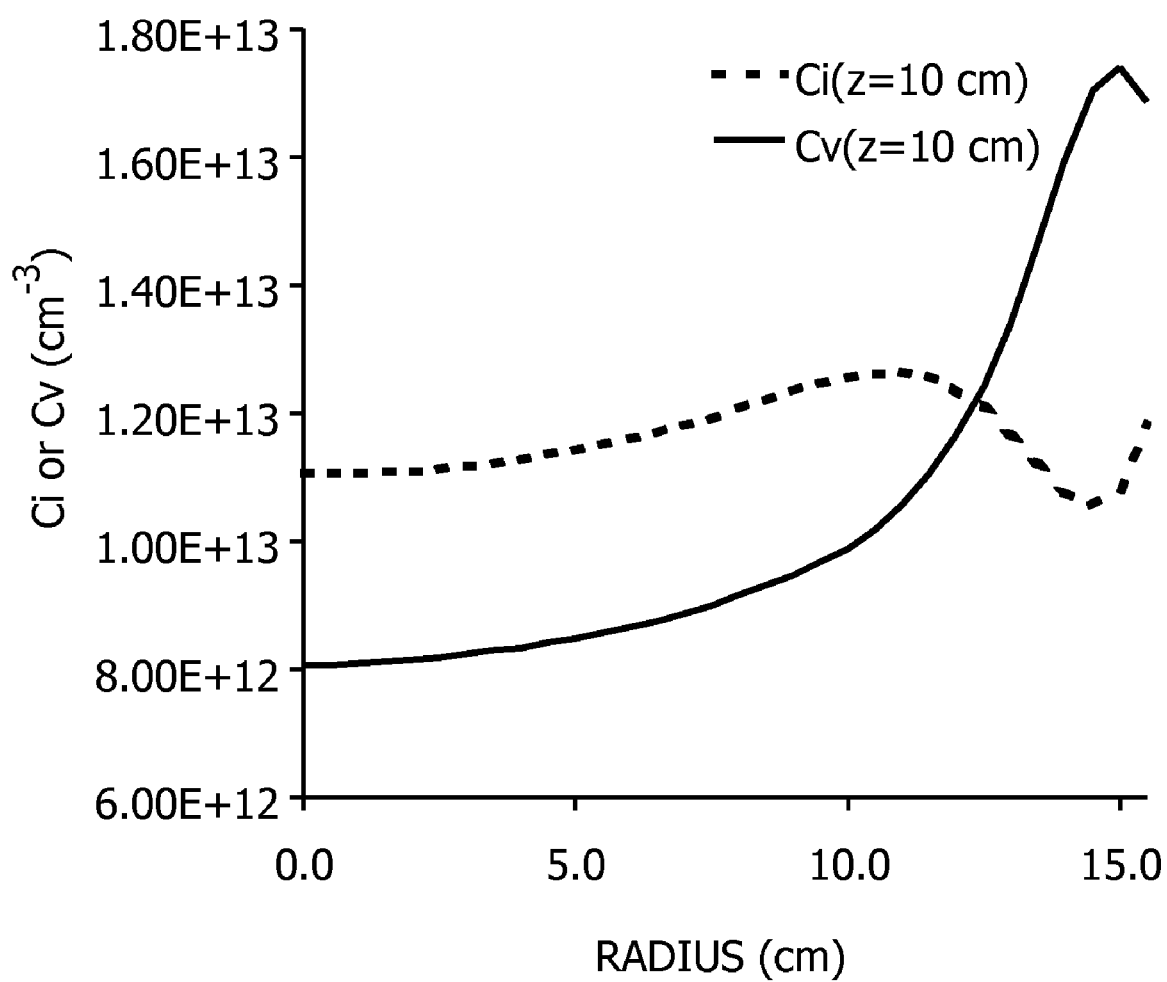
FIG. 33 is a graph showing the radial point defect concentration profiles 10 cm away from a convex interface (i2).
Figure 34:
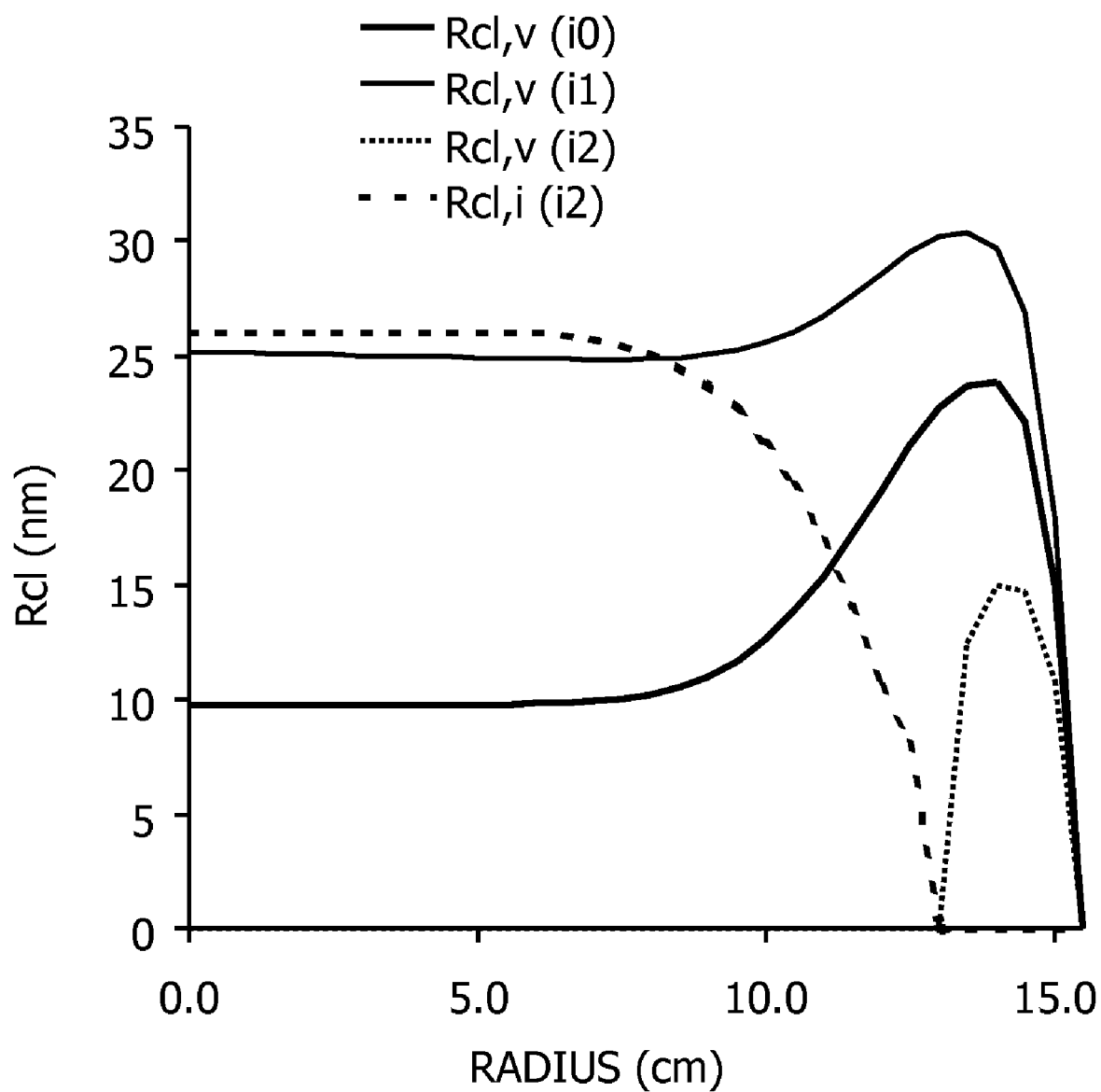
FIG. 34 is a graph showing the radial mature vacancy cluster density profiles in the crystal with a flat interface (i0), in a crystal with a concave (i1) interface, and in a crystal with a convex interface (i2).

The shift in the critical value of $v/G_{corrected}$ with the shape of the interface can be studied by simulating the defect dynamics in a CZ crystal growing through a radially uniform temperature field, which satisfies equation (1) above at essentially all radial positions. Under these conditions, G(r) is equal to $G_{corrected}$ (r). Referring now to FIG. 25, two typical interface shapes, concave (or i1) and convex (or i2) were studied. The temperature field is the primary driver that establishes the point defect concentration field in the vicinity of the melt/solid interface by providing the driving forces for both the recombination and the point defect diffusion. FIG. 26 shows how the temperature field varies with interface shapes i1 and i2 under the imposed uniform $G_{corrected}$ conditions.

The shift in the critical value of $v/G_{corrected}$ can be explained in various ways. For example, the explanation may be provided by analyzing the interplay between the point defect diffusion and the Frenkel reaction by resolving the diffusion fluxes of the point defects in their radial and axial components in the coordinate system fixed at the center of the interface. In the case of interface i1, the temperature decreases from the center of the crystal to the edge (i.e., in the r direction). This allows a decrease in the equilibrium concentrations of the point defects in the r direction. The fast recombination of the point defects provides a weak concentration driving force for the diffusion of vacancies and interstitials in the r direction in addition to the overwhelmingly strong diffusion driving force that already exists in the axial direction.

Vacancies and interstitials exist at their equilibrium concentrations at the melt/crystal interface. Accordingly, the vacancy concentration in the immediate vicinity of the interface is higher than the interstitial concentration. Since both the surface area across which the radial diffusion takes place and the volume of the crystal decrease from edge to center, i.e. in the −r direction, the radial replenishment of interstitials is weaker when attempting to compensate for their loss from recombination by radially decreasing the temperature. The compensation by the interface does not effectively take place because of its increasing distance from the colder regions with increasing r. The interplay between this diffusion and the Frenkel reaction creates vacancy rich conditions. Thus, there is a negative shift in the critical value of $v/G_{corrected}$. FIGS. 27 to 30 illustrate these dynamics for interface i1. In contrast to the conditions illustrated for i1, the temperature increases in the r direction in the case of interface i2. This sets the concentration driving forces for the point defect diffusion in the −r direction (from the edge of the crystal toward the center). Since both the surface area over which the radial diffusion takes place and the volume of the crystal decrease from the edge toward the center, i.e. the −r direction, the radial replenishment of interstitials is quite effective when attempting compensate for their loss from recombination by radially increasing the temperature. This diffusion is further aided by the axial flux of interstitials from the interface, because of its increasing vicinity to the hotter regions with increasing r. This transport, along with the Frenkel reaction, creates interstitial rich conditions. Accordingly, there is a positive shift in the critical value of $v/G_{corrected}$. FIGS. 31 to 34 illustrate these dynamics for i2.

The shift in the critical $v/G_{corrected}$ can be estimated either by experimental crystal growth or by simulated crystal growth; alternatively, a combination of both techniques can be used. First, various crystals with various interface shapes are grown with a varying pull-rate, which allows the formation of both vacancy-type and interstitial-type agglomerated defects, separated by the V/I boundary. $G_{corrected}$ and the pull-rate at the V/I boundary provide the critical value of $v/G_{corrected}$ under the varying pull-rate conditions. The steady state $v/G_{corrected}$ can be predicted either by simulation or by using the formulation provided by, for example, Kulkarni et al. (2004) (31), below:

$$\left[\frac{V}{G_{corrected}}\right]_{x,-slope} = \left[\frac{V}{G_{corrected}}\right]_x - 7.85 \text{ (mm}^2\text{/K)} \times \left[\frac{dV}{dL}\right] \text{ (min}^{-1}) \quad (3)$$

$$\left[\frac{V}{G_{corrected}}\right]_{x,+slope} = \left[\frac{V}{G_{corrected}}\right]_x - 13.745 \text{ (mm}^2\text{/K)} \times \left[\frac{dV}{dL}\right] \text{ (min}^{-1}) \quad (4)$$

wherein: the subscript x denotes any point along the melt/solid interface; −slope denotes the decreasing pull-rate; +slope denotes the increasing pull-rate, and L is the total length of the growing solidified ingot at a given point during the growth process. For a fixed interface shape, equation (3) is used for a continuously decreasing pull-rate, while equation (4) is used for a continuously increasing pull-rate. Prediction of the critical value of $v/G_{corrected}$ for various interface shapes allows the estimation of its shift as a function of the interface shape. For example, for a monotonically varying parabolic interface, for industrial application, this shift is quantified by the following equation:

$$\left[\frac{V}{G_{corrected}}\right]_{x,iface} = \left[\frac{V}{G_{corrected}}\right]_{x,flat} - 0.0775 \text{ (mm}^2\text{/K} \cdot \text{min)} \left(\frac{a}{R}\right) \quad (5)$$

wherein: a is the distance of the deviation of the interface at the center of the crystal as shown in FIG. 25 from a theoretically flat interface, and R is the radius of the crystal. The subscript "iface" denotes the critical conditions influenced by the shape of the interface, and "flat" indicates an interface that is essentially flat. In this regard it is to be noted that, once fitted, the expression $$\left[\frac{V}{G_{corrected}}\right]_{x,iface}$$

is treated as a constant for a given a and R, and $$\left[\frac{V}{G_{corrected}}\right]_{x,flat}$$

is treated as a constant.

Figure 35:
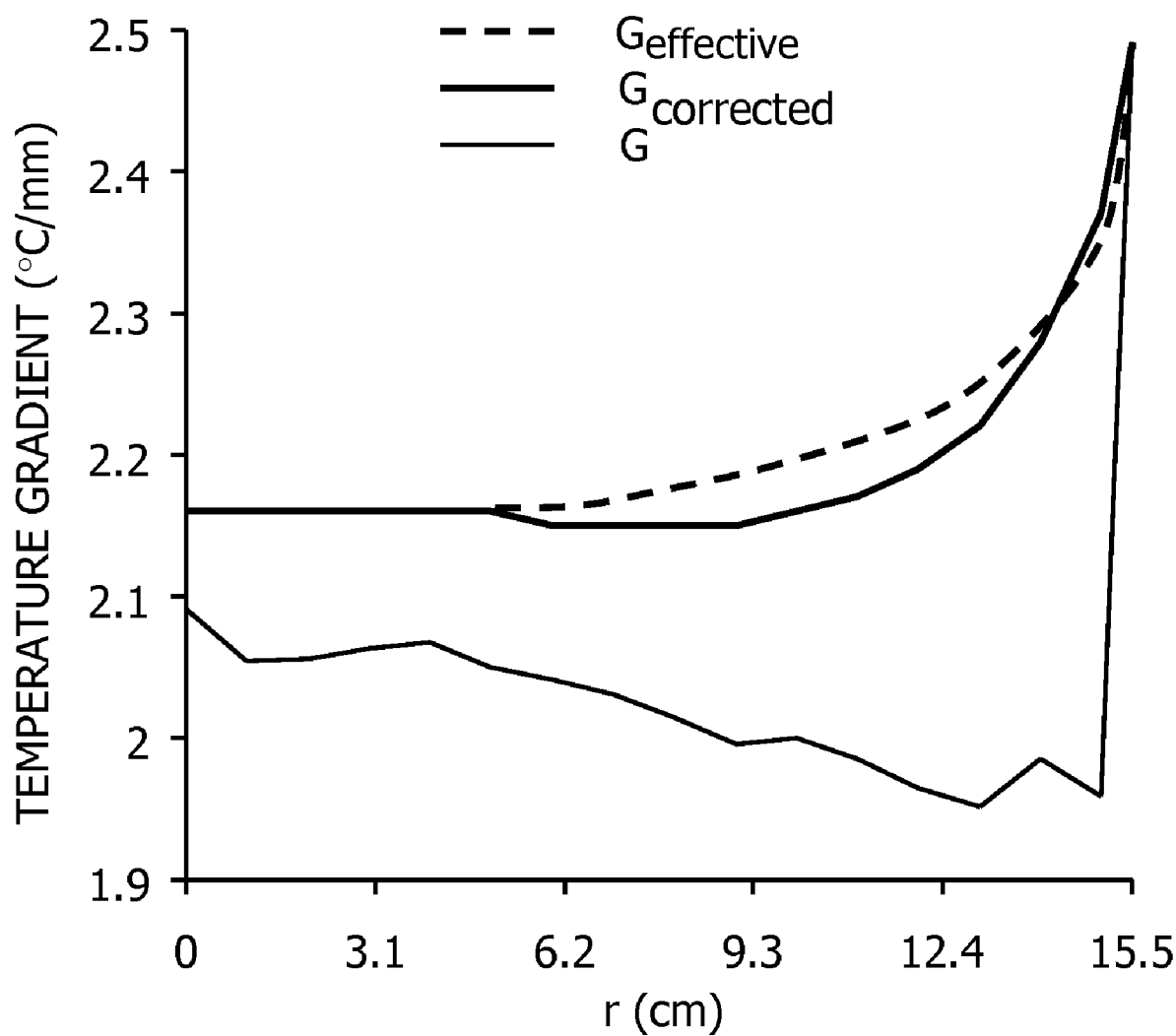
FIG. 35 is a graph showing the radial profiles of $G_{corrected}$, qualitative $G_{effective}$, and $G_0$ in a crystal with the defect distribution shown in FIG. 23.

It is often convenient to incorporate the effect of the shift in critical $V/G_{corrected}$ with the interface shape as a change in $G_{corrected}$. The "corrected" $G_{corrected}$ can now be termed $G_{effective}$, and is simply given as:

$$G_{effective} = \left[\frac{G_{corrected}}{V}\right]_{x,flat} \times V_{x,iface} \quad (6)$$

wherein the variables noted therein as are set forth above. $V_{x,flat}$ indicates the pull-rate at the V/I boundary for a crystal with an essentially non-flat interface shape. A qualitative estimation of $G_{effective}$ for the defect distribution shown in FIG. 23 is provided in FIG. 35. The radial profile of $G_{effective}$ is a more accurate measure of the point defect incorporation. Thus, the radial profile of $G_{effective}$ may be manipulated to control the intensity of the edge ring, in addition to controlling the uniformity of the axial incorporation in a growing CZ crystal.

c. Alternative Processes

In view of the foregoing, it is to be noted that, in an alternative embodiment, the present invention is directed to a process for growing a single crystal silicon ingot wherein a growth velocity, v, and a corrected average axial temperature gradient, $G_{corrected}$, during the growth of at least a segment of the constant diameter portion of the ingot over the temperature range from solidification to a temperature of about 1200° C., wherein $G_{corrected}$ is as defined by the equation:

$1/T_{corrected} = (1/T_m) + (1/T^2_m)zG_{corrected}$, such that
$\Sigma f(T - T_{corrected}) = 0$ as detailed herein above, such that the ratio of $v/G_{corrected}$ varies radially by less than about ±30%, relative to the critical value of $v/G_{corrected}$, and cooling said segment from the solidification temperature to about 750° C. Notably, the segment comprises an axially symmetric region which is substantially free of agglomerated intrinsic point defects and which has (i) a radial width, as measured from the central axis radially toward the lateral surface, of at least about 0.75 R, and (ii) a length, as measured along the central axis, of at least about 10% of the length of the constant diameter portion of the ingot.

In yet another alternative embodiment, the present invention is directed to a process for growing a single crystal silicon ingot wherein a growth velocity, v, and an effective average axial temperature gradient, $G_{effective}$, during the growth of at least a segment of the constant diameter portion of the ingot over the temperature range from solidification to a temperature of about 1200° C., wherein $G_{effective}$ is defined by the following equation:

$$G_{effective} = \left[\frac{G_{corrected}}{V}\right]_{x,flat} \times V_{x,iface}$$

and $G_{corrected}$ is defined by the following equation:

$1/T_{corrected} = (1/T_m) + (1/T^2_m)zG_{corrected}$, such that
$\Sigma f(T - T_{corrected}) = 0$, as detailed herein above, such that the ratio of $v/G_{effective}$ varies radially by less than about ±30% relative to the critical value of $v/G_{effective}$, and cooling said segment from the solidification temperature to about 750° C. Notably, the segment comprises an axially symmetric region which is substantially free of agglomerated intrinsic point defects and which has (i) a radial width, as measured from the central axis radially toward the lateral surface, of at least about 0.75 R, and (ii) a length, as measured along the central axis, of at least about 10% of the length of the constant diameter portion of the ingot.

D. Additional Features/Limitations

1. Nucleation Temperature Determination

It is to be noted that the temperature at which nucleation of agglomerated defects occurs under slow-cool conditions is dependant upon the concentration and type of predominant intrinsic point defects (vacancy or silicon self-interstitial). In general, the nucleation temperature increases with increasing concentration of intrinsic point defects. In addition, the range of nucleation temperatures for agglomerated vacancy-type defects is somewhat greater than the range of nucleation temperatures for agglomerated interstitial-type defects. Accordingly, for some embodiments of the present process, given the range of silicon self-interstitial or vacancy concentrations typically produced in Czochralski-grown single crystal silicon: (i) the nucleation temperature for agglomerated vacancy defects is generally between about 1,000° C. and about 1,250° C.; whereas, (ii) the nucleation temperature for agglomerated interstitial defects is generally between about 750° C. and about 1000° C.

The temperature at which nucleation of the predominant intrinsic point defects occurs can be experimentally determined for a given crystal puller and process as follows. It is believed that silicon self-interstitials in a defined region of the ingot remain as point defects and do not nucleate to form agglomerated defects until that region passes through the section of the hot zone where the silicon reaches the temperature of nucleation; that is, under typical Czochralski growth conditions, the region is originally formed at the melt/solid interface and has a temperature of approximately the melt temperature of silicon. As the region is pulled away from the melt during the growth of the remainder of the ingot, the temperature of the region cools as it is pulled through the hot zone of the crystal puller. The hot zone of a particular crystal puller typically has a characteristic temperature profile, generally decreasing with increasing distances from the melt solid interface, such that at any given point in time, the region will be at a temperature approximately equal to the temperature of the section of the hot zone occupied by the region. Accordingly, the rate at which the region is pulled through the hot zone affects the rate at which the region cools. Accordingly, an abrupt change in the pull rate will cause an abrupt change in the cooling rate throughout the ingot. Significantly, the rate at which a particular region of the ingot passes through the temperature of nucleation affects both the size and density of agglomerated defects formed in the region. Thus, the region of the ingot which is passing through the nucleation temperature at the time the abrupt change is made will exhibit an abrupt variation in the size and density of agglomerated intrinsic point defects, hereinafter referred to as a nucleation front. Because the nucleation front is formed at the time the pull rate is varied, the precise location of the nucleation front along the axis of the ingot can be compared to the position of the ingot and, correspondingly, the nucleation front within the hot zone at the time the abrupt change in pull rate was made and compared with the temperature profile of the hot zone to determine the temperature at which the nucleation of agglomerated intrinsic point defects occurs for the type and concentration of intrinsic point defects in the location of the nucleation front.

Thus, persons skilled in the art can grow a silicon ingot by the Czochralski method under process conditions designed to produce an ingot which is either vacancy rich or silicon self-interstitial rich and, by (i) making abrupt changes in the pull rate, (ii) noting the position of the ingot with respect to the temperature profile in the hot zone at the point in time in which the pull rate is changed, and (iii) observing the axial location of the nucleation front, an approximation can be made as to the temperature of nucleation for the concentration of intrinsic point defects present along the nucleation front. Additionally, since the temperature and intrinsic point defect concentration varies radially along the nucleation front, the temperature and intrinsic point defect concentration can be determined at several points along the nucleation front, and the temperature of nucleation can be plotted against the intrinsic point defect concentration to determine the temperature of nucleation as a function of intrinsic point defect concentration. The temperature of the silicon along the nucleation front can be determined using any thermal simulation method known in the art which is capable of estimating the temperature at any location within a Czochralski reactor, such as for example, the thermal simulation described in Virzi, "Computer Modeling of Heat Transfer in Czochralski Silicon Crystal Growth," Journal of Crystal Growth, vol. 112, p. 699 (1991). The concentration of silicon self-interstitials may be estimated along the nucleation front using any point defect simulation method known in the art which is capable of estimating the concentration of intrinsic point defects at any point in the ingot, such as for example, the point defect simulation described in Sinno et al., "Point Defect Dynamics and the Oxidation-induced Stacking-Fault Ring in Czochralski-Grown Silicon Crystals," Journal of Electrochemical Society. vol. 145, p. 302 (1998). Finally, the temperature of nucleation versus intrinsic point defect concentration can be obtained for an expanded range of temperatures and concentration by growing additional ingots under varying growth parameters to produce ingots with increased or decreased initial concentrations of intrinsic point defects, and repeating the cooling experiment and analysis described above.

In one approach, the single crystal silicon is preferably cooled through the nucleation temperature as rapidly as possible without fracturing the single crystal ingot. The cooling rate through this temperature is, therefore, preferably at least 5° C./min., more preferably at least about 10° C./min., more preferably at least about 15° C./min., still more preferably at least about 20° C./min., still more preferably at least about 30° C./min., still more preferably at least about 40° C./min., and still more preferably at least about 50° C./min.

In general, the single crystal silicon may be cooled through the nucleation temperature for agglomerated intrinsic point defects by means of at least two alternative approaches. In the first approach, the entire ingot (or at least those portions which are desired to be free of agglomerated A-type interstitial defects, and optionally vacancy defects) are maintained at a temperature in excess of the nucleation temperature until the ingot tail is completed; the ingot is then detached from the melt, the heat input to the hot zone is shut down, and the single crystal silicon is moved from the hot zone of the Czochralski reactor to a chamber separate from the hot zone, such as a crystal receiving or other cooling chamber to quench cool the entire crystal (or at least those portions which are desired to be free of agglomerated A-defects, and optionally vacancy defects). The cooling chamber may be jacketed with a heat exchanging device designed to utilize a cooling medium, for example cooling water, to remove heat from the cooling chamber at a rate sufficient to cool the single crystal silicon ingot at the desired rate, without directly contacting the single crystal silicon to the cooling medium. Alternatively, or in addition to using cooling jacket, a pre-cooled gas such as, for example, helium may be used to continuously purge the crystal receiving or other cooling chamber to facilitate more rapid cooling. Methods for removing heat from a process vessel are well know in the art, such that persons skilled in the art could employ a variety of means for removing heat from the crystal receiving or other cooling chamber without requiring undue experimentation.

In this regard it is to be noted that, as the cooling rate of a given ingot segment increase, the number density of agglomerated defects therein increases, while the size of the agglomerated defects decreases. If the cooling rate for the ingot segment is sufficiently high, the formation of agglomerated defects may essentially be avoided. Accordingly, in a second approach, a portion, preferably a large portion, of an ingot is "quenched" during crystal growth. In this approach, the hot zone of the crystal puller is designed to (i) achieve a desired value (or range of values) for v/G across the entire radius of the growing crystal, (ii) provide adequate diffusion of intrinsic point defects at temperatures intermediate of the temperature of solidification and the nucleation temperature for agglomerated intrinsic point defects, and (iii) quench cool the ingot through the nucleation temperature for agglomerated intrinsic point defects of the type which predominate in the grown crystal by applying a steep axial temperature gradient over a range of temperatures containing the nucleation temperature.

Regardless of the approach, the ingot may optionally contain, in addition to the rapidly cooled segment, at least one other segment in which agglomeration reactions are avoided (in an axially symmetric region) simply by controlling the initial concentration of intrinsic point defects, and optionally allowing adequate time for diffusion prior to reaching the nucleation temperature therein (as described above).

As further described elsewhere herein, it is to be noted that, regardless of the manner employed for cooling to avoid the formation of agglomerated intrinsic point defects (in one or both axially symmetric regions), controlled cooling may additionally be needed to avoid the formation of nuclei which lead to the formation of oxidation induced stacking faults. More specifically, as noted above, the rate of cooling, as well as the temperature range over which controlled cooling is exercised in order to avoid the formation of agglomerated intrinsic point defects, is at least in part dependent upon the concentration of intrinsic point defects. In some instances, this concentration may be such that controlled cooling (either slow cooling, to allow for outdiffusion, or quench cooling to avoid nucleation) need only occur over a temperature range down to about 1000° C. In such instances, as further described herein, cooling will also be controlled to avoid the formation of nuclei that lead to the formation of oxidation induced stacking faults (typically over a temperature range of from less than about 1000° C. to at least about 750° C.). However, in those instances wherein quench cooling is employed to temperatures below the temperature at which oxidation induced stacking faults are nucleated, formation of such nuclei may be avoided at the same time; that is, depending upon the oxygen content and intrinsic point defect content of the silicon, the silicon may be quenched through a temperature range that is sufficient to avoid both nucleation of agglomerated intrinsic point defects and the nucleation (and thus the formation of) oxidation induced stacking fault nuclei.

2. A-type and/or B-Type Interstitial Defects

It is to be noted that, in one or more embodiments of the present invention, the cooled ingot segment of interest may contain B-defects, a type of defect which forms in interstitial dominated material. While the precise nature and mechanism for the formation of B-defects is not known, it has become generally accepted that B-defects are agglomerations of silicon self-interstitials which are not dislocation loops. B-defects are smaller than A-defects (an agglomerated interstitial defect) and are generally thought not to be dislocation loops, but rather to be three dimensional agglomerations which have either not grown large enough or not reached a sufficient activation energy to form dislocation loops. To-date, it is not yet clear that B-defects would negatively impact the performance of that device when present in an active electronic device region.

In any event, it has been discovered that B-defects can be readily dissolved by slicing the ingot into wafers and heat-treating the wafers, provided the B-defects have not previously been stabilized. In one approach, therefore, wafers containing unstabilized B-defects are placed in a rapid thermal annealer and the wafer is rapidly heated to a target temperature (at which the B-defects begin to dissolve) and annealed at that temperature for a relatively short period of time. In general, the target temperature is preferably at least about 1050° C., more preferably at least about 1100° C., more preferably at least about 1150° C., still more preferably at least about 1200° C., and most preferably at least about 1250° C. The wafer will generally be held at this temperature for a period of time which depends, in part, upon the target temperature, with greater times corresponding to lower temperatures. In general, however, the wafer will be held at the target temperature for at least several seconds (e.g., at least 3), preferably for several tens of seconds (e.g., 10, 20, 30, 40, or 50 seconds) and, depending upon the desired characteristics of the wafer and the target temperature, for a period which may range up to about 60 seconds (which is near the limit for commercially available rapid thermal annealers).

Heat-treatments at lesser temperatures for extended periods appear to stabilize B-defects. For example, annealing silicon containing B-defects at 900° C. for a period of four hours can stabilize the B-defects such that they are incapable of being dissolved by heat-treatments not in excess of about 1250° C. Thus, the temperature of the wafer is ramped up to the target temperature relatively rapidly (e.g., at a rate of about 25° C./sec. or more) to avoid stabilizing the defects; this can be accomplished in a rapid thermal annealer in a matter of seconds.

If desired, the heat-treatment can be carried out in a manner which also enables the dissolution of nuclei which lead to the formation of oxidation induced stacking faults (as further described here) and/or the formation of a denuded zone in the near surface region of the wafer and micro defects in the bulk of the wafer. Such a process is carried out in a rapid thermal annealer and the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C. This rapid thermal annealing step may be carried out in the presence of a nitriding atmosphere or non-nitriding atmosphere. Nitriding atmospheres include nitrogen gas ($N_2$) or a nitrogen-containing compound gas such as ammonia which is capable of nitriding an exposed silicon surface. Suitable non-nitriding atmospheres include argon, helium, neon, carbon dioxide, and other such non-oxidizing, non-nitriding elemental and compound gases, or mixtures of such gases. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers).

Upon completion of heat-treatment step, the wafer can be rapidly cooled through the range of temperatures at which silicon lattice vacancies are relatively mobile in the single crystal silicon. In general, the average cooling rate within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which silicon lattice vacancies are relatively mobile in the single crystal silicon, the cooling rate does not appear to significantly influence the precipitating characteristics of the wafer in some instances and thus, does not appear to be narrowly critical.

Conveniently, the cooling step may be carried out in the same atmosphere in which the heating step is carried out. The ambient preferably has no more than a relatively small partial pressure of oxygen, water vapor, and other oxidizing gases. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

It is to be noted that the process of the present invention is in part directed to the avoidance of agglomerated defects which are known to impact the yield potential of the silicon material in the production of complex and highly integrated circuits, such agglomerated defects including agglomerated vacancy defects (e.g., D-defects) and A-defects which cannot be readily dissolved throughout the silicon wafer by a heat-treatment of the type which may be used to dissolve B-defects. Because B-defects can be readily dissolved and may not be deleterious in any event, in one embodiment the process of the present invention includes the preparation of single crystal silicon having an axially symmetric region which includes B-defects, but is otherwise substantially free of agglomerated defects. In this instance, B-defects may be treated as if they are not an agglomerated intrinsic point defect. To the extent it is desired, however, that the single crystal silicon be substantially free of all agglomerated defects, including B-defects, the process includes the additional step of annealing wafers sliced from the B-defect containing ingot to eliminate them.

3. OISF Determination

With respect to a vacancy-dominated region (i.e., a region wherein vacancies are the predominant intrinsic point defect), it is also to be noted that, as has previously been reported (see, e.g., U.S. Pat. Nos. 5,919,302 and 6,254,672, which are incorporated herein by reference), oxygen induced stacking faults and bands of enhanced oxygen clustering typically occur just inside the V/I boundary and become more pronounced as the oxygen content increases. Without being held to any particular theory, it is generally believed that the formation or nucleation of the nuclei that may lead to the formation of oxidation induced stacking faults when exposed to suitable thermal conditions, occurs over a temperature range of from less than about 1100° C. to at least about 750° C., the precise temperature at which nucleation occurs varying with the oxygen concentration; that is, nucleation may occur over a temperature range of from about 750° C. to about 1100° C., depending upon the oxygen content of the single crystal silicon ingot (nucleation for higher concentrations generally occurring at higher temperatures and vice versa).

Much like the process of agglomerated intrinsic point defect formation, once nucleation occurs, growth of these OISF nuclei will continue as long as the temperature is sufficiently high for oxygen to diffuse through the silicon lattice to these nucleation sites, which act as "sinks," for the oxygen. Generally speaking, such diffusion continues to occur within a commercially practical period of time until a temperature greater than about 750° C. is reached. Accordingly, control of the cooling rate over a temperature range bound at the upper end by nucleation of OISF nuclei and the lower end by oxygen mobility enables the number and size of these nuclei to be limited (rapid cooling resulting in smaller nuclei, given that less time is allowed for diffusion and growth, and possibly fewer or essentially no nuclei, if the ingot segment is "quenched" through the nucleation temperature here).

As noted above, in some instances, a quench process may be employed to prevent both the formation of agglomerated intrinsic point defects as well as the formation of nuclei which lead to the formation of oxidation induced stacking faults. However, an additional cooling step may be employed to control formation of OISF nuclei in those instances wherein this is not achieved, such as wherein (i) slow cooling is employed to allow for diffusion of intrinsic point defects (to suppress intrinsic point defect concentrations below critical supersaturation) down to a temperature of about 1100° C. or 1000° C., for example, or (ii) quench cooling is employed, but through a temperature range which does not overlap, or sufficiently overlap, with the temperature range for nucleation of OISF nuclei.

Generally speaking, this additional cooling step may involve cooling the ingot segment through the temperature range described above (e.g., from about 1100° C. to about 750° C.) at a rate which is sufficient to limit the formation of OISF nuclei such that a wafer obtained from this ingot segment, upon being subject to conditions sufficient for the formation of oxidation induced stacking faults, will have an OISF concentration of less than about $50/cm^2$, preferably less than about $40/cm^2$, more preferably less than about $30/cm^2$, and still more preferably less than about $20/cm^2$ (e.g., less than about $15/cm^2$ or even $1/cm^2$). Most preferably, however, formation of OISF nuclei is sufficiently limited or controlled such that a wafer obtained from the ingot segment is substantially free of oxidation induced stacking faults.

It is to be noted that, as used herein, "substantially free of oxidation induced stacking faults," as well as variations thereof, refers to a concentration which is less than the current detection limits of such defects (e.g., less than about $5/cm^2$ or even about $3/cm^2$) by means common in the art.

It is to be further noted that, while the precise conditions which are sufficient to lead to the formation of oxidation induced stacking faults may vary from one wafer sample to another, the conditions for this thermal oxidation process are generally known in the art, typically involving heating the wafer for a period of time (e.g., about 1 hour, 2 hours, 4 hours, 8 hours, 10 hours or more) at a temperature in the range of 900° C. and 1200° C. in dry oxygen, wet oxygen, or steam. For example, even a common oxygen precipitation heat treatment, which consists essentially of annealing a wafer at about 800° C. for about 4 hours and then at about 1000° C. for about 16 hours, can result in the formation of such faults.

These result can typically be achieved by cooling the ingot segment through this temperature range at a rate of at least about 1° C./minute, with cooling rates of at least about 1.5° C./minute, 2° C./minute, 2.5° C./minute, 3° C./minute or more (e.g., about 5° C./minute, about 10° C./minute or more), depending upon for example the oxygen content of the silicon. More specifically, it is to be noted in this regard that the cooling rate needed to achieve the desired result is at least in part dependent upon the oxygen concentration of the silicon. For example, typically for oxygen contents ranging from about 11 to about 14.5 PPMA (parts per million atomic, ASTM standard F-121-83), a rate of at least about 1° C./minute, 1.5° C./minute or even 2° C./minute may be needed, while for oxygen contents ranging from about 14.5 to about 18 PPMA or more, a rate of at least about 2° C./minute, 2.5° C./minute, 3° C./minute or more may be needed.

It is to be noted, however, that in some instances the wafer may be subjected to a thermal anneal prior to further processing (such as prior to being subjected to an oxidation treatment wherein oxidation induced stacking faults are formed) in order to dissolve or otherwise alter nuclei present which lead to the formation of oxidation induced stacking faults. Stated another way, the process of the present invention may additionally include a thermal anneal, after the ingot segment has been grown and a wafer obtained therefrom, prior to an oxidation treatment, in order to achieve the formation of a silicon wafer having an OISF concentration as described above.

This thermal anneal, or rapid thermal anneal, may be carried out by a number of different means described herein (see, e.g., above regarding dissolution of B-defects), as well as those methods described in, e.g., U.S. Pat. Nos. 5,994,761 and 6,336,968, which are incorporated herein by reference. Generally speaking, such a treatment may involve heating the wafer to a temperature of at least about 950° C., 1000° C., 1100° C., 1200° C. or more (e.g., from about 1250° C. to about 1270° C.) for a few seconds (e.g., 2, 4, 6, 8), tens of seconds (e.g., 10, 20, 30, 40), or even several minutes, depending upon the temperature employed and the size and/or number of nuclei to be dissolved. Alternatively, however, the wafer may be rapidly heated (e.g., at a rate of at least 1° C./sec.), for example, to a temperature typically not in excess of about 1300° C. (e.g. a temperature of about 1250° C., 1225° C., or even 1200° C.), as described in, for example, U.S. Pat. No. 5,994,761.

4. Carbon Content

Substitutional carbon, when present as an impurity in single crystal silicon, has the ability to catalyze the formation of oxygen precipitate nucleation centers. For this and other reasons, therefore, it is preferred that the single crystal silicon ingot have a low concentration of carbon. That is, the concentration of carbon in the single crystal silicon is preferably less than about $5 \times 10^{16}$ atoms/$cm^3$, more preferably less than $1 \times 10^{16}$ atoms/cm$^3$, and still more preferably less than $5 \times 10^{15}$ atoms/cm$^3$, as determined by means known in the art.

5. Applications

It is to be noted that wafers which are sliced from ingots grown in accordance with the present invention are suitable for use as substrates upon which an epitaxial layer may be deposited. Epitaxial deposition may be performed by means common in the art. Wafers which are sliced from ingots grown in accordance with the present invention are also suitable for use as substrates for semiconductor on insulator structures (e.g., hydrogen-implantation or bonded applications). The semiconductor on insulator composite may be formed, for example, as described in Iyer et al., U.S. Pat. No. 5,494,849. The present wafers may be employed in such applications as the substrate wafer or the device layer.

Furthermore, it is also to be noted that wafers prepared in accordance with the present invention are suitable for use in combination with hydrogen or argon annealing treatments, such as the treatments described in European Patent Application No. 503,816 A1.

6. Crystal Pulling Apparatus

It is to be noted that the process of the present invention may generally be carried out using equipment commercially available and/or designed using means common in the art. However, one particular embodiment of a crystal puller that may be suitable for use in accordance with the present invention is set forth in detail in U.S. Pat. No. 6,846,539, the entire contents of which are incorporated herein by reference.

7. Detestion of Agglomerated Defects and Oxidation Induced Stacking Faults

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection (see, e.g., H. Yamagishi et al., Semicond. Sci. Technol. 7, A135 (1992)). Although standard for the detection of agglomerated vacancy defects, this process may also be used to detect A-defects. When this technique is used, such defects appear as large pits on the surface of the sample when present.

Additionally, agglomerated intrinsic point defects may be visually detected by decorating these defects with a metal capable of diffusing into the single crystal silicon matrix upon the application of heat. Specifically, single crystal silicon samples, such as wafers, slugs, or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch in order to remove surface residue and precipitants by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In an alternative embodiment of this "defect decoration" process, the single crystal silicon sample is subjected to a thermal anneal prior to the application of the metal-containing composition. Typically, the sample is heated to a temperature ranging from about 850° C. to about 950° C. for about 3 hours to about 5 hours. This embodiment is particularly preferred for purposes of detecting B-type silicon self-interstitial agglomerated defects. Without being held to a particular theory, it is generally believed that this thermal treatment acts to stabilize and grow B-defects, such that they may be more easily decorated and detected.

Agglomerated vacancy defects may also be detected using laser scattering techniques, such as laser scattering tomography, which typically have a lower defect density detection limit than other etching techniques.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching, whereas regions of defect-free vacancy dominated material (prior to a high-temperature oxygen nuclei dissolution treatment as described above) contain small etch pits due to copper decoration of the oxygen nuclei.

The detection of oxidation induced stacking faults may be achieved by means common in the art. Generally speaking, however, this method involves the steam oxidation of a silicon wafer surface followed by a decorative etch (e.g., Wright etch). The wafer is then inspected under a microscope (e.g., Normarski) and the stacking faults are counted.

8. Definitions

It is to be noted that, as used herein, the following phrases shall have the given meanings: "agglomerated intrinsic point defects" or simply "agglomerated defects" mean defects caused (i) by the reaction in which vacancies agglomerate or (ii) by the reaction in which self-interstitials agglomerate; "agglomerated vacancy defects" shall mean agglomerated vacancy point defects caused by the reaction in which silicon lattice vacancies agglomerate, examples include D-defects, flow pattern defects, gate oxide integrity defects, crystal originated particle defects, and crystal originated light point defects; "agglomerated interstitial defects" shall mean agglomerated intrinsic point defects caused by the reaction in which silicon self-interstitial atoms agglomerate to form A-defects (including dislocation loops and networks) and B-defects; "B-defects" shall mean agglomerated interstitial defects which are smaller than A-defect and which are capable of being dissolved if subjected to a heat treatment as further described herein; "radius" shall mean the minimum distance measured from a central axis to a circumferential edge of a single crystal silicon sample, such as a wafer, ingot, slug, or slab; "substantially free of agglomerated intrinsic point defects" shall mean a concentration (or size) of agglomerated defects which is less than the detection limit of these defects, which is currently about 10$^4$ defects/cm$^3$; "vacancy dominated" and "self-interstitial dominated" shall mean material in which the intrinsic point defects are predominantly vacancies or self-interstitials, respectively; and, "visual detection of agglomerated intrinsic point defects," as well as variations thereof, shall refer to the detection of such defects using the naked eye under ordinary incandescent or fluorescent light sources, or optionally collimated or other enhanced light sources, and without the use of any instrumentation which would otherwise aid in defect detection or result in defect magnification, such as optical or infrared microscopy, X-ray diffraction, or laser scattering.

9. Example

The following non-limiting example is provided to further illustrate and explain the present invention. The invention should not be limited to any of the details provided herein.

A 300 mm single crystal silicon ingot is grown from a silicon melt using the Czochralski method such that the cooling rate from the temperature of solidification (about 1412° C.) and about 1250° C. generally decreases from about 3.4° C./min to about 2.8° C./min. The cooling rate is then reduced to about 0.2° C./min over the temperature range between about 1250° C. and about 1000° C. Then, the cooling rate is increased to about 2.0° C./min at about 1000° C. and allowed to gradually decrease to about 1.3° C./min at about 800° C.

A wafer is then sliced from the grown ingot and analyzed for the presence of agglomerated vacancy defects and oxygen clusters. It is observed that the wafer comprises an annular ring extending radially inward from about the circumferential edge of the wafer toward the central axis. The ring comprises (i) silicon lattice vacancies as the predominant intrinsic point defect, (ii) agglomerated vacancy defects and/or oxygen clusters such that the v-cluster radius is less than about 8 nm, the ring having an average radial width of about 17 cm. Specifically, the v-cluster radius increases gradually from about 5 nm at about the circumferential edge to about 8 nm at about 12.5 cm from said edge. The v-cluster radius then decreases to about 0 nm before a distance of about 17 nm from said edge.

It is to be noted that the present invention is not limited to the above embodiments and can be variously modified. The above description of the various embodiments is intended only to acquaint others skilled in the art with the invention, its principles, and its practical application so that others skilled in the art may adapt and apply the invention in its numerous forms, as may be best suited to the requirements of a particular use.

With reference to the use of the word(s) comprise or comprises or comprising in this entire specification (including the claims below), unless the context requires otherwise, these words are used on the basis and clear understand that they are to be interpreted inclusively, rather than exclusively, and applicants intend each of those words to be so interpreted in construing this entire specification.

What is claimed is:

1. A process for growing a single crystal silicon ingot from a silicon melt wherein the melt/solid interface between the ingot and the silicon melt is not flat, the ingot comprising a central axis, a seed-cone, an end opposite the seed-cone, and a constant diameter portion between the seed-cone and the opposite end, said constant diameter portion having a lateral surface, a radius (R) extending from the central axis to the lateral surface, and a nominal diameter of at least about 150 mm, the ingot being grown in accordance with the Czochralski method, the process comprising: controlling (i) a growth velocity, v, and (ii) an effective average axial temperature gradient, $G_{effective}$, during the growth of at least a segment of the constant diameter portion of the ingot over the temperature range from solidification to a temperature of about 1200° C., wherein $G_{effective}$ is defined by the following equation:

$$G_{effective} = \left[\frac{G_{corrected}}{v}\right]_{x,flat} \times v_{x,iface}$$

and $G_{corrected}$ is defined by the following equation:

$$\frac{1}{T_{corrected}} = (1/T_m) + (1/T_m^2)zG_{corrected}, \text{ such that } \sum f(T - T_{corrected}) = 0$$

wherein: $G_{effective}$ represents a revision to $G_{corrected}$, revised to account for the deviation in the interface shape from a flat profile; T is the temperature of at any fixed radial location, r, within the segment; $T_m$ is the temperature at the melt/solid interface; z is the axial distance from the interface at the given radial location; the function f denotes an acceptable statistical agreement between T and $T_{corrected}$; the subscript x denotes the critical value at which the predominate intrinsic point defect transitions between vacancy dominated and interstitial dominated material, such that $[G_{corrected}/v]_{x,flat}$ is the ratio of $G_{corrected}/v$ at which the material transitions from interstitial dominated to vacancy dominated for a flat melt-solid interface and $v_{x,iface}$ is the critical value of v wherein $G_{effective}/v_{x,iface}$ is the ratio at which the material transitions from interstitial dominated to vacancy dominated for the non-flat melt-solid interface; flat denotes a flat interface; iface denotes any non-flat interface; such that the ratio of $v/G_{effective}$, at a given axial position within said segment, varies radially by less than about ±30%, relative to the critical value of $v/G_{effective}$; and, cooling said segment from the solidification temperature to about 750° C.

2. The process of claim 1, wherein during said cooling of the segment from the solidification temperature to at least about 750° C., the cooling rate of said segment is controlled (i) from the solidification temperature to a temperature of at least about 1250° C., such that said segment cools at an average rate of at least 2.5° C./minute, and (ii) between a temperature of less than about 1250° C. and about 1000° C., such that said segment cools at an average rate of between about 0.3 and about 0.025° C./minute.

3. The process of claim 1, wherein said constant diameter portion of said ingot has a nominal diameter of about 200 mm.

4. The process of claim 2 wherein, upon cooling, said segment comprises an axially symmetric region which has (i) a measurable radial width that is less than or equal to about 1 R, and (ii) a length, as measured along the central axis, of at least about 10% of the length of the constant diameter portion of the ingot.

5. The process of claim 4, wherein the axially symmetric region is substantially free of agglomerated intrinsic point defects.

6. The process of claim 4, wherein silicon lattice vacancies are the predominant intrinsic point defect in the axially symmetric region.

7. The process of claim 6, wherein the axially symmetric region additionally contains detectable agglomerated vacancy defects and/or oxygen clusters therein, the agglomerated vacancy defects having an average radius of less than about 30 nm and the oxygen clusters having an average radius of less than about 10 nm.

8. The process of claim 4, wherein silicon self-interstitials are the predominant intrinsic point defect in the axially symmetric region.

9. The process of claim 8, wherein the segment additionally contains B-defects.

10. The process of claim 4, wherein the axially symmetric region extends from the central axis of the ingot radially outward toward the lateral surface for a radial width that is less than about 0.95 R.

11. The process of claim 4, wherein the axially symmetric region extends from the central axis of the ingot radially outward toward the lateral surface.

12. The process of claim 4, wherein the axially symmetric region forms an annular ring located between the central axis and the lateral surface.

13. The process of claim 4, wherein the segment further comprises a first annular ring extending radially inward from about the lateral surface toward the axially symmetric region, wherein said first annular ring comprises silicon lattice vacancies as the predominant intrinsic point defect.

14. The process of claim 13, wherein the first annular ring further comprises agglomerated vacancy defects having an average radius of less than about 30 nm and/or oxygen clusters having an average radius of less than about 10 nm.

15. The process of claim 13, wherein the axially symmetric region forms a second annular ring that surrounds an axially symmetric core that contains silicon lattice vacancies as the predominant intrinsic point defect and, optionally, voids having an average radius of less than about 30 nm and/or oxygen clusters having an average radius of less than about 10 nm.

16. The process of claim 13, wherein the axially symmetric region forms a second annular ring that surrounds an axially symmetric core that contains silicon self-interstitials as the predominant intrinsic point defect, and optionally B-defects.

17. The process of claim 13, wherein the first annular ring has a radial width, as measured from about the lateral surface radially toward the central axis, of less than about 0.25 R.

18. The process of claim 1, wherein said control of the cooling rate from the solidification temperature to a temperature of at least about 1250° C. is such that said segment cools at a rate between about 2.5° C./minute and about 3.5° C./minute.

19. The process of claim 2, wherein said process further comprises controlling the cooling rate of said segment between about 1000° C. and about 750° C., such that said segment cools at a rate of at least about 0.25° C./minute.

20. The process of claim 2, wherein the cooling rate of said segment is controlled (i) from the solidification temperature to a temperature of at least about 1250° C., such that said segment cools at a rate of at least 2.5° C./minute, and (ii) between a temperature of less than about 1250° C. and about 1000° C., such that said segment cools at a rate of between about 0.3 and about 0.025° C./minute.

* * * * *